United States Patent
Izuha et al.

(10) Patent No.: US 10,506,182 B2
(45) Date of Patent: Dec. 10, 2019

(54) IMAGING DEVICE AND PIXEL SIGNAL READING METHOD

(71) Applicant: Sony Semiconductor Solutions Corporation, Kanagawa (JP)

(72) Inventors: Kyoko Izuha, Kanagawa (JP); Kouichi Harada, Kanagawa (JP); Tomoo Mitsunaga, Kanagawa (JP); Hayato Wakabayashi, Tokyo (JP); Koji Kadono, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 98 days.

(21) Appl. No.: 15/329,600

(22) PCT Filed: May 18, 2015

(86) PCT No.: PCT/JP2015/064208
§ 371 (c)(1),
(2) Date: Jan. 27, 2017

(87) PCT Pub. No.: WO2016/021265
PCT Pub. Date: Feb. 11, 2016

(65) Prior Publication Data
US 2017/0214864 A1    Jul. 27, 2017

(30) Foreign Application Priority Data

Aug. 5, 2014  (JP) .................................. 2014-159509

(51) Int. Cl.
*H04N 5/345* (2011.01)
*H04N 5/341* (2011.01)
(Continued)

(52) U.S. Cl.
CPC ....... *H04N 5/345* (2013.01); *H01L 27/14625* (2013.01); *H01L 27/14643* (2013.01);
(Continued)

(58) Field of Classification Search
CPC ...... H04N 5/345; H04N 5/378; H04N 5/3698; H04N 5/144
(Continued)

(56) References Cited

U.S. PATENT DOCUMENTS 7,501,967 B2 * 3/2009 Draxelmayr ........ H03M 1/1215
341/141
7,777,660 B2 * 8/2010 Chen ........................ G09G 3/20
341/155

(Continued)

FOREIGN PATENT DOCUMENTS

JP    2004-172858 A    6/2004
JP    2007-134805 A    5/2007
(Continued)

OTHER PUBLICATIONS

Oike et al., CMOS image sensor with per-column ΣΔ ADC and programmable compressed sensing, Department. of Electrical Engineering, Stanford University, CA, Sony Corporation, Atsugi, Japan, pp. 1-25.

*Primary Examiner* — Pritham D Prabhakher
(74) *Attorney, Agent, or Firm* — Wolf, Greenfield & Sacks, P.C.

(57) ABSTRACT

An imaging device includes imaging elements 12 arranged in two-dimensional matrix in a first direction and a second direction, an analog-digital (AD) converter 13, and a pixel signal reading device 16. The pixel signal reading device 16 selects spatially at random the imaging element 12 that outputs a pixel signal to the AD converter 13, and randomly outputs the pixel signal of the imaging element 12 from the AD converter 13.

12 Claims, 40 Drawing Sheets

(51) Int. Cl.
  *H04N 5/353* (2011.01)
  *H04N 5/378* (2011.01)
  *H04N 5/14* (2006.01)
  *H04N 5/369* (2011.01)
  *H01L 27/146* (2006.01)
  *H04N 5/3745* (2011.01)
  *H04N 9/04* (2006.01)

(52) U.S. Cl.
  CPC ............ *H04N 5/144* (2013.01); *H04N 5/341* (2013.01); *H04N 5/353* (2013.01); *H04N 5/3698* (2013.01); *H04N 5/378* (2013.01); *H04N 5/3745* (2013.01); *H04N 9/045* (2013.01); *H01L 27/14621* (2013.01); *H01L 27/14627* (2013.01)

(58) Field of Classification Search
  USPC ........................................................ 348/308
  See application file for complete search history.

(56) References Cited

U.S. PATENT DOCUMENTS

| | | | | |
|---|---|---|---|---|
| 8,248,490 | B2 * | 8/2012 | Zhang | H04N 5/335 348/230.1 |
| 8,358,360 | B2 * | 1/2013 | Koseki | H04N 5/3658 341/126 |
| 8,698,666 | B1 * | 4/2014 | Zhang | H03M 1/00 341/118 |
| 9,066,030 | B2 * | 6/2015 | Kim | H04N 5/335 |
| 9,191,026 | B2 * | 11/2015 | Oike | H04N 5/335 |
| 2001/0030619 | A1 * | 10/2001 | Jonsson | H03M 1/1004 341/120 |
| 2001/0052864 | A1 * | 12/2001 | Shimizu | H03M 1/0673 341/141 |
| 2003/0058137 | A1 * | 3/2003 | Tsai | H03M 1/0673 341/1 |
| 2006/0097901 | A1 * | 5/2006 | Draxelmayr | H03M 1/1215 341/155 |
| 2009/0262210 | A1 * | 10/2009 | Sonoda | H04N 5/3456 348/222.1 |
| 2011/0261233 | A1 * | 10/2011 | Zhang | H04N 5/335 348/241 |
| 2012/0199724 | A1 * | 8/2012 | Nomura | H04N 5/3454 250/208.1 |
| 2012/0268619 | A1 | 10/2012 | Uchida | |
| 2013/0278453 | A1 * | 10/2013 | Steensgaard-Madsen | H03M 1/0668 341/110 |
| 2014/0091201 | A1 * | 4/2014 | Zhang | H03M 1/00 250/208.1 |
| 2014/0286073 | A1 * | 9/2014 | Onuki | G11C 11/403 365/63 |
| 2014/0340560 | A1 * | 11/2014 | Miyashita | G02B 7/10 348/335 |

FOREIGN PATENT DOCUMENTS

| | | |
|---|---|---|
| JP | 2010-130194 A | 6/2010 |
| JP | 2011-044891 A | 3/2011 |
| JP | 2011-091535 A | 5/2011 |
| JP | 2012-165168 A | 8/2012 |
| JP | 2012-227827 A | 11/2012 |
| WO | WO 02/056604 A1 | 7/2002 |

* cited by examiner

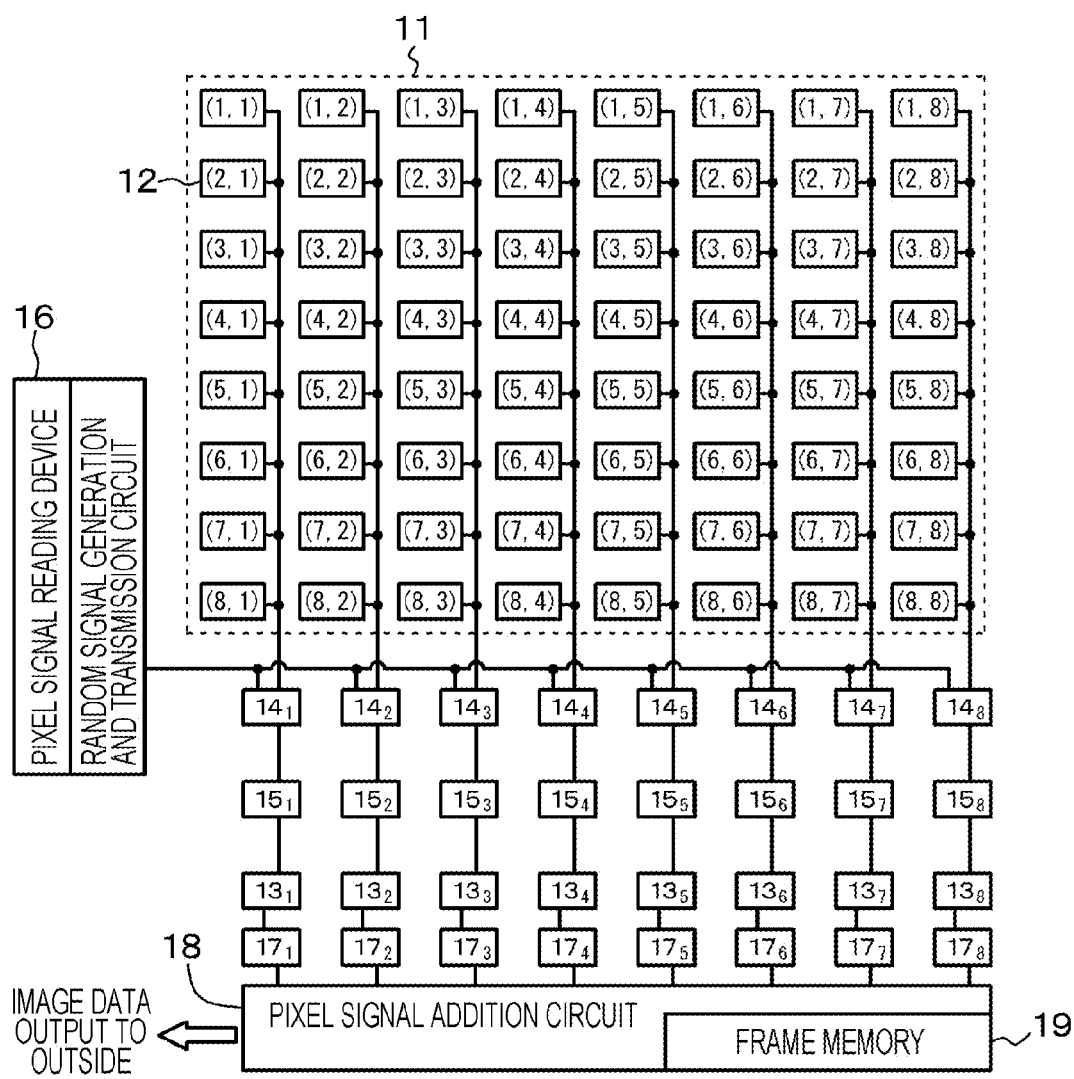

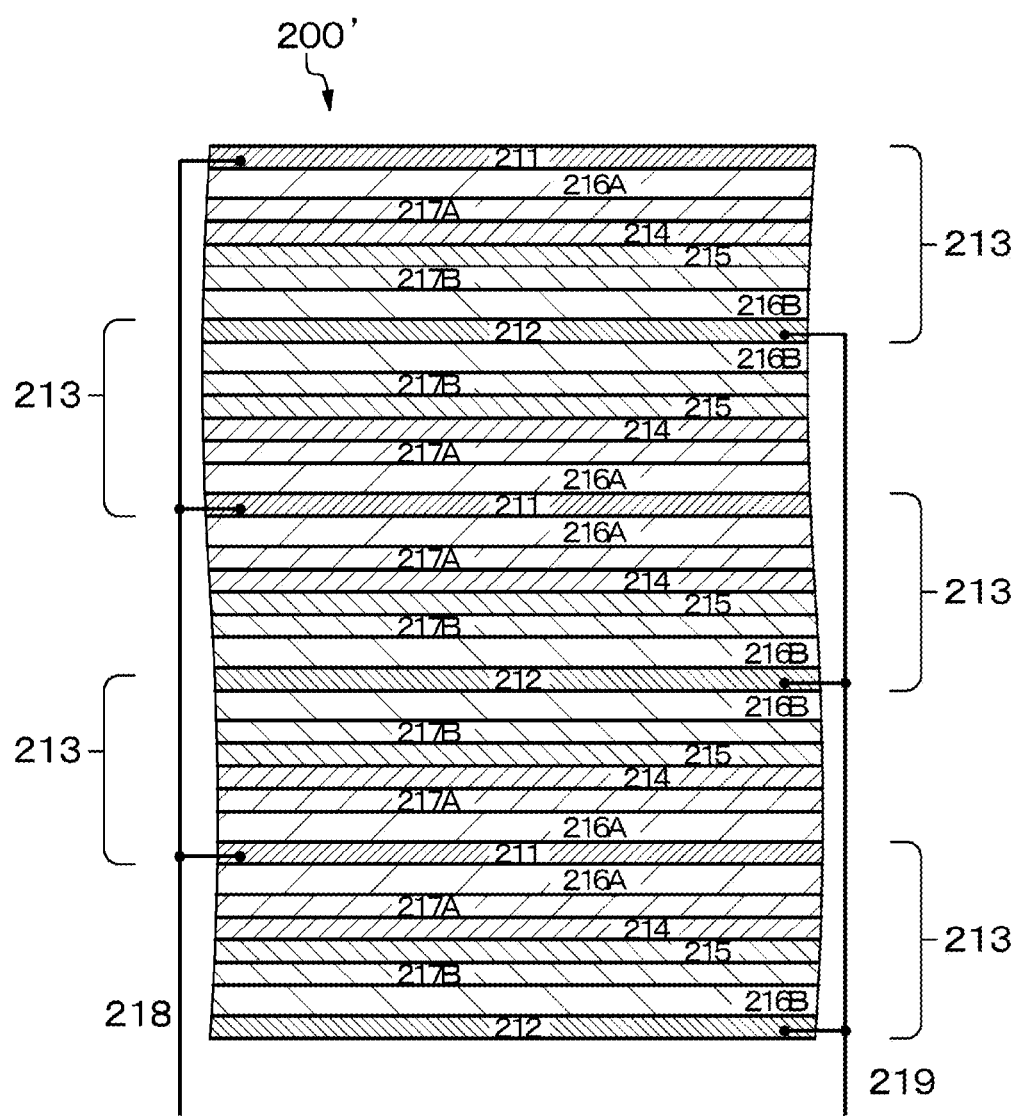

FIG. 14A

| $R_1$ | $G_1$ | $R_1$ | $G_1$ | $R_1$ | $G_1$ | $R_1$ | $G_1$ |
|---|---|---|---|---|---|---|---|
| $G_1$ | $B_1$ | $G_1$ | $B_1$ | $G_1$ | $B_1$ | $G_1$ | $B_1$ |
| $R_1$ | $G_1$ | $R_1$ | $G_1$ | $R_1$ | $G_1$ | $R_1$ | $G_1$ |
| $G_1$ | $B_1$ | $G_1$ | $B_1$ | $G_1$ | $B_1$ | $G_1$ | $B_1$ |
| $R_1$ | $G_1$ | $R_1$ | $G_1$ | $R_1$ | $G_1$ | $R_1$ | $G_1$ |
| $G_1$ | $B_1$ | $G_1$ | $B_1$ | $G_1$ | $B_1$ | $G_1$ | $B_1$ |
| $R_1$ | $G_1$ | $R_1$ | $G_1$ | $R_1$ | $G_1$ | $R_1$ | $G_1$ |
| $G_1$ | $B_1$ | $G_1$ | $B_1$ | $G_1$ | $B_1$ | $G_1$ | $B_1$ |

FIG. 14B

| $R_1$ | $G_1$ | $B_1$ | $G_1$ | $R_1$ | $G_1$ | $B_1$ | $G_1$ |
|---|---|---|---|---|---|---|---|
| $G_1$ | $B_1$ | $G_1$ | $R_1$ | $G_1$ | $B_1$ | $G_1$ | $R_1$ |
| $B_1$ | $G_1$ | $R_1$ | $G_1$ | $B_1$ | $G_1$ | $R_1$ | $G_1$ |
| $G_1$ | $R_1$ | $G_1$ | $B_1$ | $G_1$ | $R_1$ | $G_1$ | $B_1$ |
| $R_1$ | $G_1$ | $B_1$ | $G_1$ | $R_1$ | $G_1$ | $B_1$ | $G_1$ |
| $G_1$ | $B_1$ | $G_1$ | $R_1$ | $G_1$ | $B_1$ | $G_1$ | $R_1$ |
| $B_1$ | $G_1$ | $R_1$ | $G_1$ | $B_1$ | $G_1$ | $R_1$ | $G_1$ |
| $G_1$ | $R_1$ | $G_1$ | $B_1$ | $G_1$ | $R_1$ | $G_1$ | $B_1$ |

FIG. 15A

| $G_1$ | $B_1$ | $G_1$ | $R_1$ | $G_1$ | $B_1$ | $G_1$ | $R_1$ |
|---|---|---|---|---|---|---|---|
| $G_1$ | $R_1$ | $G_1$ | $B_1$ | $G_1$ | $R_1$ | $G_1$ | $B_1$ |
| $G_1$ | $R_1$ | $G_1$ | $B_1$ | $G_1$ | $R_1$ | $G_1$ | $B_1$ |
| $G_1$ | $B_1$ | $G_1$ | $R_1$ | $G_1$ | $B_1$ | $G_1$ | $R_1$ |
| $G_1$ | $B_1$ | $G_1$ | $R_1$ | $G_1$ | $B_1$ | $G_1$ | $R_1$ |
| $G_1$ | $R_1$ | $G_1$ | $B_1$ | $G_1$ | $R_1$ | $G_1$ | $B_1$ |
| $G_1$ | $R_1$ | $G_1$ | $B_1$ | $G_1$ | $R_1$ | $G_1$ | $B_1$ |
| $G_1$ | $B_1$ | $G_1$ | $R_1$ | $G_1$ | $B_1$ | $G_1$ | $R_1$ |

FIG. 15B

| $B_1$ | $IR_1$ | $B_1$ | $IR_1$ |
|---|---|---|---|
| $G_1$ | $R_1$ | $G_1$ | $R_1$ |
| $B_1$ | $IR_1$ | $B_1$ | $IR_1$ |
| $G_1$ | $R_1$ | $G_1$ | $R_1$ |

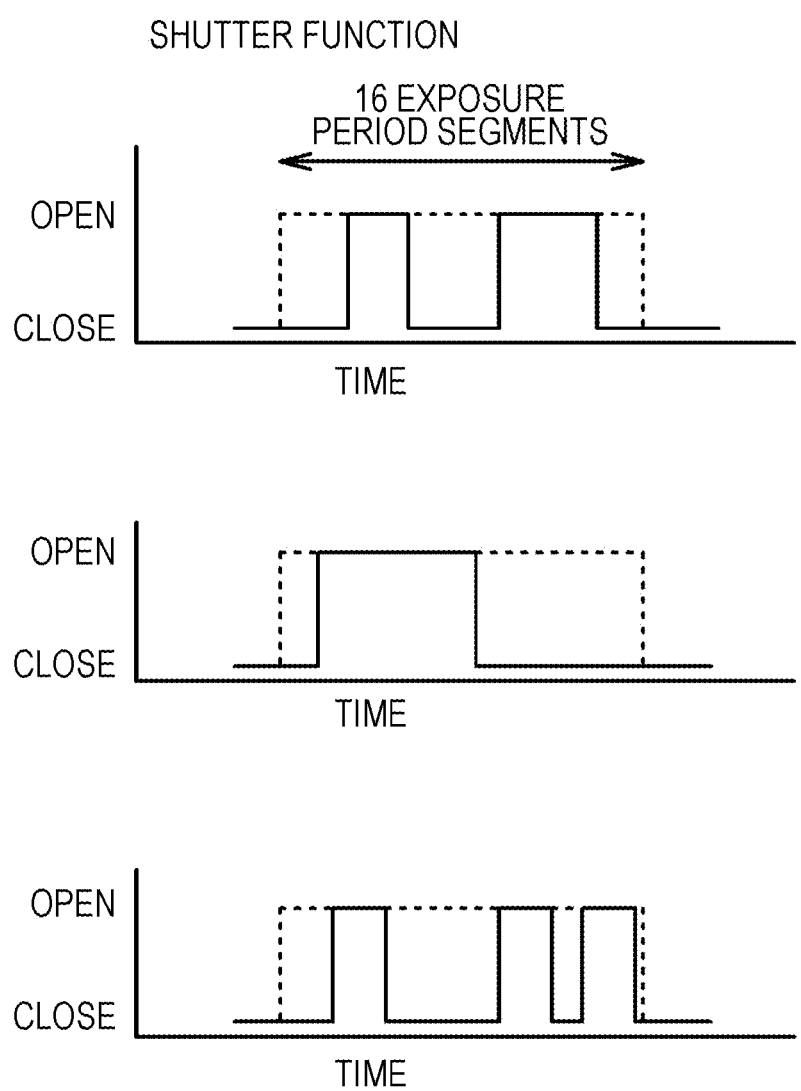

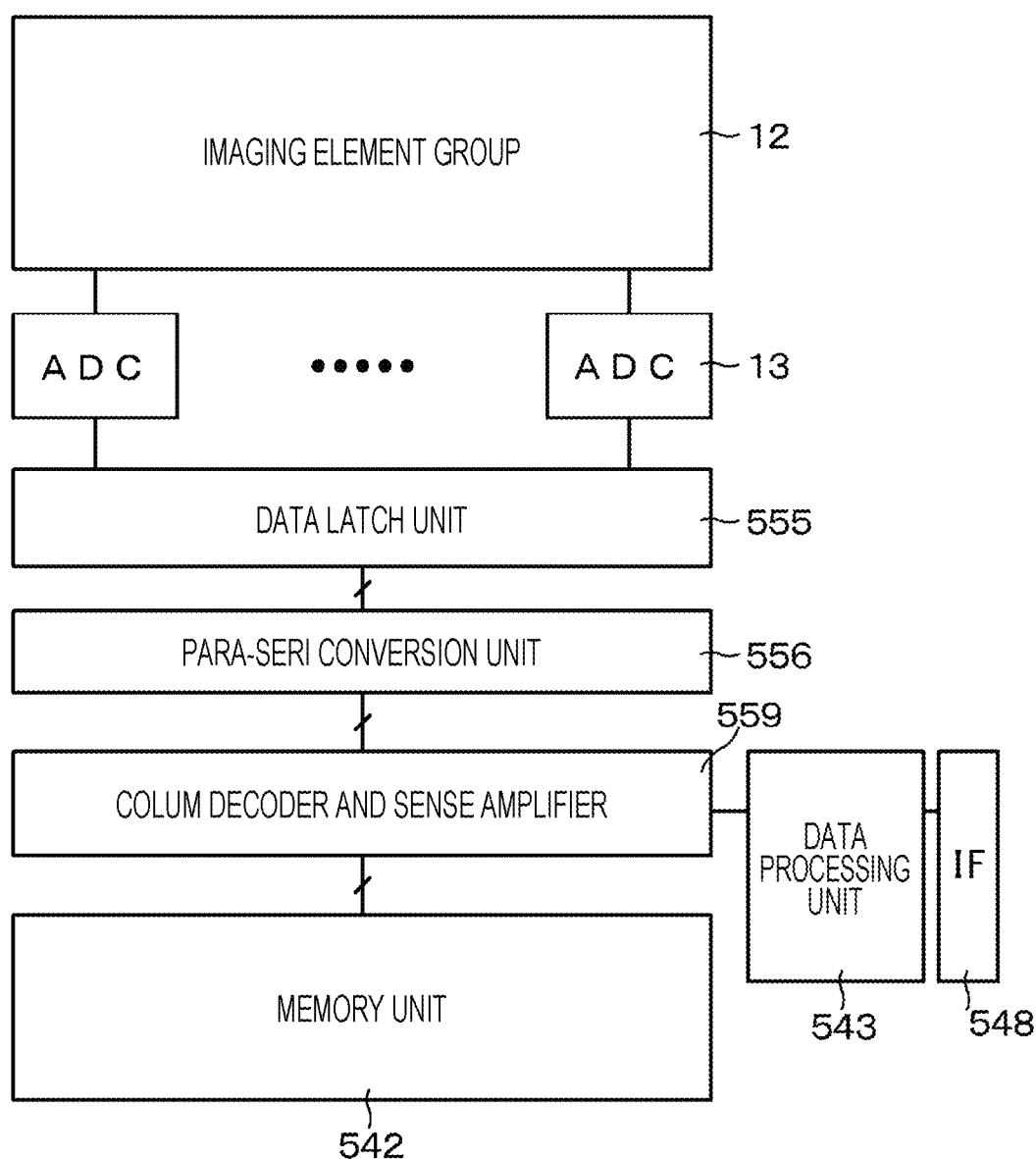

IMAGING DEVICE AND PIXEL SIGNAL READING METHOD

CROSS-REFERENCE TO RELATED APPLICATIONS

This application is a National Stage of International Application No. PCT/JP2015/064208, filed in the Japanese Patent Office as a Receiving office on May 18, 2015, which claims priority to Japanese Patent Application Number 2014-159509, filed in the Japanese Patent Office on Aug. 5, 2014, each of which is hereby incorporated by reference in its entirety.

TECHNICAL FIELD

The present disclosure relates to an imaging device and a pixel signal reading method.

BACKGROUND ART

A concept of a cloud technology has been frequently discussed in recent years. An electronic device including an imaging device such as an imaging unit and an imaging element is expected to perform a function of a cloud terminal. It is also estimated that various types of electronic devices are connected with a cloud to realize a society providing connections between these electronic devices, between electronic devices and users, and between users and the cloud in the near future. In consideration of this social trend, there has been demanded development of imaging devices mounted on electronic devices which will be adopted in a network society using a cloud or the like.

Incidentally, for connecting various types of electronic devices with a cloud, various problems need to be solved, such as a large volume of communication and increase in power consumption. Technologies for increasing the volume of communication have been developed in communication fields. However, there may be a limitation to expansion of the volume of communication. Moreover, when wireless communication users increase in number with development of a network society, these users immediately struggle for an available volume of communication. In this case, communication bands may become insufficient. On the other hand, problems are arising from imaging devices in view of power consumption required for pixel signal processing, and power consumption during communication. Furthermore, when attention is paid to communication of images formed by imaging devices, problems of image sizes and volumes of communication for formed images (communication rates) also need appropriate solution.

There has been diligently promoted development of an imaging element driving method and a signal processing for lowering whole power consumption of imaging devices including imaging elements. More specifically, an electronic imaging device disclosed in Japanese Patent Application Lid-Open No. 2007-134805, for example, divides all pixels included in a solid-state imaging element into several divisional areas, and alternately reads pixels contained in each of the divisional areas to achieve low power consumption. On the other hand, a semiconductor device disclosed in Japanese Patent Application Laid-Open No. 2012-165168 includes an element array unit containing unit elements in matrix, and a signal processing unit containing signal processing circuits provided for each column to perform predetermined signal processing on the basis of unit signals output from the unit elements. In an element selection mode which requires only information on a part of the unit elements arranged in one row of the element array unit, the semiconductor device controls the function of the signal processing circuit corresponding to the unnecessary unit element such that this signal processing circuit comes into a lower power consumption state than a power consumption state in a normal operation mode.

Generally, an image formed by an imaging device is compressed before communication to reduce power consumption during communication. Several proposals have been presented as image compression signal processing. For example, there is known such a signal processing technology which reduces data to a volume smaller than all pixels (all imaging elements) on the basis of exposure control for imaging elements, and also eliminates a processing circuit required for data compression after analog-digital conversion (for example, see Non-Patent Document 1: Y. Oike and A. Ei. Gamal, A, "CMOS Image Sensor With Per-Column $\Sigma\Delta$ ADC and Programmable Compressed Sensing", Solid-State Circuits, IEEE Journal of Volume 48, Issue 1). According to this technology, pixel signals received from imaging elements are randomly selected by a multiplexer, and input to analog-digital converters randomly selected to compress pixel signals received from the imaging elements in a final stage.

CITATION LIST

Patent Document

Patent Document 1: Japanese Patent Application Laid-Open No. 2007-134805
Patent Document 2: Japanese Patent Application Laid-Open No. 2012-165168
Patent Document 3: International Publication No. 2002/056604
Patent Document 4: Japanese Patent Application Laid-Open No. 2004-172858
Patent Document 5: Japanese Patent Application Laid-Open No. 2011-044891

Non-Patent Document

Non-Patent Document 1: Y. Oike and A. Ei. Gamal, A, "CMOS Image Sensor With Per-Column $\Sigma\Delta$ ADC and Programmable Compressed Sensing", Solid-State Circuits, IEEE Journal of Volume 48, Issue 1

SUMMARY OF THE INVENTION

Problems to be Solved by the Invention

According to the technologies disclosed in the above published patent applications, however, power consumption of an entire imaging device including imaging elements is difficult to sufficiently decrease. Moreover, in case of the technology disclosed in Non-Patent Document 1, the presence of the multiplexers between the imaging elements and the analog-digital converters complicates a circuit configuration. In addition, reduction of power consumption of the entire imaging device including the imaging elements is not touched upon in any way.

Accordingly, an object of the present disclosure is to provide an imaging device and a pixel signal reading method, which have a configuration and a structure capable of sufficiently simplifying a circuit configuration of the entire imaging device including imaging elements, and sufficiently reducing power consumption of the entire imaging device including the imaging elements.

Solutions to Problems

An imaging device for achieving the above object includes:
imaging elements arranged in two-dimensional matrix in a first direction and a second direction;
an analog-digital converter; and
a pixel signal reading device, wherein
the pixel signal reading device selects spatially at random the imaging element that outputs a pixel signal to the analog-digital converter, and randomly outputs the pixel signal of the imaging element from the analog-digital converter.

A pixel signal reading method for achieving the above object is a pixel signal reading method for an imaging device that includes
imaging elements arranged in two-dimensional matrix in a first direction and a second direction,
an analog-digital converter, and
a pixel signal reading device,
the method including the steps of, by the pixel signal reading device, selecting spatially at random the imaging element that outputs a pixel signal to the analog-digital converter, and randomly outputting the pixel signal of the imaging element from the analog-digital converter.

Effects of the Invention

According to the imaging device or the pixel signal reading method of the present disclosure, the pixel signal reading device selects spatially at random the imaging element that outputs a pixel signal to the analog-digital converter, and randomly outputs the pixel signal of the imaging element from the analog-digital converter. More specifically, in this case, not all the analog-digital converters included in the imaging device, but only a part of the analog-digital converters is operated. Accordingly, reduction of power consumption of the imaging device is achievable. Moreover, pixel signals of the imaging elements are randomly output from the analog-digital converters, wherefore an obtained data volume becomes smaller than a data volume of all read pixels (all imaging elements). Furthermore, the necessity of a multiplexer is eliminated, wherefore simplification of a circuit configuration, and further reduction of power consumption of the entire imaging device are achievable. Note that advantageous effects described in the present specification are presented only by way of example. Advantageous effects described in the present specification are not limited to the advantageous effects described herein, and may include additional effects.

BRIEF DESCRIPTION OF DRAWINGS

FIG. 6 is a conceptual view of an imaging element unit of an imaging device according to a fourth embodiment.

FIG. 10 is a schematic partial end view of a light control device of an imaging device according to a tenth embodiment.

FIGS. 14A and 14B are views each of which schematically illustrates a layout of an imaging element group of an imaging device according to the thirteenth embodiment.

FIGS. 15B and 15B are views schematically illustrating a layout of an imaging element group of the imaging device of the thirteenth embodiment, and of an imaging device of a sixteenth embodiment, respectively.

FIG. 18A is a view illustrating an example of a configuration of a part of the pixel driving circuit of the imaging device according to the thirteenth embodiment, while

FIG. 20A is a view illustrating a configuration of an internal circuit of the imaging element constituting the imaging device according to the thirteenth embodiment, while

FIG. 22 is a view illustrating an example of random pulse voltage used in the thirteenth embodiment.

FIG. 27 is a block diagram illustrating a specific configuration of a signal processing unit included in the imaging device according to the thirteenth embodiment.

FIG. 33A is a view schematically showing a pulsed predetermined voltage $V_0$ and a change of light transmittance when the predetermined voltage $V_0$ is applied to a light control device constituting an imaging device according to a seventeenth embodiment, while

FIG. 34A is a view schematically showing the pulsed predetermined voltage $V_0$ and a change of light transmittance when the predetermined voltage $V_0$ is applied to the light control device constituting the imaging device according to the seventeenth embodiment, while

FIG. 36A is a view schematically illustrating arrangement of the light control device constituting each of the four imaging elements illustrated in FIG. 35A, and a thin film transistor which controls one of the imaging elements, while

FIG. 38A is a graph showing a light transmission spectrum of a nano-carbon film lamination structure including a dielectric material layer made of IGZO, while

MODE FOR CARRYING OUT THE INVENTION

Figure 1A:
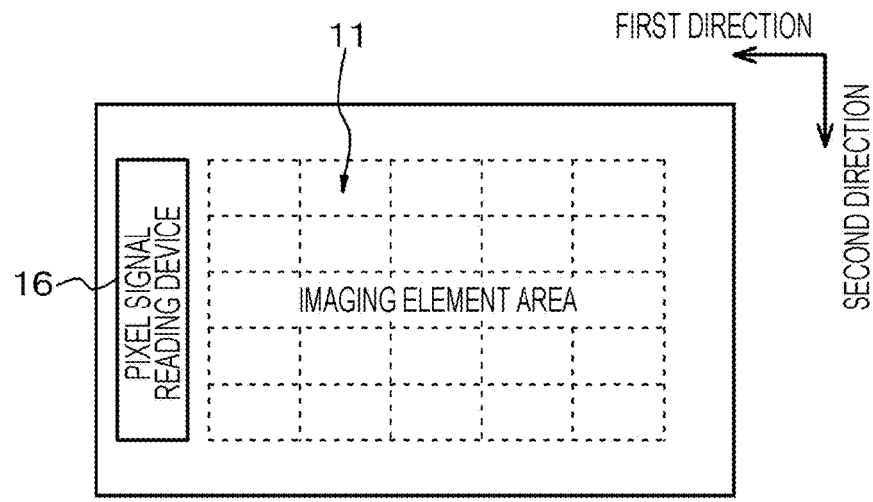
FIGS. 1A and 1B are a conceptual view of an imaging device, and a conceptual view of an imaging element unit, respectively, according to a first embodiment.

Hereinafter the present disclosure is described on the basis of embodiments with reference to the drawings. However, the present disclosure is not limited to the respective embodiments described herein. Various numerical values and materials included in the respective embodiments are presented only by way of example. Note that the description proceeds in the following order.

1. General description of imaging device and pixel signal reading method of present disclosure 2. First Embodiment (imaging device and pixel signal reading method of present disclosure)

3. Second Embodiment (modification of first embodiment)

4. Third Embodiment (different modification of first embodiment)

5. Fourth Embodiment (modification of third embodiment)

6. Fifth Embodiment (modification of first through fourth embodiments, movement detection etc.)

7. Sixth Embodiment (modification of first through fifth embodiments, coded exposure)

8. Seventh Embodiment (modification of first through sixth embodiments, SVE process)

9. Eighth Embodiment (modification of first through seventh embodiments, light control device of first configuration)

10. Ninth Embodiment (modification of first through eighth embodiments, light control device of second configuration)

11. Tenth Embodiment (modification of ninth embodiment)

12. Eleventh Embodiment (modification of first through eighth embodiments, light control device of third configuration)

13. Twelfth Embodiment (modification of first through eighth embodiments, light control device of fourth configuration)

14. Thirteenth Embodiment (modification of imaging device of present disclosure)

15. Fourteenth Embodiment (modification of thirteenth embodiment)

16. Fifteenth Embodiment (modification of thirteenth and fourteenth embodiments)

17. Sixteenth Embodiment (modification of thirteenth through fifteenth embodiments)

18. Seventeenth Embodiment (modification of thirteenth through sixteenth embodiments)

19. Others

<General Description about Imaging Device and Pixel Signal Reading Method of Present Disclosure>

According to an imaging device and a pixel signal reading method of the present disclosure, analog-digital converters may be directly turned on or off at random by using a pixel signal reading device, or a switching element may be disposed between an analog-digital converter and an imaging element and randomly operated by using the pixel signal reading device to randomly switch between two systems constituted by a system for inputting a pixel signal of the imaging element to the analog-digital converter and a system for inputting a pixel signal corresponding to a black level from the pixel signal reading device to the analog-digital converter. A reading amplifier may be further provided and randomly operated by the pixel signal reading device to select spatially at random an imaging element which outputs a pixel signal to the analog-digital converter, and randomly output the pixel signal of the imaging element from the analog-digital converter. More specifically, the reading amplifier in the mode including the reading amplifier may be directly turned on or off at random by the pixel signal reading device, or the switching element disposed between the reading amplifier and the imaging element may be randomly operated by the pixel signal reading device to randomly switch between the system for inputting a pixel signal from the imaging element to the reading amplifier and the system for inputting a pixel signal corresponding to a black level from the pixel signal reading device to the amplifier. The pixel signal reading device includes a random signal generation and transmission circuit. For example, the random signal generation and transmission circuit includes a pseudo random signal generation circuit. In addition, the pixel signal reading device is controlled on the basis of a signal processing algorithm.

According to an adoptable mode of the imaging device or the pixel signal reading method of the present disclosure, the analog-digital converter to which a pixel signal is input from the imaging element is in an operating state, and the analog-digital converter to which a pixel signal is not input from the imaging element is in a non-operating state. Alternatively, the reading amplifier that controls operation of the analog-digital converter to which a pixel signal is input from the imaging element is in an operating state, and the reading amplifier that controls operation of the analog-digital converter to which a pixel signal is not input from the imaging element is in a non-operating state.

According to an adoptable mode of the imaging device or the pixel signal reading method of the present disclosure including the above preferable mode, a pixel signal addition circuit is further provided, and a pixel signal of the imaging element output from the analog-digital converter is sequentially input to the pixel signal addition circuit to add a plurality of arbitrary pixel signals at the pixel signal addition circuit. In this case, the plurality of arbitrary pixel signals may be image data stored in adjoining memories within a frame memory included in the pixel signal addition circuit, for example. However, the mode for adding the plurality of arbitrary pixel signals at the pixel signal addition circuit is not necessarily required. Even when image data input to the pixel signal addition circuit is sequentially output from the pixel signal addition circuit, spatially random selection of the imaging element outputting the pixel signal to the analog-digital converter, and random output of the pixels signal of the imaging element from the analog-digital converter are both securable.

Furthermore, according to an adoptable mode of the imaging device or the pixel signal reading method of the present disclosure including the above respective preferable modes, the K imaging elements arranged in the first direction, and the L imaging elements arranged in the second direction constitute the K×L imaging elements in total, the K×L imaging elements constitute an imaging element unit, the I imaging element units being provided in the first direction, and the J imaging element units being provided in the second direction, the (i, j)th (i=1, 2, and up to I, j=1, 2, and up to J) imaging element unit is constituted by the $K_i$ imaging elements in the first direction and the $L_j$ imaging elements in the second direction, the $K_i$ analog-digital converters or reading amplifiers are provided in the (i, j)th imaging element unit, and the analog-digital converters or the reading amplifiers are randomly operated by the pixel signal reading device in the (i, j)th imaging element unit to randomly select the fewer imaging element than the ($K_i \times L_j$) imaging elements, and read a pixel signal from the selected imaging element. Note that this mode is also referred to as "A mode of the present disclosure".

More specifically, in A mode of the present disclosure, the one analog-digital converter or reading amplifier is provided for each of imaging element groups each of which is constituted by the $L_j$ imaging elements arranged in the second direction in the (i, j)th imaging element unit. The analog-digital converter or the reading amplifier is randomly operated by the pixel signal reading device to randomly select the fewer imaging element than the $K_i$ imaging elements (including 0, and $K_i$ or fewer in some cases) from the $K_i$ imaging elements arranged in the first direction, and read a pixel signal from the selected imaging element. Furthermore, this process is sequentially repeated in the second direction. As a result, one imaging frame or one exposure period segment described below is completed. Note that in A mode of the present disclosure, similar operation and processing are simultaneously performed in all of the imaging element units. More specifically, the analog-digital converters are simultaneously operated by the pixel signal reading device in a similar manner at random in all of the imaging element units to read pixel signals of the imaging elements spatially at random.

Alternatively, according to an adoptable mode of the imaging device or the pixel signal reading method of the present disclosure including the above respective preferable modes, the K imaging elements arranged in the first direction, and the L imaging elements arranged in the second direction constitute the K×L imaging elements in total, the one analog-digital converter or the reading amplifier is provided for a group of the imaging elements constituted by the L imaging elements arranged in the second direction, and the analog-digital converter or the reading amplifier is randomly operated by the pixel signal reading device to randomly select the fewer imaging element than the K imaging elements from the K imaging elements arranged in the first direction, and read a pixel signal from the selected imaging element. Note that this mode is also referred to as "B mode of the present disclosure".

More specifically, in B mode of the present disclosure, the analog-digital converter or the reading amplifier is randomly operated by the pixel signal reading device to randomly select the fewer imaging element than the K imaging elements (including 0, and K or fewer in some cases) from the K imaging elements arranged in the first direction, and read a pixel signal from the selected imaging element. Furthermore, this process is sequentially repeated in the second direction. As a result, one imaging frame or one exposure period segment described below is completed.

Alternatively, according to an adoptable mode of the imaging device or the pixel signal reading method of the present disclosure including the above respective preferable modes, the K imaging elements arranged in the first direction, and the L imaging elements arranged in the second direction constitute the K×L imaging elements in total, the one analog-digital converter or the one reading amplifier is provided for the one imaging element, and the analog-digital converter or the reading amplifier is randomly operated by the pixel signal reading device to randomly select the fewer imaging element than the K×L imaging elements from the K×L imaging elements, and read a pixel signal from the selected imaging element. Note that this mode is also referred to as "C mode of the present disclosure". As a result, one imaging frame or one exposure period segment described below is completed.

In each of A mode, B mode, and C mode of the present disclosure, an exposure period of each imaging element in one imaging frame may be divided into one, two or more exposure period segments. An integrated time of each of the exposure period segments may be equalized for all the imaging elements. A time length of each of the divided exposure period segments is random (i.e., not uniform). In this case, effective utilization of a saturated charge amount in each imaging element is achievable.

Alternatively, in A mode, B mode, and C mode of the present disclosure, the exposure period of each of the imaging elements in one imaging frame is divided into two or more exposure period segments. Random exposure is performed such that at least one imaging element is exposed in each of the exposure period segments. Signal processing is performed for the read pixel signals. This method therefore produces a state that the one imaging frame is divided into a plurality of imaging frames. Furthermore, as a result, an imaging frame rate increases without increasing a driving frequency of the imaging elements.

Alternatively, according to an adoptable configuration in A mode, B mode, and C mode of the present disclosure, each of the imaging elements includes a light receiving element, and a light control device disposed on a light entrance side of the light receiving element, the light control device includes a lamination of M (M≥1) light control layer or layers each of which includes a lamination of a first nano-carbon film, a first intermediate layer, a dielectric material layer, and a second intermediate layer, the light control device further including a second nano-carbon film on the second intermediate layer constituting the Mth light control layer, and voltage is applied to the first nano-carbon film and the second nano-carbon film under control by the pixel signal reading device to control entrance of light into the imaging element. Note that the light control device having this configuration is called a "light control device of a first configuration" for convenience. According to the light control device (light control element) of the first configuration, the light control layer including the first nano-carbon film and the second nano-carbon film is provided. Voltage is applied to the first nano-carbon film and the second nano-carbon film. Accordingly, light transmittance of the light control layer is controllable. Furthermore, according to this configuration, each of the imaging elements may include a thin film transistor that controls an operation of the light control device included in the corresponding imaging element. Furthermore, according to this configuration, pixel signal reading from the selected imaging element, and light entrance start and light entrance end into the imaging element at random in time may be performed under control by the pixel signal reading device. In this case, while light entrance start and light entrance end into the imaging element are performed at random in time herein, either a mode which uniformly sets the time from the light entrance start to the light entrance end, or a mode which randomly sets the time from the light entrance start to the light entrance end may be selected. When the time length from the light entrance start to the light entrance end is randomly set, the time of the light entrance start may be set at random. The same is applicable to following cases. When light entrance start and light entrance end into the imaging element are performed at random in time, an obtained information volume on pixel signals increases. As a result, prevention of deterioration of resolution, and further reduction of power consumption are achievable. Furthermore, according to these configurations, pulsed voltage may be randomly applied to the first nano-carbon film and the second nano-carbon film in each of the imaging elements. Furthermore, an integrated value of application time of pulsed voltage to the first nano-carbon film and the second nano-carbon film may be uniform.

Furthermore, according to an adoptable mode of the imaging device or the pixel signal reading method of the present disclosure including the respective preferable modes and configurations described above, a movement detection circuit that detects movement of a subject is further provided in the imaging device, and a state that the analog-digital converter or the reading amplifier is randomly operated by the pixel signal reading device is changed in accordance with a presence or an absence of movement detection of the subject detected by the movement detection circuit. More specifically, when movement of a subject is detected by the movement detection circuit, an appropriate state is selected from a state for operating all the analog-digital converters or reading amplifiers, a state for omitting an image compression process, or a state for decreasing an image compression rate (described below).

For movement detection herein, the movement detection circuit may include a high-frequency detection filter. In this case, a high frequency may be detected by using Fourier transform, weblet transform, discrete cosine transform or the like. In addition, movement detection may be performed for a high frequency around a sampling frequency detected by Fourier transform, wavelet transform, discrete cosine transform or the like on the basis of a threshold of a predetermined frequency.

Furthermore, according to the respective preferable modes and configurations described above, a high dynamic range synthesis (high dynamic range imaging, HDR) system, or a spatially varying exposure (SVE) system may be adopted. See International Publication No. 2002/056604 and Japanese Patent Application Laid-Open No. 2004-172858 for details of HDR system and SVE system, for example.

Furthermore, according to the respective preferable modes and configurations described above, blurs in images are avoidable by applying coded exposure. See Japanese Patent Application Laid-Open No. 2011-044891 for details of coded exposure, for example.

The analog-digital converter may be a known analog-digital converter. More specifically, the analog-digital converter may be a single slope type analog-digital converter, a successive approximation type analog-digital converter, or a delta-sigma modulation type (Δ modulation type) analog-digital converter, for example. In addition, the analog-digital converter may include a gray code counter. However, the analog-digital converter is not limited to these examples, but may be other types such as a flash type, a half-flash type, a subranging type, a pipeline type, a bit-per-stage type, and a magnitude-amplifier type. The reading amplifier may be a reading amplifier (reading circuit) having a known configuration and structure. Specific examples of the light receiving element of each of the imaging elements include a photo sensor (photodiode). The light receiving element constitutes a complementary metal oxide semiconductor (CMOS) image sensor or a charge couple device (CCD) image sensor. Alternatively, a bolometer type light receiving element may be employed. Each of the imaging elements or the imaging device may have a known configuration and structure. The imaging element may be of either a rear-side illumination type or a front-side illumination type.

According to the imaging device of the present disclosure including the respective preferable modes and structures described above, and the imaging device used in the pixel signal reading method of the present disclosure including the respective preferable modes and structures described above (hereinafter collectively referred to as "imaging device and the like of the present disclosure), it is preferable that a pixel signal processing device processing read pixel signals is further provided.

The light control device (light control element) included in each of the imaging elements is not limited to the light control device of the first configuration. For example, according to an adaptable configuration of the light control device, each of the imaging elements includes a light receiving element, and a light control device disposed on a light entrance side of the light receiving element, the light control device includes a pair of electrodes, and a light control layer sandwiched between the pair of electrodes, the light control layer includes a laminated structure constituted by a first dielectric material layer, a first intermediate layer, a first nano-carbon film doped with first conductivity type impurities or not doped with impurities, a second nano-carbon film doped with second conductivity type impurities different from the first conductivity type, or not doped with impurities, a second intermediate layer, and a second dielectric material layer, and voltage is applied to the pair of electrodes. Note that the light control device having this configuration is called a "light control device of a second configuration" for convenience.

According to the light control device (light control element) of the second configuration, the light control layer includes the laminated structure constituted by the first dielectric material layer, the first nano-carbon film doped with first conductivity type impurities or not doped with impurities, the second nano-carbon film doped with second conductivity type impurities, or not doped with impurities, and the second dielectric material layer. Accordingly, by applying voltage to the pair of electrodes, positive or negative charges are induced in either the first nano-carbon film or the second nano-carbon film, and negative or positive charges are induced in the opposite film in accordance with the polarity of the applied voltage. As a result, a light wavelength band for passing through the light control layer at high light transmittance is determined. In other words, light transmittance of the light control layer is controllable. In a state herein that the first nano-carbon film is doped with first conductivity type impurities, and that the second nano-carbon film is doped with second conductivity type impurities, pn junction is produced in the interface between the first nano-carbon film and the second nano-carbon film. In this condition, charges are retained in each of the first nano-carbon film and the second nano-carbon film when reversely biased voltage is applied to the pair of electrodes. Alternatively, even when the first nano-carbo film and/or the second nano-carbon film is not doped with impurities, charges are retained in each of the first nano-carbon film and the second nano-carbon film by applying appropriate voltage to the pair of electrodes.

Furthermore, according to the light control device of the second configuration, pixel signal reading from the selected imaging element, and light entrance start and light entrance end into the imaging element at random in time may be performed under control by the pixel signal reading device. In this case, while light entrance start and light entrance end into the imaging element are performed at random in time herein, either a mode which uniformly sets the time from the light entrance start to the light entrance end, or a mode which randomly sets the time from the light entrance start to the light entrance end may be selected. Moreover, according to these configurations, pulsed voltage may be randomly applied to the pair of electrodes in each of the imaging elements. Furthermore, an integrated value of application time of pulsed voltage to the pair of electrodes may be uniform.

Alternatively, according to an adoptable configuration of the light control device, each of the imaging elements includes a light receiving element, and alight control device disposed on a light entrance side of the light receiving element, the light control device includes a pair of electrodes, and a light control layer sandwiched between the pair of electrodes, the light control layer includes a laminated structure constituted by a first dielectric material layer, a first intermediate layer, a nano-carbon film doped with impurities or not doped with impurities, a second intermediate layer, and a second dielectric material layer, and voltage different from voltage applied to the pair of electrodes is applied to the nano-carbon film. Note that the light control device having this configuration is called a "light control device of a third configuration" for convenience.

According to the light control device (light control element) of the third configuration, the light control layer has the laminated structure constituted by the first dielectric material layer, the nano-carbon film doped with impurities or not doped with impurities, and the second dielectric material layer. Voltage different from voltage applied to the pair of electrodes is applied to the nano-carbon film. Accordingly, light transmittance of the light control layer is controllable.

Furthermore, according to the light control device of the third configuration, pixel signal reading from the selected imaging element, and light entrance start and light entrance end into the imaging element at random in time may be performed under control by the pixel signal reading device. In this case, while light entrance start and light entrance end into the imaging element are performed at random in time herein, either a mode which uniformly sets the time from the light entrance start to the light entrance end, or a mode which randomly sets the time from the light entrance start to the light entrance end may be selected. Moreover, according to these configurations, pulsed voltage may be randomly applied to the pair of electrodes in each of the imaging elements. Furthermore, an integrated value of application time of pulsed voltage to the pair of electrodes may be uniform.

Alternatively, according to an adoptable configuration of the light control device, each of the imaging elements includes a light receiving element, and a light control device disposed on a light entrance side of the light receiving element, the light control device includes a pair of electrodes, and a laminated structure on which P light control layers (P≥1) sandwiched between the pair of electrodes, the pth light control layer (1≤p≤P) has a laminated structure including a first dielectric material layer, a first intermediate layer, a first nano-carbon film doped with n-type impurities or not doped with impurities, a second intermediate layer, a second dielectric material layer, a third intermediate layer, a second nano-carbon film doped with p-type impurities or not doped with impurities, and a fourth intermediate layer, the Pth light control layer further includes a third dielectric material layer on the fourth intermediate layer, and voltage different from voltage applied to the first nano-carbon film is applied to the second nano-carbon film. Note that the light control device having this configuration is called a "light control device of a fourth configuration" for convenience.

The light control device (light control element) of the fourth configuration has the laminated structure including the P layers (P≥1) having a predetermined configuration. Voltage different from voltage applied to the first nano-carbon film is applied to the second nano-carbon film. Accordingly, light transmittance of the light control layer is controllable.

Furthermore, according to the light control device of the fourth configuration, pixel signal reading from the selected imaging element, and light entrance start and light entrance end into the imaging element at random in time may be performed under control by the pixel signal reading device. In this case, while light entrance start and light entrance end into the imaging element are performed at random in time herein, either a mode which uniformly sets the time from the light entrance start to the light entrance end, or a mode which randomly sets the time from the light entrance start to the light entrance end may be selected. Moreover, according to these configurations, pulsed voltage may be randomly applied to the pair of electrodes in each of the imaging elements. Furthermore, an integrated value of application time of pulsed voltage to the pair of electrodes may be uniform.

In addition, according to the light control devices of the second through fourth configurations, no current flows between the pair of electrodes. Accordingly, reduction of power consumption is achievable.

Moreover, according to the light control devices of the first through fourth configurations, the intermediate layer functioning as a flattening layer and also as an antireflection layer is provided between the nano-carbon film and the dielectric material layer. In this case, the intermediate layer offers advantages of improvement of flatness between the nano-carbon film and the dielectric material layer, improvement of tight contact, and reduction of unnecessary reflection of incident light between the nano-carbon film and the dielectric material layer. In addition, by appropriately selecting voltage to be applied (predetermined voltage $V_0$), effective light transmittance of the light control layer for light having the wavelength $\lambda_0$ or higher. For example, light transmittance for light having the wavelength $\lambda_0$ or higher (such as light having a wavelength band of visible light or higher) is set to approximately 100% at the predetermined voltage $V_0$ in a state that the wavelength $\lambda_0$ is blue (such as 380 nm). By this method, the desired light transmittance is accurately and easily obtainable. Moreover, light transmittance is set to a desired value. Furthermore, the nano-carbon film has no light transmittance dependency on wavelength, and needs only a short time for a change of light transmittance.

Furthermore, according to imaging devices including the light control devices of the second through fourth configurations, the pair of electrodes may be common to the imaging elements each of which includes the light control device, or may be common to the imaging elements each of which does not include the light control device.

In addition, according to the light control device of the first configuration, as described above, light transmittance of the light control layer is controllable by applying voltage to the first nano-carbon film and the second nano-carbon film. According to an adoptable mode of the light control device of the first configuration including this mode, in a state that M is an odd number, the odd-numbered first nano-carbon film is connected to first wiring, while the even-numbered first nano-carbon film and second nano-carbon film are connected to second wiring. In a state that M is an even number, the odd-numbered first nano-carbon film and second nano-carbon film are connected to the first wiring, while the even-numbered first nano-carbon film is connected to the second wiring.

According to an adoptable mode of the light control device of the second configuration including the preferable mode described above, light transmittance of the light control layer is controlled by control of a charge amount generated in the first nano-carbon film and/or the second nano-carbon film, the charge amount control achieved by applying voltage to the pair of electrodes.

Furthermore, according to an adoptable mode of the light control device of the second configuration including the respective preferable modes described above, N light control layers and (N+1) electrodes are provided. The N light control layers and the (N+1) electrodes are alternately laminated. The odd-numbered electrodes are connected to first wiring. The even-numbered electrodes are connected to second wiring.

Furthermore, according to an adoptable mode of the light control device of the second configuration including the respective preferable modes described above, the first conductivity type is n type, the second conductivity type is p type, and voltage higher than voltage applied to the second electrode facing the second nano-carbon film via the second dielectric material layer is applied to the first electrode facing the first nano-carbon film via the first dielectric material layer. More specifically, according to the configuration adopting this mode, negative charges are induced in the first nano-carbon film, while positive charges are induced in the second nano-carbon film. In a state herein that the first nano-carbon film is doped with n-type conductivity type impurities, and that the second nano-carbon film is doped with p-type conductivity type impurities, pn junction is produced in the interface between the first nano-carbon film and the second nano-carbon film. In this condition, charges are retained in each of the first nano-carbon film and the second nano-carbon film during application of reversely biased voltage to the pair of electrodes. Furthermore, as a result, a light wavelength band for passing through the light control layer at high light transmittance is determined.

According to an adoptable mode of the light control device of the third configuration including the preferable mode described above, the impurities are of p type, and voltage higher than voltage applied to the pair of electrodes is applied to the nano-carbon film. Alternatively, the impurities are of n type, and voltage lower than voltage applied to the pair of electrodes is applied to the nano-carbon film.

According to an adoptable mode of the light control device of the fourth configuration including the preferable mode described above, voltage equal to or lower than voltage applied to the second nano-carbon film, and equal to or higher than voltage applied to the first nano-carbon film is applied to the pair of electrodes. Furthermore, according to the light control device of the fourth configuration including this mode, the first nano-carbon film may be connected to the first wiring, while the second nano-carbon film may be connected to the second wiring.

According to an adoptable mode of the light control devices of the first through fourth configurations including the respective preferable modes described above, each of the first nano-carbon film, the second nano-carbon film, and the nano-carbon film is made of graphene. However, the materials of these films are not limited to this material, but may be carbon nanotube or fullerene. The thickness of graphene corresponds to the thickness of one layer of atoms, wherefore the light control device which includes the nano-carbon film made of graphene has a small thickness, wherefore reduction of height (thickness) of the imaging elements or the imaging device is achievable.

The materials constituting the first intermediate layer or the second intermediate layer according to the light control devices of the first configuration through third configuration including the respective preferable modes described above, or the materials constituting the first intermediate layer, the second intermediate layer, the third intermediate layer, and the fourth intermediate layer according to the light control device of the fourth configuration including the respective preferable modes described above may be at least one type of material selected from a group of titanium dioxide, titanium nitride, chromium oxide, amorphous silicon, magnesium fluoride, silicon nitride, and silicon oxide.

According to an adoptable mode of the imaging device and the like including the respective preferable modes and configurations described above of the present disclosure, a color filter layer is disposed on the light entrance side of the light receiving element. Furthermore, in this case, the color filter layer may be disposed on the light entrance side of the light control device in the imaging elements each of which includes the light control device.

Furthermore, according to an adoptable mode of the imaging device and the like including the respective preferable modes and configurations described above of the present disclosure, each of the imaging elements further includes a light shielding film.

Furthermore, according to an adoptable mode of the imaging device and the like including the respective preferable modes and configurations described above of the present disclosure, the light control device is included in each of the imaging elements arranged in units of row, the light control device is included in each of the imaging elements arranged in units of column, or the light control device is included in each of all the imaging elements.

Furthermore, according to an adoptable configuration of the imaging device and the like including the respective preferable modes and configurations described above of the present disclosure, there is provided a random pulse voltage generation and transmission device that generates random pulse voltage and transmits the generated random pulse voltage to the imaging elements each of which includes the light control device. Note that this configuration is also referred to as "random exposure" for convenience. Furthermore, in this case, the one random pulse voltage generation and transmission device may be provided for the plurality of imaging elements each of which includes the light control device, or may be provided for the one imaging element including the light control device. Furthermore, according to an adoptable mode of the imaging device and the like including the respective preferable modes and configurations described above of the present disclosure, the random pulse voltage includes random pulse voltage having positive polarity and random pulse voltage having negative polarity. Operation of the random pulse voltage generation and transmission device may be controlled by the pixel signal reading device. More specifically, when the pixel signal reading device randomly operates the analog-digital converter or the reading amplifier, the random pulse voltage generation and transmission device may transmit random pulse voltage to the imaging element connected to this analog-digital converter or reading amplifier.

Alternatively, according to an adoptable configuration of the imaging device and the like including the respective preferable modes and configurations described above of the present disclosure, applied is pulse voltage calculated on the basis of output signals obtained by the imaging elements each of which includes the light control device. Note that this configuration is also referred to as "random exposure" for convenience. Application of pulse voltage may be controlled by the pixel signal reading device.

Furthermore, according to the imaging device and the like including the respective preferable modes and configurations described above of the present disclosure, image output signals generated from the imaging elements each of which includes the light control device are compressed by thinning in space and time.

Furthermore, according to an adoptable mode of the imaging device and the like including the respective preferable modes and configurations described above of the present disclosure, the imaging elements arranged in two-dimensional matrix are provided on a first semiconductor chip, the pixel signal reading device (and further the random pulse voltage generation and transmission device that generates random pulse voltage and transmits the generated random pulse voltage to the imaging element each of which includes the light control device in some cases) is provided on a second semiconductor chip, the first semiconductor chip and the second semiconductor chip are laminated on each other, and the pixel signal reading device and the analog-digital converter or the reading amplifier (and further the light control devices and the random pulse voltage generation and transmission device in some cases) are connected via a through-silicon via (TSV), or connected via a bump (mode based on so-called chip-on-chip system). Note that the imaging elements may be of a rear-side illumination type in this mode, or may be of a front-side illumination type rather than the rear-side illumination type.

Furthermore, according to an adoptable mode of the imaging device and the like including the respective preferable modes and configurations described above of the present disclosure, a random pulse voltage generation and transmission device that generates random pulse voltage and transmits the generated random pulse voltage to the imaging element each of which includes the light control device is provided, and the light control devices and the random pulse voltage generation and transmission device are connected by connection wiring constituted by a nano-carbon film or a transparent conductive material layer.

Furthermore, according to an adoptable mode of the imaging device and the like including the respective preferable modes and configurations described above of the present disclosure, the imaging elements are arranged in two-dimensional matrix in the first direction and the second direction, the first nano-carbon film extends in the first direction, and common to the imaging elements arranged in the first direction, the second nano-carbon film extends in the second direction, and common to the imaging elements arranged in the second direction, random pulse voltage having positive polarity is applied to the first nano-carbon film, and random pulse voltage having negative polarity is applied to the second nano-carbon film. Furthermore, in this case, an end of the first nano-carbon film extending in the first direction may be patterned into a comb-electrode shape, and an end of the second nano-carbon film extending in the second direction may be patterned into a comb-electrode shape.

Alternatively, according to the imaging device and the like including the respective preferable modes and configurations described above of the present disclosure, operation of the light control device included in each of the imaging elements may be controlled by a thin film transistor (TFT) included in the corresponding imaging element. For example, the thin film transistor may be provided on a light shielding film between the imaging elements for manufacture in a relatively easy process without sacrificing an opening rate of a pixel.

The pair of electrodes included in the light control device of the second through fourth configurations may be constituted by a nano-carbon film or a transparent conductive material layer. Alternatively, one of the pair of electrodes may be constituted by a nano-carbon film, while the other may be constituted by a transparent conductive material layer. Examples of the material constituting the transparent conductive material layer include Indium tin oxide (ITO, containing Sn doped $In_2O_3$, crystalline ITO and amorphous ITO), indium zinc oxide (IZO), AZO (aluminum oxide doped zinc oxide), GZO (gallium-doped zinc oxide), AlMg-ZnO (aluminum oxide and magnesium oxide doped zinc oxide), indium-gallium oxide (IGO), In—$GaZnO_4$ (IGZO), IFO (F-doped $In_2O_3$), antimony-doped $SnO_2$ (ATO), FTO (F doped $SnO_2$), tin oxide ($SnO_2$), zinc oxide (ZnO), B-doped ZnO, InSnZnO, and ITiO(Ti-doped$In_2O_3$). Materials constituting the first wiring, the second wiring, and the connection wiring may be made of similar materials.

Each of the first dielectric material layer, the second dielectric material layer, and the third dielectric material layer needs to be made of material transparent for light entering the light control devices of the first through fourth configurations. Examples of insulation material constituting the first dielectric material layer, the second dielectric material layer, and the third dielectric material layer include material of $SiO_2$ family such as $SiO_2$, NSG (none-dope silicate glass), BPSG (boron phosphorous silicate glass), PSG, BSG, AsSG, PbSG, SbSG, SOG (spin on glass), SiOC, SiOF; material of SiN family containing SiON and SiCN; metal oxide such as aluminum oxide ($Al_2O_3$), titanium oxide ($TiO_2$), ZnO, indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybden oxide ($MoO_3$); metal nitride; and metal oxynitride. These materials may be used individually or combined in appropriate manners. Examples of the forming method of the first dielectric material layer, the second dielectric material layer, and the third dielectric material layer include various types of CVD, coating, various types of PVD including sputtering and vacuum deposition, various types of printing including screen printing, sol-gel, and other known methods.

Alternatively, according to the light control device of the second configuration, it is preferable that the first dielectric material layer and the second dielectric material layer are made of material having high charge density of polarization charges sufficient for inducing charges in the first nano-carbon film and the second nano-carbon film without causing breakdown. For increasing a charge amount stored in the nano-carbon film by application of voltage, it is preferable that dielectric material constituting the first dielectric material layer and the second dielectric material layer is dielectric material having a high dielectric constant (paraelectric material or ferroelectric material), such as dielectric material having a dielectric constant of 2.0 or higher, preferably dielectric material having a dielectric constant of 4.0 or higher, more preferably dielectric material having a dielectric constant of 8.0 or higher. Dielectric material constituting the first dielectric material layer and the second dielectric material layer may be ferroelectric material having spontaneous polarization. Alternatively, dielectric material constituting the first dielectric material layer and the second dielectric material layer may be polyvinylidene fluoride (PVDF) (dielectric constant: approximately 10), high density polyethylene (HDPE), organic material such as amorphous fluororesin, ionic liquid, or liquid crystal, for example. Generally, inorganic oxide has high dielectric and insulation properties, but has low transparency in an infrared range. For light transmittance control in the infrared range, it is preferable that the dielectric material constituting the first dielectric material layer and the second dielectric material layer is made of $CaF_2$ having high transparency in the infrared range, for example. In addition, dielectric material may be metamaterial. Following Table 1 shows dielectric constants and others of various dielectric materials. Note that the foregoing description is applicable to the light control devices of the first configuration, the third configuration, and the fourth configuration.

TABLE 1

| Dielectric Material | Dielectric Constant | Dielectric Voltage (MV/cm) | Charge Density ($\mu C/cm^2$) |
|---|---|---|---|
| $SiO_2$ | 4 | 10 | 3.5 |
| $Al_2O_3$ | 8.2 | 8.2 | 6.0 |
| h-BN | 4 | 20 | 7.1 |
| $HfO_2$ | 18.5 | 7.4 | 12.0 |
| $ZrO_2$ | 29 | 6 | 15.4 |

TABLE 1-continued

| Dielectric Material | Dielectric Constant | Dielectric Voltage (MV/cm) | Charge Density (μC/cm$^2$) |
|---|---|---|---|
| ZnO | 7.9 | | |
| TiO$_2$ | 8.5 | | |
| IGZO | 9 | | |
| SiN | 7 | 40 | 2.5 |
| GaN | 9.5 | | |
| STO | 140 to 200 | 2 | 24.8 to 35.4 |
| BTO | 200 | 0.4 | 7.1 |
| PZT | 700 | 0.5 | 30.9 |
| PTO | 100 to 200 | 0.675 | 6.1 to 11.9 |
| PLZT | 200 | 3 | 53.1 |
| CaF$_2$ | 6.6 | 0.3 | 0.17 |
| HDPE | 2.3 | | |

In this table, "h-BN" indicates hexagonal boron nitride, "STO" indicates strontium titanate (SrTiO$_3$), "BTO" indicates barium titanate, "PZT" indicates lead zirconate titanate, "PTO" indicates lead titanate, and "PLZT" indicates lead lanthanum zirconate titanate ((Pb, La)(Zr, Tr)O$_3$).

The light transmittance of the nano-carbon film per one layer is approximately 97.7% (light absorptivity: approximately 2.3%). Accordingly, for greatly lowering light transmittance, the light control device including a plurality of the light control layers is used. For example, in case of the light control device including a lamination of 60 nano-carbon films, the whole light transmittance decreases to $0.977^{60}$=approximately 25%.

For example, chemical doping may be performed to dope the nano-carbon film with first conductivity type or second conductivity type impurities. More specifically, a dopant layer may be formed on the nano-carbon film for chemical doping. The dopant layer may be an electron-accepting type (p-type) dopant layer, or an electron-releasing type (n-type) dopant layer. Examples of material constituting the electron-accepting type (p-type) dopant layer include chloride such as AuCl$_3$, HAuCl$_4$, and PtCl$_4$; acid such as HNO$_3$, H$_2$SO$_4$, HCl, and nitromethane; group III elements such as boron and aluminum; oxygen and other electron-withdrawing molecules. Examples of material constituting the electron-releasing type (n-type) dopant layer include group V elements such as nitrogen and phosphorous, pyridine-based compound, nitride, alkali metals, aromatic compound containing alkyl group, and other electron-releasing molecules.

The thickness of the dielectric material layer may be adjusted as necessary to allow multiple reflection of light having a wavelength corresponding to light transmittance to be controlled inside the light control layer. In this case, light transmittance of the light control layer in a transparent state comes to close to 100%.

In addition, metal nanoparticles or metal nanowire may be formed on or above the nano-carbon film as necessary. In this case, the light transmittance of the nano-carbon film per one layer becomes lower than 97.7%, for example, by utilizing surface plasmon-polariton phenomenon.

As described above, the nano-carbon film may be made of graphene. Graphene represents a sheet-shaped substance of sp$^2$-bonded carbon atoms having a thickness of one atom, and has a honeycomb-shaped hexagon lattice structure manufactured from carbon atoms and bonding of carbon atoms. In this case, graphene having these characteristics offers advantages such as high light transmittance of approximately 100% per one light control layer in a transparent state, low sheet resistance of 1 kΩ/□ per one light control layer, and a small film thickness of 0.3 nm when applied to electronic devices such as an imaging element, an imaging device, a light control device, and a shutter device.

In addition, as described above, graphene has such a characteristic that light transmittance varies when voltage is applied. FIGS. 39A, 39B, 39C, and 39D schematically show fluctuations of a forbidden band based on fluctuations of Fermi level $E_f$ in a band structure of graphene.

Figure 39A:
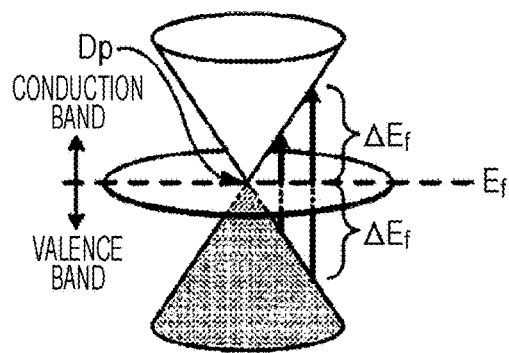
FIGS. 39A, 39B, 39C, and 39D are views schematically illustrating fluctuations of a forbidden band based on fluctuations of Fermi level $E_f$ in a band structure of graphene.

As illustrated in FIG. 39A, graphene is a zero-gap semiconductor having a linear dispersion relation between a valence band and a conduction band with respect to a point of symmetry located at Dirac point Dp, unlike an ordinary semiconductor. Generally, Fermi level $E_f$ is present at Dirac point Dp, but is shiftable by application of voltage or doping.

Figure 39B:
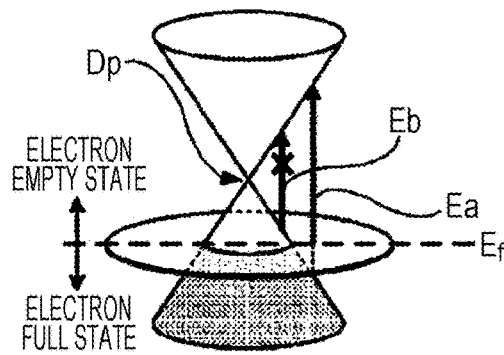
Figure 39C:
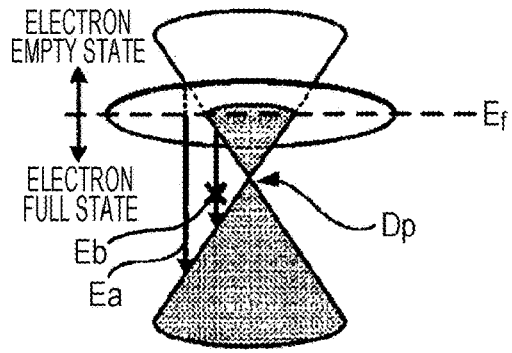
Figure 39D:
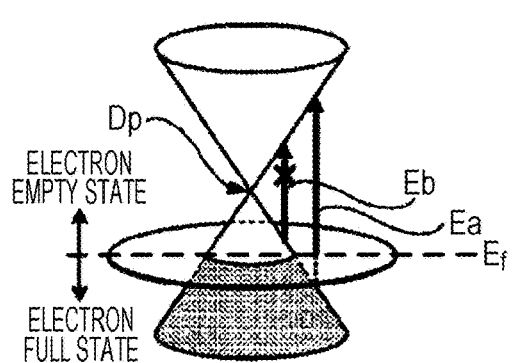

For example, as illustrated in FIG. 39B, optical transition of energy larger than $2|\Delta E_f|$ is allowed as indicated by an arrow $E_a$ when Fermi level $E_f$ is shifted by application of voltage or doping. On the other hand, optical transition of energy of $2|\Delta E_f|$ or lower may be forbidden as indicated by an arrow $E_b$. In this case, graphene is transparent for light having energy of $2|\Delta E_f|$ or lower. Accordingly, light transmittance of graphene for light having a desired wavelength frequency is variable (controllable) by shifting Fermi level $E_f$. As illustrated in FIG. 39C, Fermi level $E_f$ is shiftable toward the conduction band side from Dirac point Dp when graphene is doped with n-type impurities. On the other hand, when graphene is doped with p-type impurities as illustrated in FIG. 39D, Fermi level $E_f$ is shiftable from Dirac point Dp to the valence band side.

Figure 40:
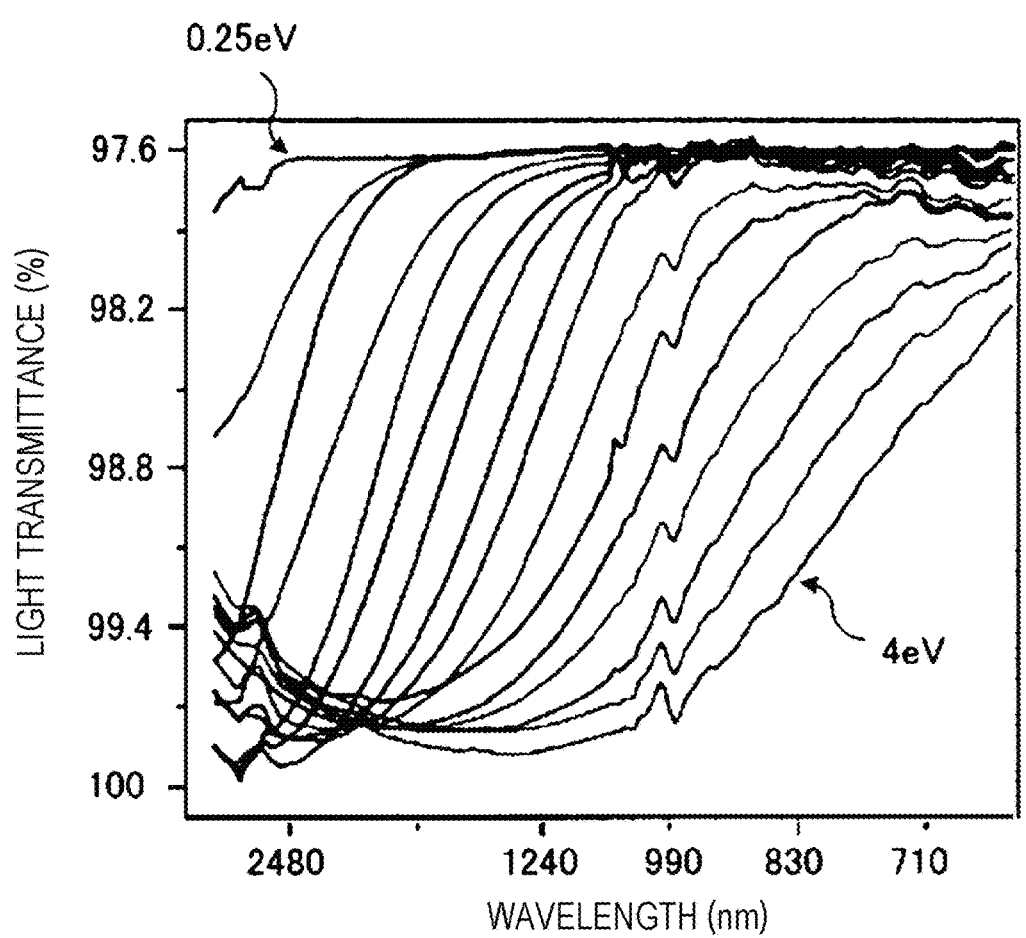
FIG. 40 is a view showing changes of light transmittance of a film-shaped graphene layer sandwiched between a pair of electrodes in an infrared range when applied voltage is varied.

It has been also reported by Chen and others that light transmittance of graphene in the infrared range varies when voltage is applied (Nature 471, 617-620 (2011)). FIG. 40 shows results of experiments in this report. FIG. 40 shows changes of light transmittance of a film-shaped graphene layer sandwiched between a pair of electrodes in the infrared range in accordance with a change of applied voltage. A horizontal axis represents wavelength (nm), while a vertical axis represents light transmittance (%).

As shown in FIG. 40, voltage is varied in a range from 0.25 eV to 4 eV. In addition, the lower part of the vertical axis of the graph corresponds to light transmittance of 100%, while the upper part corresponds to 97.6% (amount absorbed by one layer graphene). As obvious from FIG. 40, light transmittance becomes closer to 100% in a long wavelength range than in a short wavelength range when voltage is varied toward high voltage in the measured entire wavelength range. Furthermore, an area of light transmittance coming close to 100% expands toward the short wavelength side as applied voltage increases. Accordingly, it is understood that the light wavelength range allowing modulation (control) of light transmittance is expandable toward the short wavelength side by application of voltage. While these results are obtained from one layer of atoms, light transmittance is variable relative to a wavelength from a near infrared range to a teraherz range in accordance with a level of applied voltage.

In addition, these characteristics are common to other nano-carbon materials such as carbon nanotube and fullerene, as well as graphene.

Hereinafter described with reference to the drawings are an imaging device and a pixel signal reading method according to embodiments of the present disclosure. The respective embodiments have following configurations.

Figure 1B:
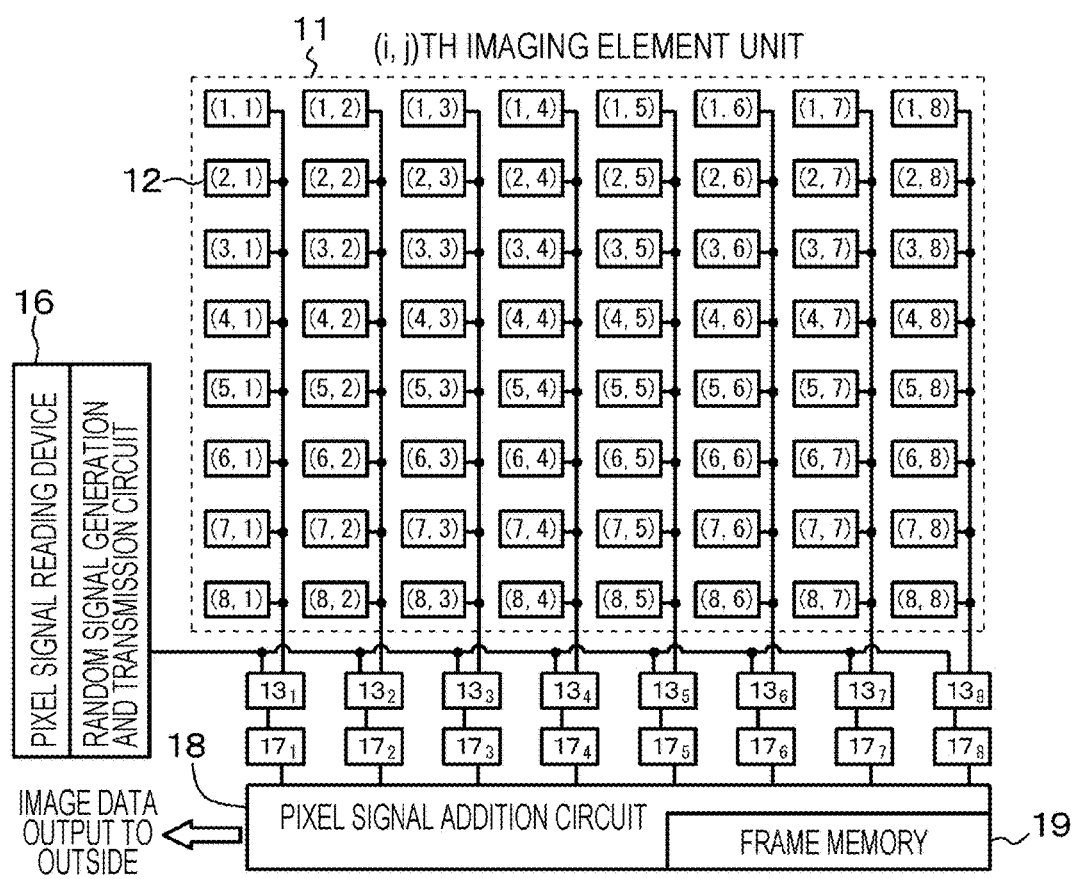

First Embodiment: Imaging device and pixel signal reading method, A mode of present disclosure
Time length of exposure period segment: uniform
Second Embodiment: modification of first embodiment, positioning of switching element
Third Embodiment: modification of first embodiment, reading amplifier, A mode of present disclosure Fourth embodiment: modification of third embodiment, positioning of switching element, B mode of present disclosure, C mode of present disclosure Fifth Embodiment: modification of first through fourth embodiments, motion detection Sixth Embodiment: modification of first through fifth embodiments, coded exposure Seventh Embodiment: modification of first through sixth embodiments, HDR, SVE process Eighth Embodiment: modification of first through seventh embodiments, light control device of first configuration, Time length of exposure period segment: uniform Ninth Embodiment: modification of first through eighth embodiments, light control device of second configuration, Time length of exposure period segment: uniform Tenth Embodiment: modification of ninth embodiment Eleventh Embodiment: modification of first through eighth embodiments, light control device of third configuration, Time length of exposure period segment: uniform Twelfth Embodiment: modification of first through eighth embodiments, light control device of fourth configuration, Time length of exposure period segment: uniform Thirteenth embodiment: imaging device of present disclosure to which eighth through twelfth embodiments are applied time length of exposure period segment: random nano-carbon film control first signal line and nano-carbon film control second signal line constituting AND circuit Fourteenth Embodiment: modification of thirteenth embodiment random pulse voltage applied to each imaging element Fifteenth Embodiment: modification of thirteen and fourteenth embodiments generation of random pulse voltage on the basis of random information originally present in imaging element Sixteenth Embodiment: modification of thirteenth through fifteenth embodiments, positioning imaging element receiving infrared light Seventeenth Embodiment: modification of thirteenth through sixteenth embodiments, duty ratio control First Embodiment A first embodiment relates to an imaging device and a pixel signal reading method according to the present disclosure, and more particularly to A mode of the present disclosure. FIG. 1A illustrates a conceptual view of the imaging device according to the first embodiment, while FIG. 1B is a conceptual view of one imaging element unit and the like.

The imaging device according to the first embodiment includes imaging elements 12 disposed in two-dimensional matrix in a first direction and a second direction, analog-digital converters 13 ($13_1$, $13_2$, and up to $13_8$), and a pixel signal reading device (pixel signal reading circuit) 16. In this case, the pixel signal reading device 16 selects spatially at random the imaging elements 12 that output pixel signals to the analog-digital converters 13 ($13_1$, $13_2$, and up to $13_8$), and randomly outputs the pixel signals of the imaging elements 12 from the analog-digital converters 13 ($13_1$, $13_2$, and up to $13_8$). In addition, the pixel signal reading method according to the first embodiment is a pixel signal reading method performed by an imaging device which includes imaging elements 12 disposed in two-dimensional matrix in the first direction and the second direction, the analog-digital converters 13 ($13_1$, $13_2$, and up to $13_8$), and the pixel signal reading device 16. In this case, the pixel signal reading device 16 selects spatially at random the imaging elements 12 that output pixel signals to the analog-digital converters 13 ($13_1$, $13_2$, and up to $13_8$), and randomly outputs the pixel signals of the imaging elements 12 from the analog-digital converters 13 ($13_1$, $13_2$, and up to $13_8$).

In this case, under control by the pixel signal reading device 16, the analog-digital converters 13 to which pixel signals are input from the imaging elements 12 are in an operating state, and that the analog-digital converters 13 to which pixel signals are not input from the imaging elements 12 are in a non-operating state.

More specifically, the imaging device according to the first embodiment is an imaging device in A mode of the present disclosure. The K imaging elements arranged in the first direction, and the L imaging elements arranged in the second direction constitute the K×L imaging elements in total. The K×L imaging elements 12 constitute an imaging element unit 11, the I imaging element units provided in the first direction, and the J imaging element units provided in the second direction. The (i, j) th (i=1, 2, and up to I, j=1, 2, and up to J) imaging element unit $11_{i,j}$ is constituted by the $K_i$ imaging elements 12 in the first direction and the $L_j$ imaging elements 12 in the second direction. The $K_i$ analog-digital converters (or reading amplifiers described below) are provided in the (i, j) th imaging element unit $11_{i,j}$. The analog-digital converters (or reading amplifiers described below) are randomly operated by the pixel signal reading device 16 in the (i, j) th imaging element unit $11_{i,j}$ to randomly select the fewer imaging element 12 than the ($K_i \times L_j$) imaging elements 12, and read a pixel signal from the selected imaging element 12.

In this configuration, the analog-digital converters (hereinafter also referred to as "AD converters") herein are constituted by known single slope type analog-digital converters. In addition, the pixel signal reading device 16 which randomly operates the AD converters 13 includes a random signal generation and output circuit capable of generating signals for randomly operating the AD converters 13 (or reading amplifiers described below). For example, the random signal generation and transmission circuit includes a pseudo random signal generation circuit. The single slope type AD converters will be described in a thirteen embodiment.

According to the example illustrated in FIG. 1B, $K_i$=8 and $L_j$=8 are assumed. However, the respective values of $K_i$ and $L_j$ are not limited to these values. In this configuration, each of the AD converters ($13_1$, $13_2$, and up to $13_8$) is provided for a corresponding imaging element group constituted by the $L_j$ (eight in the example illustrated in FIG. 1B) imaging elements 12 arranged in the second direction. In this case, the AD converters ($13_1$, $13_2$, and up to $13_8$) are randomly operated by the pixel signal reading device 16 to randomly select the fewer imaging element 12 than the $K_i$ imaging elements 12 from the $K_i$ imaging elements 12 arranged in the first direction, and read a pixel signal from the selected imaging element 12. In other words, the imaging element 12 outputting a pixel signal to the analog-digital converter 13 ($13_1$, $13_2$, and up to $13_8$) is selected spatially at random by the pixel signal reading device 16.

According to the first embodiment, an exposure period of each of the imaging elements 12 in one imaging frame is divided into eight exposure period segments, for example. The respective exposure period segments are uniform.

The respective AD converters 13 may be substituted for the random signal generation and output circuits. More specifically, control logic units of the AD converters 13 may generate random signals for randomly operating the AD converters. Alternatively, various transistors included in the respective imaging elements may be substituted for the random signal generation and output circuits. More specifically, random signals for randomly operating the AD converters 13 may be generated on the basis of noise produced from the respective transistors included in the imaging elements. These configurations are applicable to the embodiments described below.

Figure 2A:
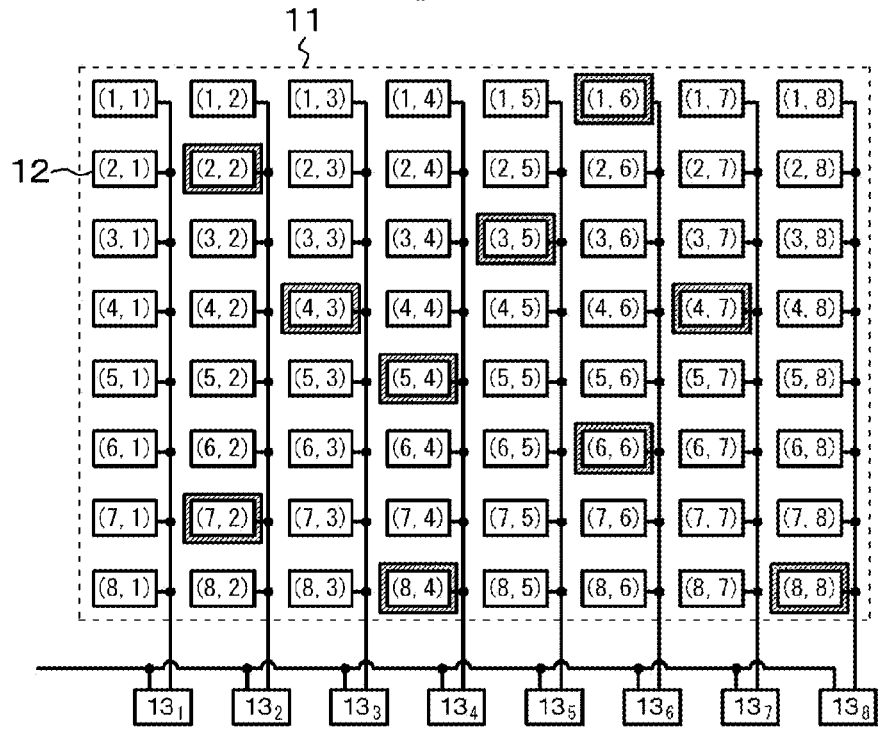
FIGS. 2A and 2B are views each of which schematically illustrates an operating state of analog-digital converters included in one imaging element unit of the imaging device in first and second exposure period segments according to the first embodiment.

As illustrated in FIG. 2A, in the first exposure period segment, the AD converter $13_6$ is operated (brought into on-state) by the pixel signal reading device 16 for the imaging elements 12 (1, 1), 12 (1, 2) and up to 12 (1, 8) located on the first row of the imaging element unit $11_{i,j}$, while the remaining AD converters 13 are not operated (brought into off-state or remain standby state). The same is applicable to following cases. As described above, the AD converter 13 are randomly operated. The same is applicable to following cases. Thereafter, a pixel signal of the imaging element 12 (1, 6) is read. After reading, the AD converter 13 is brought into the off-state or standby state. The same is applicable to following cases. Subsequently, the AD converter $13_2$ is operated by the pixel signal reading device 16 for the imaging elements 12 (2, 1), 12 (2, 2) and up to 12 (2, 8) located on the second row of the imaging element unit $11_{i,j}$. In this case, a pixel signal of the imaging element 12 (2, 2) is read. Subsequently, the AD converter $13_5$ is operated by the pixel signal reading device 16 for the imaging elements 12 (3, 1), 12 (3, 2) and up to 12 (3, 8) located on the third row of the imaging element unit $11_{i,j}$. In this case, a pixel signal of the imaging element 12 (3, 5) is read. Subsequently, the AD converter $13_3$ and the AD converter $13_7$ are operated by the pixel signal reading device 16 for the imaging elements 12 (4, 1), 12 (4, 2) and up to 12 (4, 8) located on the fourth row of the imaging element unit $11_{i,j}$. In this case, pixel signals of the imaging element 12 (4, 3) and the imaging element 12 (4, 7) are read. Subsequently, the AD converter $13_4$ is operated by the pixel signal reading device 16 for the imaging elements 12 (5, 1), 12 (5, 2) and up to 12 (5, 8) located on the fifth row of the imaging element unit $11_{i,j}$. In this case, a pixel signal of the imaging element 12 (5, 4) is read. Subsequently, the AD converter $13_6$ is operated by the pixel signal reading device 16 for the imaging elements 12 (6, 1), 12 (6, 2) and up to 12 (6, 8) located on the sixth row of the imaging element unit $11_{i,j}$. In this case, a pixel signal of the imaging element 12 (6, 6) is read. Subsequently, the AD converter $13_2$ is operated by the pixel signal reading device 16 for the imaging elements 12 (7, 1), 12 (7, 2) and up to 12 (7, 8) located on the seventh row of the imaging element unit $11_{i,j}$. In this case, a pixel signal of the imaging element 12 (7, 2) is read. Subsequently, the AD converter $13_4$ and the AD converter $13_8$ are operated by the pixel signal reading device 16 for the imaging elements 12 (8, 1), 12 (8, 2) and up to 12 (8, 8) located on the eighth row of the imaging element unit $11_{i,j}$. In this case, pixel signals of the imaging element 12 (8, 4) and the imaging element 12 (8, 8) are read. Pixel signal reading for the 64 imaging elements 12 in the first exposure period segment is thus completed.

Thereafter, in the second exposure period segment, the AD converter $13_4$ and the AD converter $13_6$ are operated by the pixel signal reading device 16 for the imaging elements 12 (1, 1), 12 (1, 2) and up to 12 (1, 8) located on the first row of the imaging element unit $11_{i,j}$. In this case, pixel signals of the imaging element 12 (1, 4) and the imaging element 12 (1, 6) are read. Subsequently, none of the AD converters 13 is operated by the pixel signal reading device 16 for the imaging elements 12 (2, 1), 12 (2, 2) and up to 12 (2, 8) located on the second row of the imaging element unit $11_{i,j}$. Subsequently, none of the AD converters 13 is operated by the pixel signal reading device 16 for the imaging elements 12 (3, 1), 12 (3, 2) and up to 12 (3, 8) located on the third row of the imaging element unit $11_{i,j}$. Subsequently, the AD converter $13_5$ is operated by the pixel signal reading device 16 for the imaging elements 12 (4, 1), 12 (4, 2) and up to 12 (4, 8) located on the fourth row of the imaging element unit $11_{i,j}$. In this case, a pixel signal of the imaging element 12 (4, 5) is read. Subsequently, the AD converter $13_2$ and the AD converter $13_4$ are operated by the pixel signal reading device 16 for the imaging elements 12 (5, 1), 12 (5, 2) and up to 12 (5, 8) located on the fifth row of the imaging element unit $11_{i,j}$. In this case, pixel signals of the imaging element 12 (5, 2) and the imaging element 12 (5, 4) are read. Subsequently, none of the AD converters 13 are operated by the pixel signal reading device 16 for the imaging elements 12 (6, 1), 12 (6, 2) and up to 12 (6, 8) located on the sixth row of the imaging element unit $11_{i,j}$. Subsequently, the AD converter $13_2$ and the AD converter $13_7$ are operated by the pixel signal reading device 16 for the imaging elements 12 (7, 1), 12 (7, 2) and up to 12 (7, 8) located on the seventh row of the imaging element unit $11_{i,j}$. In this case, pixel signals of the imaging element 12 (7, 2) and the imaging element 12 (7, 7) are read. Subsequently, the AD converter $13_1$ is operated by the pixel signal reading device 16 for the imaging elements 12 (8, 1), 12 (8, 2) and up to 12 (8, 8) located on the eighth row of the imaging element unit $11_{i,j}$. In this case, a pixel signal of the imaging element 12 (8, 1) is read. Pixel signal reading for the 64 imaging elements 12 in the second exposure period segment is thus completed.

Pixel signal reading for the imaging elements 12 based on random operation of the AD converters 13 is sequentially performed for the third exposure period segment through the eighth exposure period segment. These pixel signals have spatial randomness. More specifically, pixel signal reading for the respective imaging elements 12 is spatially performed (or, in one imaging frame, imaging elements arranged in the first direction and the second direction are selected from the first exposure period segment to the eighth exposure period segment, i.e., for the eight exposure period segments in total) at random. As a result, pixel signals are obtained from the 8×8 imaging elements 12 in the eight exposure period segments. Moreover, only a part of the AD converters 13 are operated, wherefore power consumption of the entire AD converters decreases. Furthermore, when a plurality of exposure period segments are given as in this embodiment, the imaging elements are difficult to reach a saturation charge amount. Accordingly, a dynamic range is expandable.

Figure 2B:
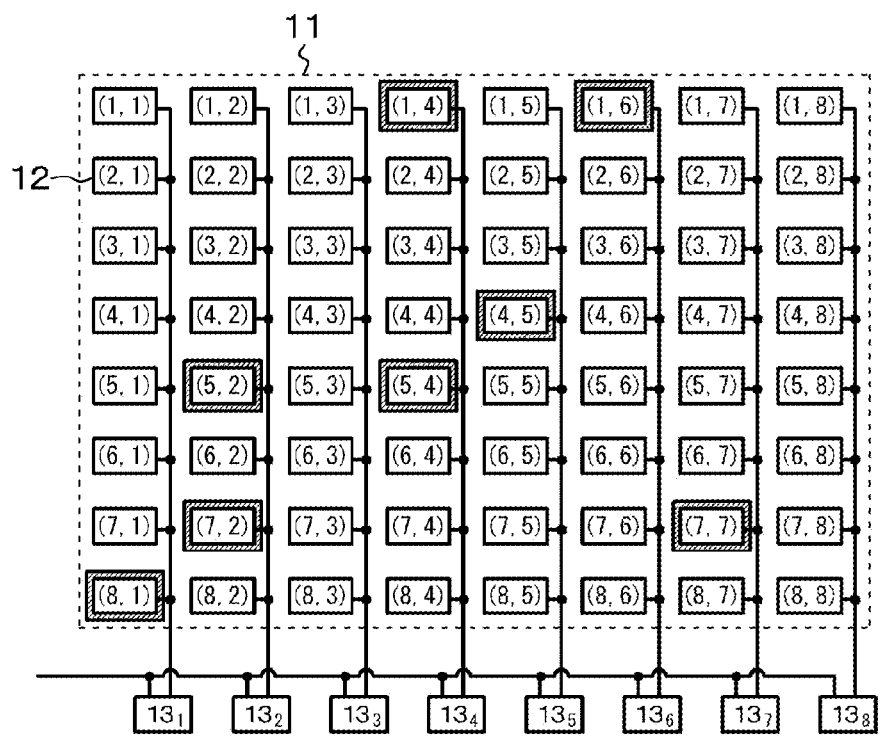

Note that each of the pixel signals converted into digital signals by the respective AD converters $13_1$, $13_2$, and up to $13_8$ is temporarily stored in memories $17_1$, $17_2$, and up to $17_8$. More specifically, each of eight pixel signals received from the imaging elements 12 arranged in the second direction (pixel signals in the first exposure period segment through the eighth exposure period segment) is added to the corresponding one of the eight memories $17_1$, $17_2$, and up to $17_8$, and stored in the corresponding memory. Furthermore, finally, the pixel signals stored in the eight memories $17_1$, $17_2$, and up to $17_8$ are output as image data to a pixel signal addition circuit 18 included in the imaging device. Note that the pixel signal addition circuit 18 is contained in a horizontal transfer circuit 33 described below. In this mode, pixel signals of the 64 imaging elements 12 are stored in the eight memories prior to output to the pixel signal addition circuit 18, wherefore a compression rate of images becomes (⅛). The compression rate of images is determined by an addition manner of pixel signals from the first exposure period segment to the eighth exposure period segment. For example, when pixel signals converted into digital signals by the respective AD converters $13_1$, $13_2$, and up to $13_8$ are stored in the four memories 17 and output to the pixel signal addition circuit 18 as image data, the compression rate of images becomes (1/16). When pixel signals are stored in the sixteen memories 17 and output to the pixel signal addition circuit 18 as image data, the compression rate of images becomes (¼). Note that FIGS. 2A and 2B do not show the memories 17, the pixel signal addition circuit 18, and a frame memory 19 described below.

Figure 3:
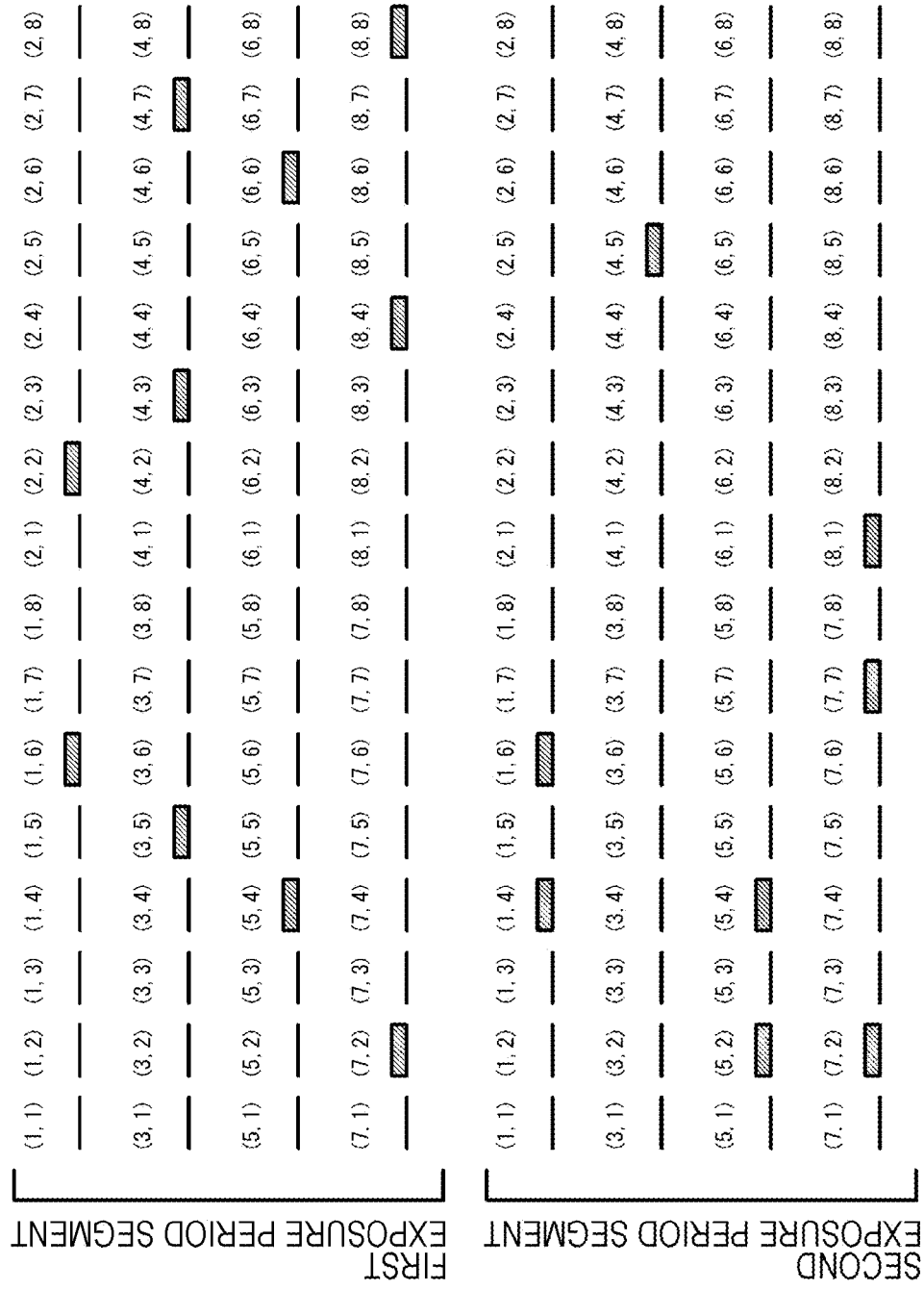
FIG. 3 is a view schematically illustrating a state of pixel signals output to the outside via the analog-digital converters included in the imaging element unit according to the first embodiment.

FIG. 3 schematically illustrates a state of pixel signals temporarily stored in the memories $17_1$, $17_2$, and up to $17_8$ via the AD converters 13 in the imaging element unit $11_{i,j}$ described above. Note that, in FIG. 3, (1, 1) represents the imaging element 12 (1, 1). A thin line segment represents a state that a pixel signal is not being read in a pixel signal reading state of the imaging element (or time length for which imaging element should be operated in one exposure period segment). A bold line segment (such as bold line segment under imaging element 12 (1, 6)) represents a state that a pixel signal is being read in a pixel signal reading state of the imaging element.

Thereafter, pixel signals of the imaging elements output from the AD converters 13 ($13_1$, $13_2$, and up to $13_8$) are sequentially input to the pixel signal addition circuit 18. A plurality of arbitrary pixel signals are added at the pixel signal addition circuit 18. More specifically, image data output from the memories $17_1$, $17_2$, and up to $17_8$ to the pixel signal addition circuit 18 is randomly rearranged within the frame memory 19 included in the pixel signal addition circuit 18. Thereafter, image data stored in an adjacent memory in the frame memory 19 is added to the rearranged data, for example, and output to the outside. Pixel signals of the imaging elements 12 received from the analog-digital converters 13 ($13_1$, $13_2$, and up to $13_8$) are randomly output in this manner. In this case, the compression rate (⅛) of images prior to output to the pixel signal addition circuit 18 finally becomes (1/16) at the time of output from the pixel signal addition circuit 18.

Incidentally, images formed by the imaging device are generally compressed for communication to reduce power consumption during communication. Several proposals have been presented as image compression signal processing. For example, Japanese Patent Application Laid-Open No. 2003-234967 proposes a technology for compressing images by discrete cosine transform of signals output from analog-digital converters (AD converters). However, discrete cosine transform for compression causes a problem of deterioration of image quality at the time of restoration of images. In addition, wavelet transform proposed in Japanese Patent Application Laid-Open No. 2006-025270 may deteriorate image quality at the time of restoration of images, and further causes a problem of increase in an area of an image compression circuit portion, and a problem of increase in power consumption.

A typical image compression technology uses discrete cosine transform (DCT). This DCT technology achieving high compression efficiency has been used for long, and therefore constitutes a main stream of current image encoding technologies. However, the DCT technology divides images into arbitrary transform blocks, and performs processes such as quantizing and encoding for each block. In this case, block distortion or noise such as mosquito noise is mixed into restored images, in which condition image quality deteriorates. Under these circumstances, filter bank encoding is currently attracting attention as an encoding system not easily causing mixture of these noise. Examples of filter bank encoding include sub-band encoding and wavelet transform encoding. Sub-band encoding is a method which limits a band of signals by using a low-pass filter and a high-pass filter to further filter the entire output signals. Wavelet transform encoding is a method which limits a band of signals by using a low-pass filter and a high-pass filter to filter only a low-frequency band containing a large volume of information in a layered manner. These encoding methods are realized by utilizing technologies such as filter bank and decimation interpolation. Examples of international standards adopting wavelet transform encoding include JPEG2000 and Motion-JPEG2000. These standards achieve high compression performance by adopting wavelet transform for transform encoding. The foregoing international standards use DCT technology or wavelet transform for transform encoding. These transforms are called orthogonal transforms on the basis of the point that coordinate systems before transform and after transform cross each other at right angles. Images compressed by the orthogonal transforms are transmitted and accumulated at a low bit rate.

In addition, with increase in the screen size of a display device such as a liquid display device and a plasma display device, there have been pointed out various problems produced at the time of reuse of accumulated image data. A compression rate is a top priority issue to be considered at the time of image compression. Various studies conducted for improvement of compression efficiency have revealed that a compression rate of filter bank encoding is higher than a compression rate of DCT technology. However, filter bank encoding technology is generally inferior to DCT technology in view of processing speed.

Incidentally, both DCT technology and wavelet transform use an orthogonal basis, wherefore image quality at the time of image restoration deteriorates. An imaging device performing wavelet transform or discrete cosine transform compresses data after analog-digital (AD) conversion by using a processing circuit for wavelet transform discrete cosine transform to compress data by utilizing these transform technologies.

According to the first embodiment which reads pixel signals from imaging elements spatially at random realizes the data compression technology described in Non-Patent Document 1 without using a multiplexer, and also solves problems such as deterioration of image quality at the time of compression image restoration by data reading and imaging element selection described above, and further by addition of image data, and random sampling based on randomness of incident light or the like achieved by a light control device described above. In this case, compressive sensing handles moving images as three-dimensional data, compresses the moving images by using random sampling and signal processing, reduces output data received from imaging elements, and restores the moving images outside by using a basis obtained from a dictionary. More specifically, there holds a relationship $^{M}I = {}^{M}S{}^{M}E$ wherein: matrix "$^{M}I$" represents an obtained pixel signal; matrix "$^{M}S$" represents a shutter function (corresponding to signal for randomly operating AD converter) for each pixel; and matrix "$^{M}E$" represents a space-time volume. Note that a superscript "M" indicates that a following alphabet represents a matrix (or vector). In this case, the matrix "$^{M}I$" is a known matrix indicating an obtained pixel signal, while the matrix "$^{M}E$" is an unknown matrix. Moreover, there holds transform $^{M}E = {}^{M}D{}^{M}\alpha$ wherein: "$^{M}D$" represents a dictionary for obtaining an optimal basis; and "$^M\alpha$" represents a basis (space vector) obtained by using the dictionary. Accordingly, "$^M\alpha$" is obtained by using $^M I = {}^M S {}^M D {}^M \alpha$ on the basis of Non-Patent Document 1, whereby "$^M E$" is obtained and image reproduction is realizable. Image reproduction is conducted outside (out of chip).

When a process for obtaining the shutter function $^M S$ is performed by using ordinary imaging elements which execute reading in the order of the imaging elements, data is read in the order of arrangement of the imaging elements. For realizing random reading, following points are considered as necessary: (1) a rearrangement process is performed outside the imaging elements after random reading of image data (more specifically, image data rearrangement process is performed by using a frame memory or the like); or (2) a capacity for data retention is provided for each imaging element. Either one of the points (1) and (2) is required. However, the imaging device according to the present disclosure includes imaging elements provided with the light control devices. Accordingly, these points are not required.

Note that one imaging frame is handled as a plurality of divisional imaging frames (eight imaging frames in the first embodiment) by dividing an exposure period of each imaging element into two or more exposure period segments in one imaging frame (more specifically, dividing exposure period of each imaging element into eight exposure period segments in one imaging frame in the first embodiment), performing random exposure such that at least one imaging element is exposed in each exposure period segment, and performing signal processing for read pixel signals. Accordingly, the imaging frame rate increases by eight times higher, for example, without increasing a driving frequency of the imaging elements. In other words, a high frame rate is realizable. This operation mode switching is achievable on the basis of operation of a selector switch by a user of the imaging device, for example. The same is applicable to respective embodiments described below.

As described above, according to the first embodiment, by the pixel signal reading device, the imaging elements outputting pixel signals to the AD converters are selected spatially at random, and pixel signals of the imaging elements are output at random from the AD converters. In this case, not the whole AD converters provided on the imaging device, but only a part of the AD converters are operated, wherefore power consumption of the imaging device decreases. Moreover, pixel signals of the imaging elements are randomly output from the AD converters, wherefore data decreases to a volume smaller than the volume of all read pixels (all imaging elements). Furthermore, a signal processing technology not requiring a processing circuit for data compression after AD conversion is adoptable. Furthermore, the necessity of a multiplexer is eliminated, wherefore simplification of a circuit configuration, and further reduction of power consumption of the entire imaging device are achievable.

According to the first embodiment, image data output from the imaging device decreases. As described above, it is essential to decrease image data to avoid a load imposed on communication for distribution of images at the time of utilization of a cloud. Compressive sensing allows compression of image data to a volume considering a communication load, and distribution of images after data compression. A system including a device for monitoring a communication volume is allowed to determine timing for uploading images on the basis of a monitored communication volume, or compress images at an optimal compression rate for communication traffic at the corresponding timing for uploading images, for example. Furthermore, a memory, a hard disk, a small-scale data center or the like may be disposed between a cloud and a consumer product such as a camera and a camcorder including the imaging device of the present disclosure to primarily store image data and upload the image data to the cloud. The image data stored in the memory, hard disk, or small-scale data center disposed between the consumer product and the cloud is image data determined as requiring uploading after determination of a state of communication traffic or selection of images. This determination or selection is performed by using a sorting engine or a recognition engine. Accordingly, the sorting engine or recognition engine may be disposed at an arbitrary position such as a logic portion of the imaging device, the consumer product such as a camera and a camcorder including the imaging device, the memory or hard disk, and the small-scale data center. Furthermore, a basis necessary for restoration of compressed image data may be disposed in the memory, hard disk, or small-scale data center to temporarily restore image data.

Second Embodiment

Figure 4:
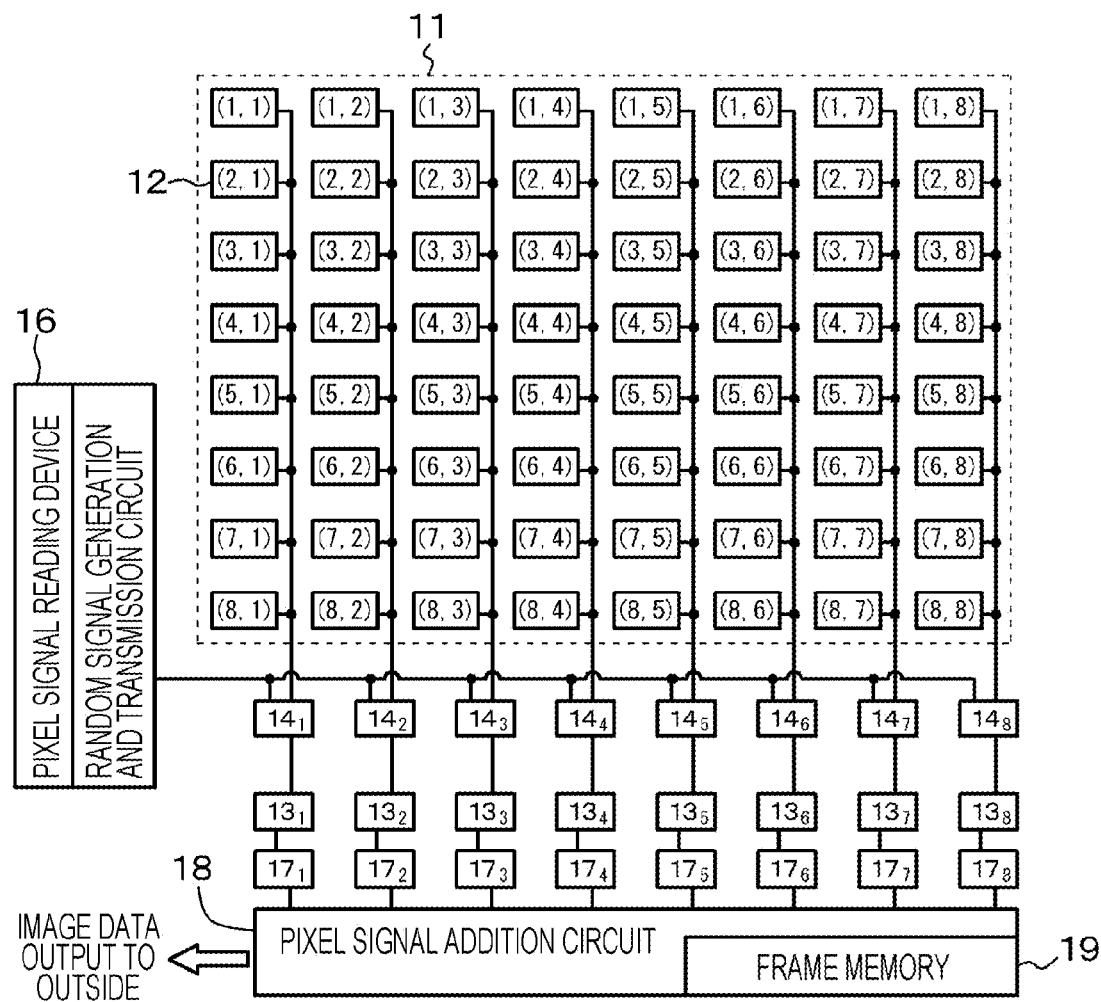
FIG. 4 is a conceptual view of an imaging element unit of an imaging device according to a second embodiment.

A second embodiment is a modification of the first embodiment. According to the imaging device or the pixel signal reading method of the first embodiment, the AD converters 13 are directly turned on or off by using the pixel signal reading device 16. According to the second embodiment, however, switching elements 14 ($14_1$, $14_2$, and up to $14_8$) constituted by field effect transistors (FETs) are disposed between the AD converters 13 ($13_1$, $13_2$, and up to $13_8$) and the imaging elements 12 as illustrated in a conceptual view of the one imaging element unit in FIG. 4. In this case, the switching elements 14 are randomly operated by the pixel signal reading device 16 to randomly switch between two systems, i.e., a system for inputting pixel signals from the imaging elements 12 to the AD converters 13, and a system for inputting pixel signals corresponding to a black level from the pixie signal reading device 16 to the AD converters 13.

An imaging device and a pixel signal reading method according to the second embodiment are similar to the imaging device and the pixel signal reading method of the first embodiment except for the foregoing points. Accordingly, detailed description is not repeated herein.

According to the second embodiment, the AD converters to which pixel signals are input are only a part of all the AD converters. Pixel signals corresponding to the black level are input to the AD converters to which pixel signals are not input. Accordingly, power consumption decreases by an amount of power consumption of the AD converters to which pixel signals are not input, wherefore reduction of power consumption of the entire AD converters is achievable.

Third Embodiment

Figure 5:
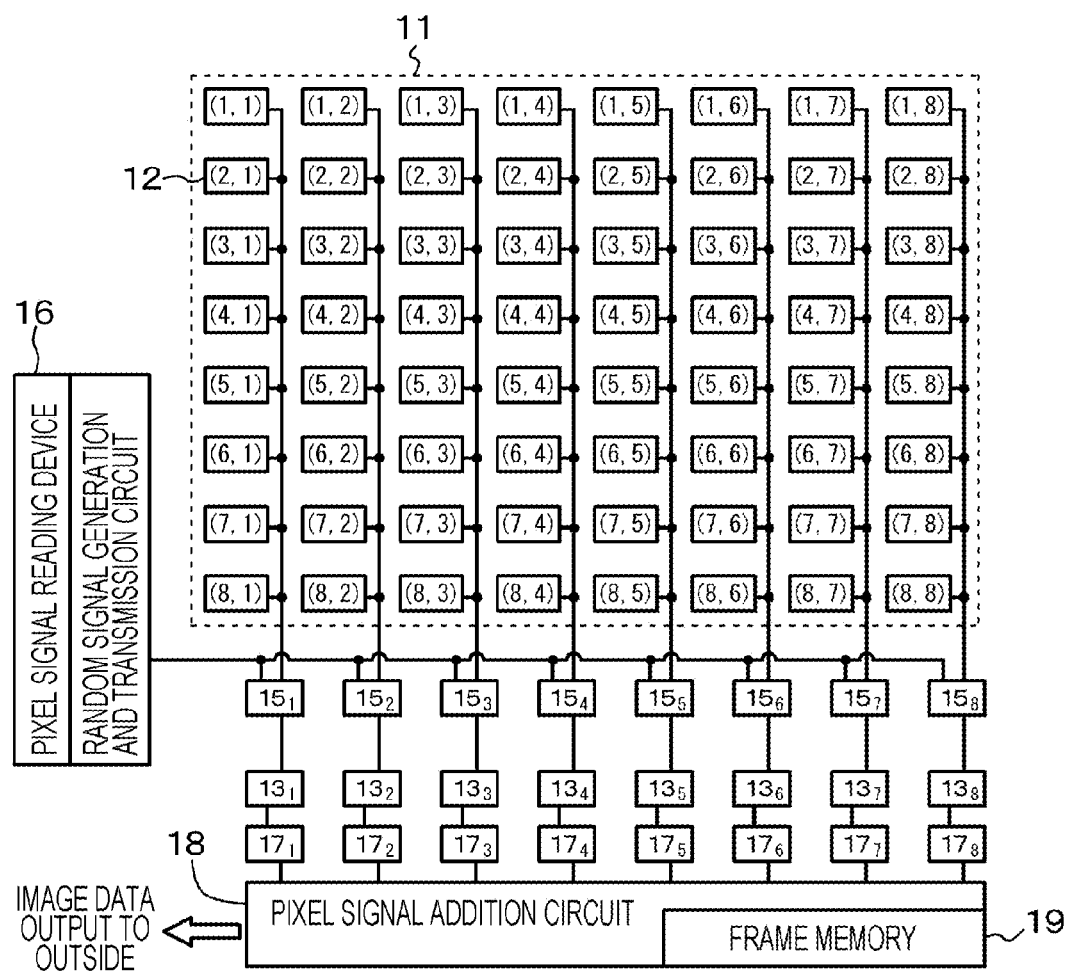
FIG. 5 is a conceptual view of an imaging element unit of an imaging device according to a third embodiment.

A third embodiment is also a modification of the first embodiment. FIG. 5 illustrates a conceptual view of one imaging element unit and the like included in an imaging device according to the third embodiment.

The imaging device according to the third embodiment includes: imaging elements 12 arranged in two-dimensional matrix in the first direction and the second direction; reading amplifiers 15 ($15_1$, $15_2$, and up to $15_8$); and the pixel signal reading device 16. The reading amplifiers 15 ($15_1$, $15_2$, and up to $15_8$) are randomly operated by the pixel signal reading device 16 to select the imaging element 12 outputting a pixel signal to the AD converters $13_1$, $13_2$, and up to $13_8$ spatially at random.

According to the third embodiment, pixel signals are transmitted to the AD converters 13 when the reading amplifiers (reading circuits) 15 are in an operating state (ON state). On the other hand, pixel signals are not transmitted to the AD converters 13 when the reading amplifiers 15 are in a non-operating state (OFF state). In this case, power consumption of the AD converters decreases, wherefore reduction of power consumption of the entire AD converters is achievable.

An imaging device and a pixel signal reading method according to the third embodiment are basically similar to the imaging device and the pixel signal reading method of the first embodiment except for the foregoing points. Accordingly, detailed description is not repeated herein. As described above, the reading amplifiers are randomly operated by the pixel signal reading device to select the imaging element outputting a pixel signal to the AD converters spatially at random according to the third embodiment. In this case, not the whole reading amplifiers provided on the imaging device, but only a part of the reading amplifiers are operated, wherefore reduction of power consumption of the imaging device is achievable. Moreover, in the state that pixel signals of the imaging elements to be read are selected spatially at random, the obtained data volume decreases in comparison with the data volume of all the read pixels (all imaging elements). Furthermore, the necessity of a multiplexer is eliminated, wherefore simplification of a circuit configuration, and further reduction of power consumption of the entire imaging device are achievable.

Fourth Embodiment

A fourth embodiment is a modification of the third embodiment. According to the imaging device or the pixel signal reading method of the third embodiment, the reading amplifiers 15 are directly turned on or off by the pixel signal reading device 16. According to the fourth embodiment, however, the switching elements 14 (14₁, 14₂, and up to 14₈) constituted by field effect transistors (FETs) are disposed between the reading amplifiers 15 (15₁, 15₂, and up to 15₈) and the imaging elements 12 as illustrated in a conceptual view of the one imaging element unit in FIG. 6. In this case, the switching elements 14 are randomly operated by the pixie signal reading device 16 to randomly switch between two systems, i.e., a system for inputting pixel signals from the imaging elements 12 to the AD converters 13, and a system for inputting pixel signals corresponding to a black level from the pixie signal reading device 16 into the reading amplifiers 15.

An imaging device and a pixel signal reading method according to the fourth embodiment are similar to the imaging device and the pixel signal reading method of the third embodiment except for the foregoing points. Accordingly, detailed description is not repeated herein.

According to the fourth embodiment, the AD converters to which pixel signals are input are only a part of all the AD converters. Pixel signals corresponding to the black level are input to the AD converters to which pixel signals are not input. Accordingly, power consumption of the AD converters decreases by an amount of power consumption of the AD converters to which pixel signals are not input, wherefore reduction of power consumption of the entire AD converters is achievable.

Note that B mode of the present disclosure may be adopted as modified examples of the first through fourth embodiments, instead of A mode of the present disclosure adopted in the first through fourth embodiments. More specifically, the K imaging elements 12 arranged in the first direction, and the L imaging elements 12 arranged in the second direction constitute the K×L imaging elements 12 in total. The one AD converter 13 or the reading amplifier 15 is provided for a group of the imaging elements constituted by the L imaging elements 12 arranged in the second direction. The AD converter 13, the reading amplifier 15, or the switching element 14 is randomly operated by the pixel signal reading device 16 to randomly select the fewer imaging element 12 than the K imaging elements 12 from the K imaging elements 12 arranged in the first direction, and read a pixel signal from the selected imaging element 12.

Alternatively, C mode of the present disclosure may be adopted. More specifically, the K imaging elements 12 arranged in the first direction, and the L imaging elements 12 arranged in the second direction constitute the K×L imaging elements 12 in total. The one AD converter 13 or the reading amplifier 15 is provided for the one imaging element 12. The AD converter 13, the reading amplifier 15, or the switching element 14 is randomly operated by the pixel signal reading device 16 to randomly select the fewer imaging element 12 than the K×L imaging elements 12 from the K×L imaging elements 12, and read a pixel signal from the selected imaging element 12.

Note that the time length of the exposure period segment in one imaging frame may be varied by disposing the one AD converter 13 or the one reading amplifier 15 for each of the imaging elements 12, and setting reset timing and reading timing for each the imaging elements. Furthermore, this configuration allows the respective imaging elements to perform the same operation and processing performed by a configuration including light control devices of imaging elements according to the eighth embodiment described below.

Fifth Embodiment

A fifth embodiment is a modification of the first through fourth embodiments described above. An imaging device according to the fifth embodiment further includes a movement detection circuit for detecting movement of a subject. In this case, a pixel signal reading device changes a state for randomly operating analog-digital converters or reading amplifiers on the basis of the presence or absence of movement of the subject detected by the movement detection circuit. More specifically, when movement of the subject is detected by the movement detection circuit, an appropriate state is selected from a state for operating all the analog-digital converters or reading amplifiers, a state for omitting an image compression process, or a state for decreasing an image compression rate.

The movement detection circuit herein may include high-frequency detection filters $HPF_1$ and $HPF_2$ for movement detection. In this case, a high frequency is detected by a known method utilizing Fourier transform, wavelet (weblet) transform, discrete cosine transform or the like. In addition, movement detection is executed for a high frequency around a sampling frequency detected by Fourier transform, wavelet transform, discrete cosine transform or the like on the basis of a threshold corresponding to a predetermined frequency by using a known method.

More specifically, similarly to the first through fourth embodiments, the AD converters 13, the reading amplifiers 15, or the switching elements 14 are randomly operated by the pixel signal reading device 16 in the fifth embodiment to read pixel signals from the imaging elements 12 spatially at random. Obtained pixel signals are temporarily stored in an image memory in an order corresponding to the original pixel arrangement. Furthermore, after an elapse of a predetermined exposure period, pixel signals of all the imaging elements are stored in the image memory, and formed into image data. The movement detection circuit determines the presence or absence of movement within input images (movement of subject) on the basis of input of the image data read in the predetermined exposure period. A result of determination is transmitted to the pixel signal reading device 16. The pixel signal reading device 16 controls the operation of the AD converters 13 or the reading amplifiers 15 on the basis of the result of movement determination.

Figure 7A:
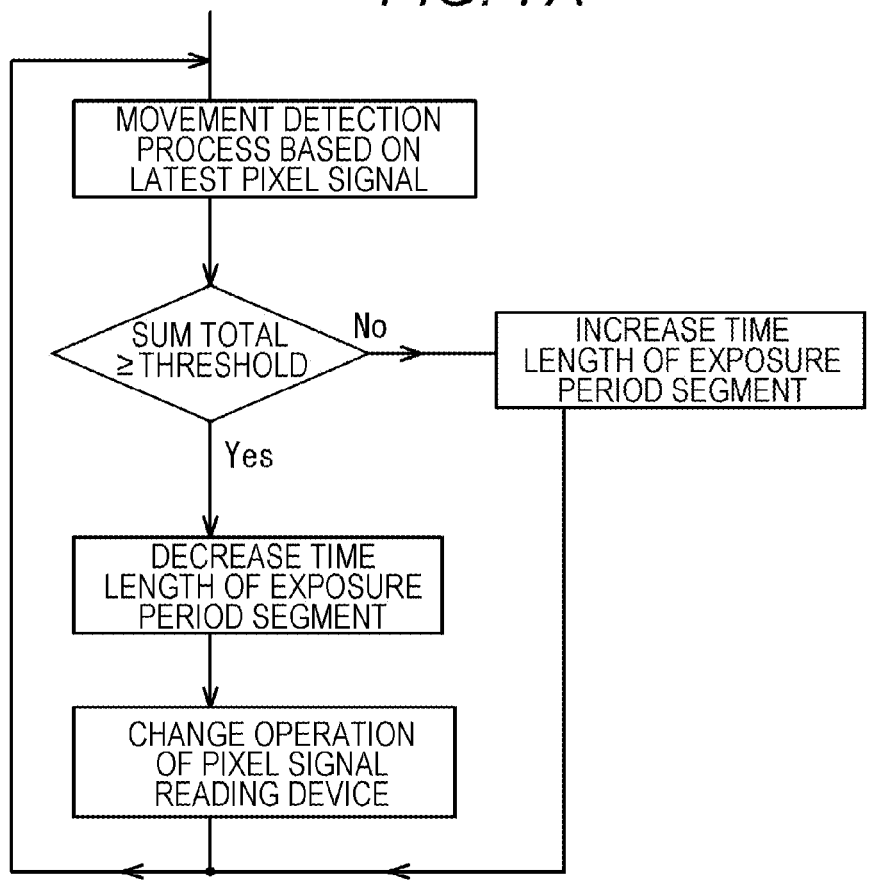
FIGS. 7A and 7B are a flowchart of an example of an operation of a movement detection circuit of an imaging device, and a block diagram illustrating a configuration of the movement detection circuit, respectively, according to a fifth embodiment.
Figure 7B:
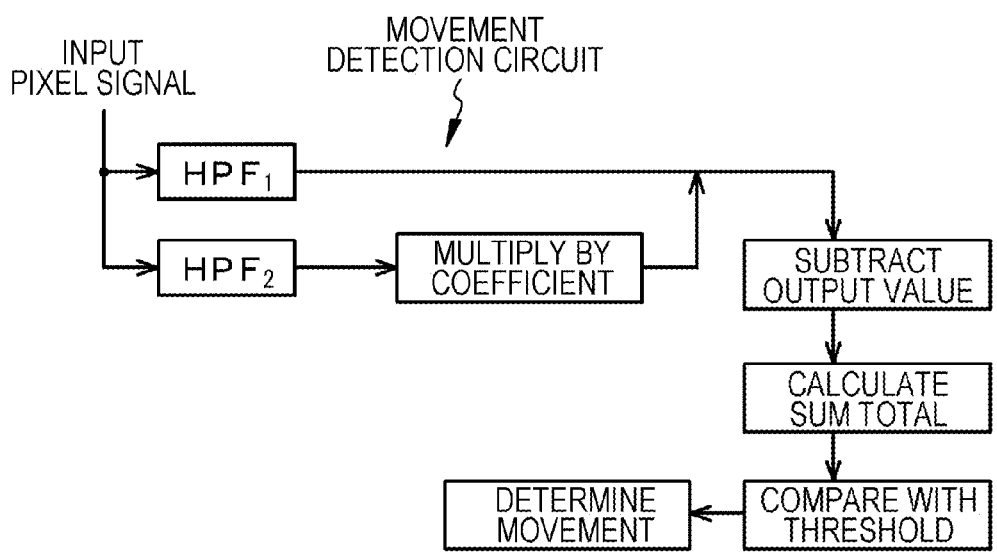

FIG. 7A is a flowchart showing an example of an operation of the movement detection circuit, while FIG. 7B is a block diagram illustrating a configuration of the movement detection circuit. Incidentally, pixel signals are read from the imaging elements 12 spatially at random on the basis of random operation of the AD converters 13, the reading amplifiers 15, or the switching elements 14 by the pixel signal reading device 16. In this case, a correlation between adjoining pixels becomes strong in a state of no movement of the subject, but becomes week in a moving state of the subject. Accordingly, a random-dot image tends to increase as movement of the subject becomes larger. When a band of incident light is sufficiently regulated for a cycle of pixel arrangement in the imaging device, output of a random-dot image is more securely limited to the moving state of the subject. Movement detection according to the fifth embodiment examines a random-dot degree of an image to determine the presence or absence of movement by executing following procedures on the basis of spatially random pixel signal reading performed by the imaging elements 12 according to the first through fourth embodiments described above.

When movement of the subject is not detected, for example, the pixel signal reading device 16 sets a subsequent exposure period of the imaging elements (more specifically, time length of subsequent exposure period segment) to a length larger than the current exposure period (more specifically, time length of current exposure period segment). Alternatively, the pixel signal reading device 16 sets the subsequent exposure period of the imaging elements to a length larger than a preset first threshold of the time length of the exposure period segment. On the other hand, when movement of the subject is detected, the pixel signal reading device 16 sets a subsequent exposure period of the imaging elements (more specifically, time length of subsequent exposure period segment) to a length smaller than the current exposure period (more specifically, time length of current exposure period segment). Alternatively, the pixel signal reading device 16 sets the subsequent exposure period of the imaging elements to a length smaller than a preset second threshold of the time length of the exposure period segment. According to the spatially random pixel signal reading performed by the imaging elements 12, images of still scenes are restored relatively easily from obtained image data, while images of dynamic scenes may become difficult to restore. In this case, difficulty in image restoration is expected to decrease by reducing the exposure period of the imaging elements in a manner described above when movement of the subject is detected. On the other hand, the number of output image data per unit time is expected to decrease by increasing the exposure period when no movement of the subject is detected. Note that only the exposure period is varied without a change of randomness in the foregoing cases.

[Step-A]

More specifically, the high-frequency detection filter $HPF_1$ is initially applied to an input image. In more detail, a spatial high-frequency component is extracted through Fourier transform of the input image by using the high-frequency detection filter. The high-frequency detection filter $HPF_1$ is constituted by a high-frequency detection filter highly reactive to a difference between values of adjoining pixels. Furthermore, the high-frequency detection filter $HPF_2$ is applied to the input image. The high-frequency detection filter $HPF_2$ is constituted by a high-frequency detection filter not reactive to a difference between values of adjoining pixels, but highly reactive to a structure of the subject (components exhibiting low correlation between adjoining pixels such as edge).

[Step-B]

Thereafter, output from the high-frequency detection filter $HPF_2$ is multiplied by a predetermined coefficient for level adjustment.

[Step-C]

Subsequently, the output value of the high-frequency detection filter $HPF_2$ multiplied by the coefficient is subtracted from the output value of the high-frequency detection filter $HPF_1$. As a result, a component originating from the original subject structure is subtracted from the output value of the high-frequency detection filter $HPF_1$ to achieve the greatest possible extraction of random-dot components originating from movement (movement components, high-frequency components originating from movement). Thereafter, the foregoing processes are performed for all the imaging elements to calculate a sum total of all the imaging elements (sum total of high-frequency components originating from movement per imaging frame).

[Step-D]

A determination is made for the calculated sum total on the basis of a predetermined threshold. The sum total obtained in [Step-C] increases as the high-frequency component originating from movement increases. Accordingly, it is determined that movement of the subject has been detected when the sum total is larger than the threshold. On the other hand, it is determined that no movement of the subject has been detected when the sum total does not exceed the threshold.

[Step-E]

When it is determined that movement of the subject has been detected by the movement detection circuit, an appropriate state is selected from the state for operating all the AD converters 13 or reading amplifiers 15, the state for omitting an image compression process, or the state for decreasing an image compression rate in the subsequent imaging frame.

Sixth Embodiment

A sixth embodiment is a modification of the first through fifth embodiments. According to the first through fifth embodiments, the AD converters 13, the reading amplifiers 15, or the switching elements 14 are randomly operated by the pixel signal reading device 16 to read pixel signals from the imaging elements spatially at random. According to the sixth embodiment, the exposure time of respective pixels in the first through fifth embodiments is randomly divided into a plurality of periods. In this case, null points are eliminated from a point spread function (PSF, also called point distribution function). Accordingly, image stabilization (removal of blur) by signal processing based on coded exposure is realizable with higher accuracy.

Seventh Embodiment

According to a seventh embodiment, a high dynamic range synthesis system or an SVE system is applied to pixel signals obtained by the imaging device described in the first through sixth embodiments. More specifically, a pixel signal amount (stored charge amount) of each imaging element is divided by total stored charge time of the corresponding imaging element and standardized to equalize sensitivities of the respective imaging elements and enlarge a dynamic range. In this case, a pixel signal value may be set to "0" for a saturated imaging element or an imaging element causing blocked up shadows. Alternatively, these elements may be interpolated by surrounding imaging elements. With randomness of the original exposure, pixel signals maintain randomness even after substitution of "0" for pixel signals of saturated pixels or pixels of blocked up shadows. Thereafter, signal processing of compressive sensing is further performed for the pixel signals to simultaneously realize image compression and expansion of the dynamic range. Note that the SVE system is applicable even without light control devices.

Eighth Embodiment

The eighth embodiment is a modification of the first through seventh embodiments described above. Various types of light control devices (light control devices of first through fourth configurations) are described in the eighth through twelfth embodiments, while imaging devices according to the first through seventh embodiments which include imaging elements containing light control devices described in the eighth through twelfth embodiments are described in thirteenth through seventeenth embodiments.

Figure 8A:
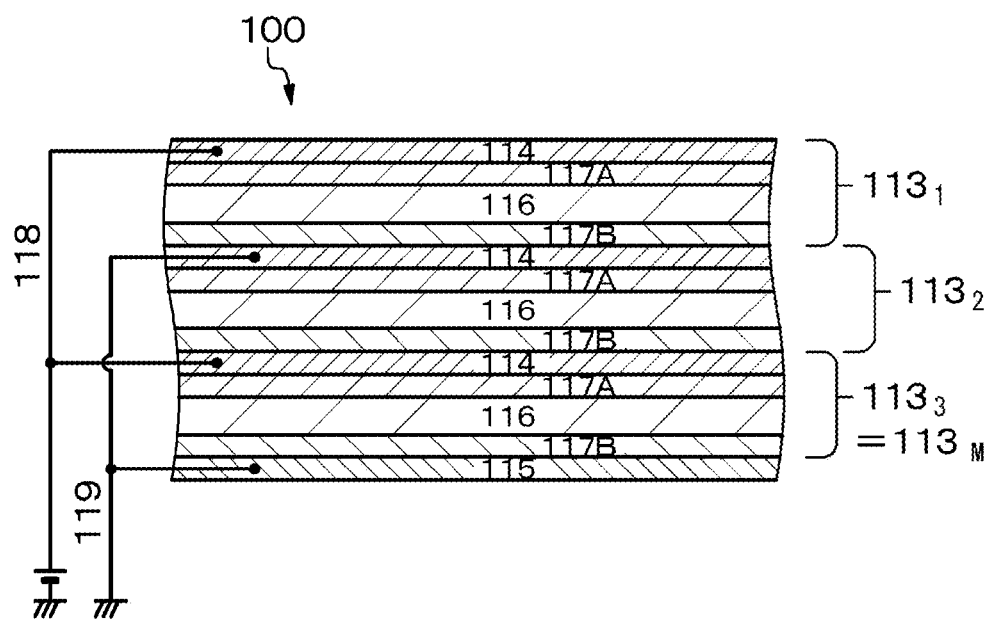
FIGS. 8A and 8B are schematic cross-sectional views of alight control device of an imaging device according to an eighth embodiment.
Figure 8B:
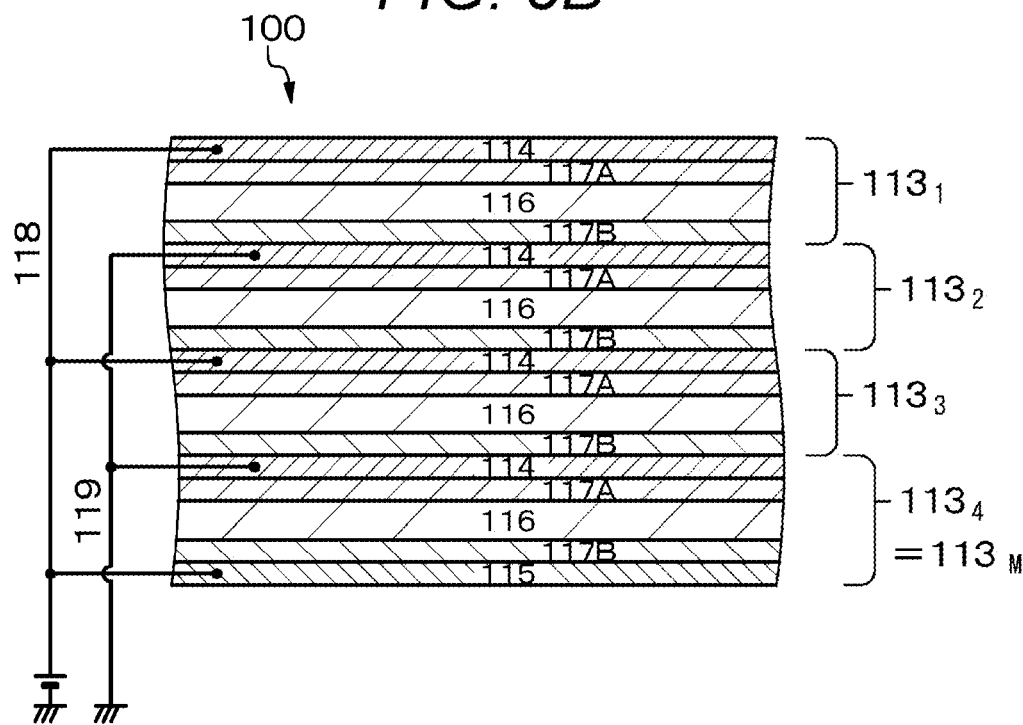

According to the eighth embodiment, each of imaging elements includes a light receiving element (photoelectric conversion element), and a light control device (light control element) disposed on the light entrance side of the light receiving element. In the eight embodiment herein, the light control device (light control element) is a light control device (light control element) of the first configuration. Furthermore, as illustrated in schematic partial cross-sectional views in FIGS. 8A and 8B, a light control device (light control element) 100 according to the eighth embodiment includes a lamination of M (M≥1, M=3 in example of FIG. 8A, and M=4 in example of FIG. 8B) light control layer or layers 113 each of which contains a lamination of a first nano-carbon film 114, a first intermediate layer 117A, a dielectric material layer 116, and a second intermediate layer 117B. A second nano-carbon film 115 is further formed on the second intermediate layer 117B constituting the Mth light control layer $113_M$. In this case, voltage is applied to the first nano-carbon film 114 and the second nano-carbon film 115 under control by the pixel signal reading device 16 to control entrance of light into the imaging element 12.

Furthermore, according to the eighth embodiment, pixel signals are read from the selected imaging elements 12 under control by the pixel signal reading device 16, while light entrance into the imaging elements 12 is started or ended at random in time. Moreover, pulsed voltage is randomly applied to the first nano-carbon film 114 and the second nano-carbon film 115 for the respective imaging elements 12. In this case, an integrated value of application time of the pulsed voltage to the first nano-carbon film 114 and the second nano-carbon film 115 is uniform. More specifically, an effective exposure period segment is defined as a period from a light entrance start to a light entrance end in one exposure period segment. The time length of the effective exposure period segment is uniform. Furthermore, a sum total of time lengths of the effective exposure period segments in one imaging frame is kept uniform herein under control by the pixel signal reading device 16. The same is applicable to the following embodiments.

Note that the second nano-carbon film 115 is disposed below the second intermediate layer 117B constituting the Mth light control layer $113_M$ in a state that the first nano-carbon film 114 is positioned on the upper side and that the second nano-carbon film 115 is positioned on the lower side according to the example illustrated in the figures. In this case, whether the second nano-carbon film 115 is located above or below the second intermediate layer 117B constituting the Mth light control layer $113_M$ is relatively determined and dependent on a positional relationship between the first nano-carbon film 114 and the second nano-carbon film 115. When the first nano-carbon film 114 is positioned above the second nano-carbon film 115 as described above, the second nano-carbon film 115 is located "below" the second intermediate layer 117B constituting the Mth light control layer $113_M$. This configuration is also included in a concept that the second nano-carbon film 115 is provided "above" the second intermediate layer 117B constituting the Mth light control layer $113_M$.

According to the light control device 100 of the eighth embodiment herein, each light transmittance of the light control layers 113 and $113_M$ is controlled by voltage applied to the first nano-carbon film 114 and the second nano-carbon film 115. More specifically, each of the light control layers 113 and $113_M$ is brought into a transparent state for light having a desired wavelength range by applying appropriate voltage to the first nano-carbon film 114 and the second nano-carbon film 115. In addition, when M is an odd number (see FIG. 8A), the odd-numbered first nano-carbon film 114 is connected to common first wiring 118. In this case, the even-numbered first nano-carbon film 114 and second nano-carbon film 115 are connected to common second wiring 119. On the other hand, when M is an even number (see FIG. 8B), the odd-numbered first nano-carbon film 114 and second nano-carbon film 115 are connected to the common first wiring 118. In this case, the even-numbered first nano-carbon film 114 is connected to the common second wiring 119. The first wiring 118 and the second wiring 119 are connected to a not-shown light control device control circuit. For example, a positive potential may be applied to the first wiring 118, while the second wiring 119 may be grounded. Alternatively, the first wiring 118 may be grounded, while a positive potential may be applied to the second wiring 119. Moreover, a negative potential may be applied to the first wiring 118, while the second wiring 119 may be grounded. Alternatively, the first wiring 118 may be grounded, while a negative potential may be applied to the second wiring 119. Furthermore, a positive potential may be applied to the first wiring 118, while a negative potential may be applied to the second wiring 119. Alternatively, a negative potential may be applied to the first wiring 118, while a positive potential may be applied to the second wiring 119. Note that when M is an odd number (see FIG. 8A), the odd-numbered first nano-carbon film 114 may be electrically connected via a first contact hole (not shown), and connected to the common first wiring 118. In this case, the even-numbered first nano-carbon film 114 and second nano-carbon film 115 may be electrically connected via a second contact hole (not shown), and connected to the common second wiring 119. Similarly, when M is an even number (see FIG. 8B), the odd-numbered first nano-carbon film 114 and second nano-carbon film 115 may be electrically connected via the first contact hole (not shown), and connected to the common first wiring 118. In this case, the even-numbered first nano-carbon film 114 may be electrically connected via the second contact hole (not shown), and connected to the common second wiring 119.

Each of the first nano-carbon film 114 and the second nano-carbon film 115 is made of graphene. On the other hand, each of the first intermediate layer 117A and the second intermediate layer 117B is made of titanium dioxide (TiO$_2$), while the dielectric material layer 116 is made of Al$_2$O$_3$, HfO$_2$, ZrO$_2$ or the like. In addition, each of the first wiring 118 and the second wiring 119 is constituted by a nano-carbon film, or a transparent conductive material layer to prevent lowering of light transmittance and effect on visibility caused by the presence of the first wiring, the second wiring, and connection wiring described below. Similar materials may be used to constitute a nano-carbon film, an intermediate layer, a dielectric material layer, first wiring, second wiring, and connection wiring in the respective embodiments described below.

Graphene may be produced by a manufacturing method described hereinbelow, for example. More specifically, a film containing a graphene-producing catalyst is formed on a base. Subsequently, a gas-phase carbon supply source is supplied to the film containing the graphene-producing catalyst, and simultaneously the gas-phase carbon supply source is thermally treated to produce graphene. Thereafter, the graphene is cooled at a predetermined cooling speed to form film-shaped graphene on the film containing the graphene-producing catalyst. Examples of the graphene producing-catalyst include carbon compounds such as SiC, or at least one type of metal selected from Ni, Co, Fe, Pt, Au, Al, Cr, Cu, Mg, Mn, Mo, Rh, Si, Ta, Ti, W, U, V, and Zr. On the other hand, examples of the gas-phase carbon supply source include at least one type of carbon source selected from carbon monoxide, methane, ethane, ethylene, ethanol, acetylene, propane, butane, butadiene, pentane, pentene, cyclopentadiene, hexane, cyclohexane, benzene, and toluene. Furthermore, the film-shaped graphene thus formed is separated from the film containing the graphene-producing catalyst to obtain graphene.

More specifically, for manufacturing the light control device of the eighth embodiment, rolled copper foil having a thickness of 35 μm is heated to 1,000° C. in a hydrogen atmosphere (hydrogen flow rate: 20 sccm) within an electric furnace, for example. Methane gas is supplied at a flow rate of 30 sccm for 30 minutes to form the first nano-carbon film 114 made of graphene on the copper foil. Subsequently, the first intermediate layer 117A, the dielectric material layer 116, and the second intermediate layer 117B are sequentially formed on the graphene. As a result, a first light control layer is formed. On the other hand, the first nano-carbon film 114 made of graphene, the first intermediate layer 117A, the dielectric material layer 116, and the second intermediate layer 117B are sequentially formed on the copper foil to produce a second light control layer. Thereafter, a polymethyl methacrylate (PMMA) acetone-diluted solution is applied to an upper part of the second intermediate layer 117B by spin coating and then the solution is dried to form a PMMA film. Subsequently, the copper foil on the second light control layer is removed by using an iron nitrate solution. The first nano-carbon film 114 constituting the second light control layer affixed to the PMMA film is transferred to the second intermediate layer 117B constituting the first light control layer. Thereafter, the PMMA film is removed by using an acetone solvent. As a result, a layered structure containing a lamination of two light control layers is obtained. Furthermore, after the layered structure containing a desired number of layers (M layers) is produced, the second nano-carbon film 115 is affixed to an upper part of the second intermediate layer constituting the Mth light control layer by a method similar to the foregoing method. Finally, the copper foil is removed from the layered structure thus obtained, whereafter abase on which imaging elements are formed beforehand is affixed. According to the film forming steps described above, the first nano-carbon film 114 may be affixed to a transparent substrate before the first intermediate layer 117A, the dielectric material layer 116, and the second intermediate layer 117B are sequentially formed on the first nano-carbon film 114. The respective film forming steps may be executed by using a method which successively forms films by a roll-to-roll system, or a method which successively forms graphene films by locally heating electrodes, for example.

As described above with reference to FIGS. 39A, 39B, 39C, and 39D, the Fermi level $E_f$ shifts in accordance with a change of voltage applied between the first wiring 118 and the second wiring 119. Accordingly, light transmittance for light having a desired wavelength (frequency) is variable (controllable). Alternatively, the Fermi level $E_f$ shifts by a doping process performed for the first nano-carbon film 114 and the second nano-carbon film 115. Accordingly, light transmittance for light having a desired wavelength (frequency) is variable (controllable).

Furthermore, an amount of carriers doped with graphene increases when the dielectric material layer constituting the light control layer is made of dielectric material having a high dielectric constant. In this case, charge amounts retained in the first nano-carbon film 114 and the second nano-carbon film 115 increase. In this case, as a result, light transmittance for light having a desired wavelength (frequency) is variable (controllable).

Discussed hereinbelow is an example which expands a light transmissible wavelength range by using Al$_2$O$_3$ (dielectric constant=8.2), and IGZO (dielectric constant=9) having different dielectric constants to constitute the dielectric material layer.

Figure 37:
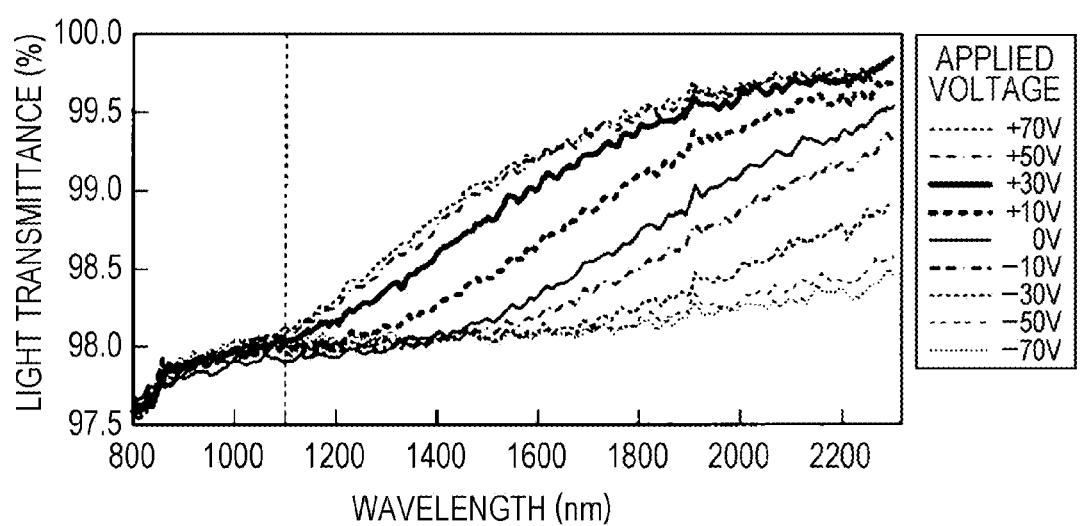
FIG. 37 is a graph showing a light transmission spectrum of a nano-carbon film lamination structure including a dielectric material layer made of $Al_2O_3$.
Figure 38A:
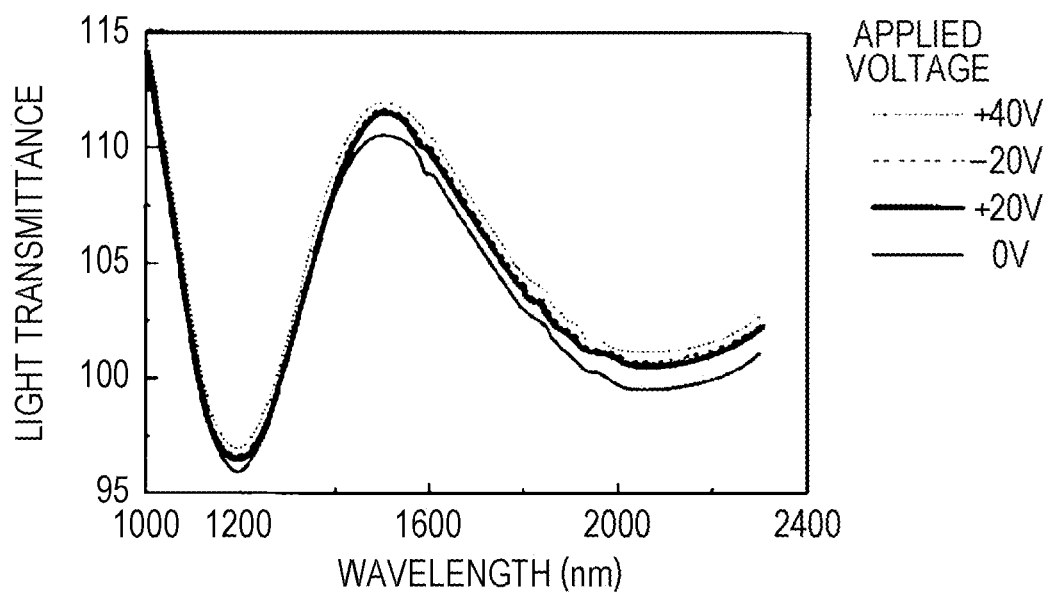
Figure 38B:
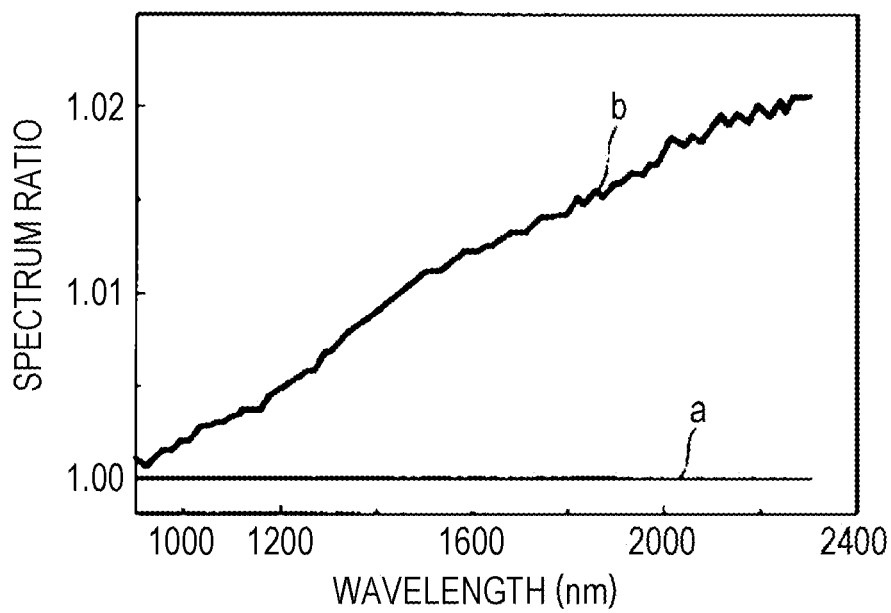
FIG. 38B is a graph showing a spectrum ratio a (0 V/0 V) and a spectrum ratio b (+20 V/0 V) with respect to a reference of a light transmission spectrum when a voltage of 0 V is applied in FIG. 38A.

Each of FIG. 37 and FIG. 38A illustrates an example of a light transmission spectrum of a nano-carbon film laminated structure containing a lamination of the first nano-carbon film, the dielectric material layer, and the second nano-carbon film. In this case, FIG. 37 illustrates an example of the nano-carbon film laminated structure which includes the dielectric material layer made of Al$_2$O$_3$. The second nano-carbon film is grounded. Voltage applied to the first nano-carbon film is varied in a range from −70 V to +70 V. A vertical axis in FIG. 37 represents light transmittance (unit: %). On the other hand, FIG. 38A illustrates an example of the nano-carbon film laminated structure which includes the dielectric material layer made of IGZO. The second nano-carbon film is grounded. Voltage applied to the first nano-carbon film is varied in a range from −20 V to +40 V. A vertical axis in FIG. 38A represents light transmittance. Furthermore, FIG. 38B is a graph obtained on the basis FIG. 38A and illustrating a change of a light transmission spectrum produced by application of voltage, showing a spectrum ratio a (0 V/0 V) and a spectrum ratio b (+20 V/0 V) with a reference of a light transmission spectrum at an application voltage of 0 V in FIG. 38A.

When the dielectric material layer is made of Al$_2$O$_3$, a rise of a light transmission spectrum under a voltage of +30 V or higher (medium-thick line) is recognizable from about 1,100 nm as illustrated in FIG. 37. It is therefore understood that a light transmissible wavelength range (range allowed for light transmittance modulation) is expandable to about 1,100 nm by application of voltage. On the other hand, when the dielectric material layer is made of IGZO, a rise of a light transmission spectrum under a voltage of +20 V (medium-thick line) is recognizable from the wavelength side shorter than 1,000 nm as illustrated in FIG. 38A. It is therefore understood that a light transmissible wavelength range (range allowed for light transmittance modulation) is expandable to the wavelength side shorter than 1,000 nm by application of voltage.

The dielectric constant of IGZO is higher than the dielectric constant of $Al_2O_3$. It is therefore understood that a wavelength of forbidden transition further shifts toward the short wavelength side by application of voltage further expands the light transmissible wavelength range to the short wavelength side as the dielectric material layer has a higher dielectric constant. In addition, the light transmissible wavelength range further expands toward the short wavelength side as applied voltage increases as illustrated in FIG. 37. For example, it is understood that the light transmissible wavelength range expands to about 1,200 nm at a voltage of 10 V, and expands to about 1,100 nm at a voltage of 30 V.

As described above, the light control device (light control element) of the eighth embodiment includes the light control layer including the first nano-carbon film and the second nano-carbon film. Voltage is applied to the first nano-carbon film and the second nano-carbon film. Accordingly, light transmittance of the light control layer is controllable. More specifically, the light control layer is brought into a transparent state for light having a desired wavelength range by applying a predetermined voltage $V_0$ to the first nano-carbon film and the second nano-carbon film.

Incidentally, a light transmittance modulation width per one graphene layer (variable width ΔT of light transmittance) is approximately 2.3%. When the interface between the graphene and the dielectric material layer is not uniform at the time of formation of the light control layer, carriers from the dielectric material are not doped with the graphene, in which condition light transmittance modulation of the graphene may become non-uniform. Particularly, the surface of the dielectric material layer may become rough when the dielectric material layer constituted by ferroelectric material is formed by sputtering or the like. In this case, all carriers may not be doped with the graphene due to roughness of the interface when the graphene is laminated on the dielectric material layer having the rough surface. However, these problems are securely prevented by providing an intermediate layer between the nano-carbon film and the dielectric material layer, i.e., by providing an intermediate layer functioning as a flat layer for improving flatness between the nano-carbon film and the dielectric material layer. Furthermore, this intermediate layer simultaneously functions as a tight-contact improving layer and an antireflection layer. Accordingly, the intermediate layer offers advantages of improvement of tight contact between the nano-carbon film and the dielectric material layer, prevention of separation between the nano-carbon film and the dielectric material layer, and reduction of unnecessary reflection of incident light between the nano-carbon film and the dielectric material layer. Moreover, the nano-carbon film has no light transmittance dependency on wavelength, flat transmission spectrum, and neutral hue, and needs only a short time for a change of light transmittance. Furthermore, the nano-carbon film has simplified structure without a need of mechanical driving, and easily achieves reduction a height (thickness) and miniaturization. In addition, the nano-carbon film is capable of controlling effective light transmittance of the light control layer for light having a desired wavelength or higher by appropriately selecting voltage to be applied. For example, light transmittance for light having a wavelength of a predetermined wavelength or higher (such as light having a wavelength band of visible light or higher) is set to approximately 100% at the predetermined voltage $V_0$ in a state that a desired wavelength is blue (such as 380 nm).

By this method, the desired light transmittance is accurately and easily obtainable. The same is applicable to the following embodiments.

The odd-numbered first nano-carbon film, the even-numbered first nano-carbon film, and second nano-carbon film may be doped with Impurities. More specifically, following six cases are adoptable.

[A-1] (nano-carbon film connected to first wiring and doped with first conductivity type impurities, and nano-carbon film connected to second wiring and doped with second conductivity type impurities)

[A-2] (nano-carbon film connected to first wiring and doped with first conductivity type impurities, and nano-carbon film connected to second wiring and not doped with impurities)

[A-3] (nano-carbon film connected to first wiring and not doped with impurities, and nano-carbon film connected to second wiring and doped with second conductivity type impurities)

[B-1] (nano-carbon film connected to first wiring and doped with second conductivity type impurities, and nano-carbon film connected to second wiring and doped with first conductivity type impurities)

[B-2] (nano-carbon film connected to first wiring and doped with second conductivity type impurities, and nano-carbon film connected to second wiring and not doped with impurities)

[B-3] (nano-carbon film connected to first wiring and not doped with impurities, and nano-carbon film connected to second wiring and doped with first conductivity type impurities).

Ninth Embodiment

Figure 9A:
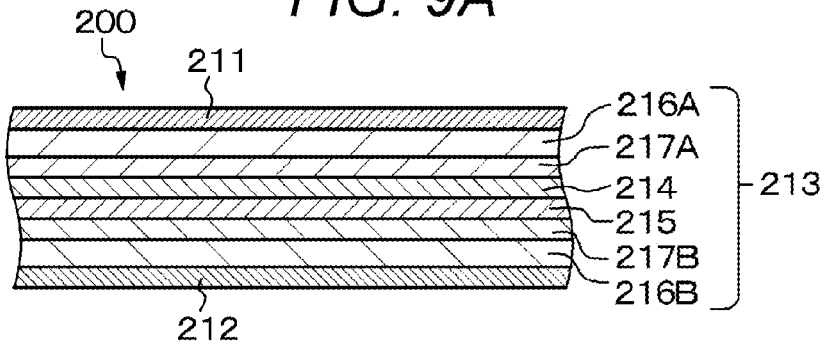
FIG. 9A is a schematic partial end view of a light control device of an imaging device according to a ninth embodiment.

A ninth embodiment is a modification of the first through eighth embodiments, and relates to the light control device (light control element) of the second configuration. As illustrated in a schematic partial cross-sectional view in FIG. 9A, a light control device (light control element) 200 according to the ninth embodiment includes: a pair of electrodes 211 and 212; and a light control layer 213 sandwiched between the pair of electrodes 211 and 212. Furthermore, the light control layer 213 includes a laminated structure constituted by: a first dielectric material layer 216A; a first intermediate layer 217A; a first nano-carbon film 214 doped with first conductivity type impurities or not doped with impurities; a second nano-carbon film 215 doped with second conductivity type impurities different from the first conductivity type, or not doped with impurities; a second intermediate layer 217B; and a second dielectric material layer 216B. Voltage is applied to the pair of electrodes 211 and 212.

Note that following four cases are adoptable for a state of (first nano-carbon film 214 doped with impurities), and (second nano-carbon film 215 doped with impurities).

[C-1] (first nano-carbon film 214 doped with first conductivity type impurities, and second nano-carbon film 215 doped with second conductivity type impurities)

[C-2] (first nano-carbon film 214 doped with first conductivity type impurities, and second nano-carbon film 215 not doped with impurities)

[D-1] (first nano-carbon film 214 not doped with impurities, and second nano-carbon film 215 doped with second conductivity type impurities)

[D-2] (first nano-carbon film 214 not doped with impurities, and second nano-carbon film 215 not doped with impurities) More specifically, according to the ninth embodiment, the first nano-carbon film 214 is doped with the first conductivity type (more specifically, n-type) impurities, while the second nano-carbon film 215 is doped with the second conductivity type (more specifically, p-type) impurities.

Each of the first nano-carbon film 214 and the second nano-carbon film 215 herein is made of graphene similarly to the eighth embodiment. In addition, each of the first electrode 211 and the second electrode 212 constituting the pair of electrodes is made of a nano-carbon film, more specifically, a layer of graphene. Each of the first dielectric material layer 216A, the second dielectric material layer 216B, the first intermediate layer 217A, and the second intermediate layer 217B is made of the material described in the eighth embodiment.

According to the light control device of the ninth embodiment, voltage is applied to the pair of electrodes 211 and 212 to control a charge amount generated in the first nano-carbon film 214 and/or the second nano-carbon film 215, and thereby control light transmittance of the light control layer 213. Note that the light transmittance modulation width (variable width of light transmittance) ΔT of the light control device of the ninth embodiment is approximately 4% in a state that the two layers of the first nano-carbon film 214 and the second nano-carbon film 215 are laminated, and that the light transmittance modulation width per one layer of graphene is approximately 2%.

Figure 9B:
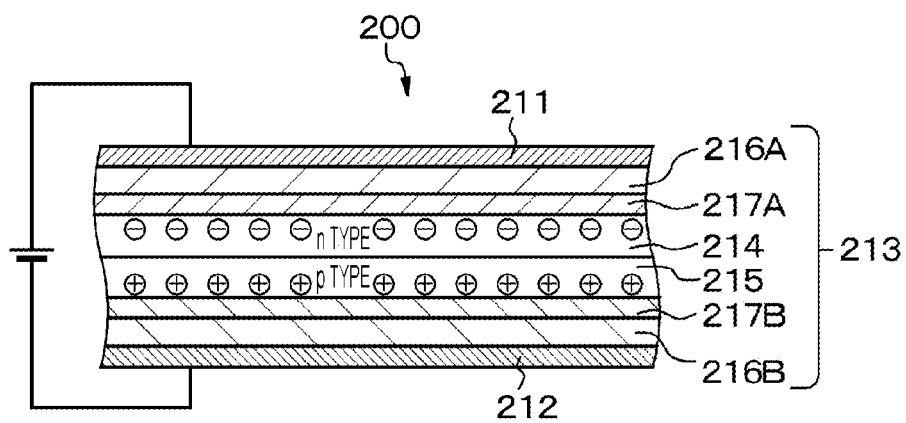
FIG. 9B is a conceptual view illustrating actions of a first nano-carbon film and a second nano-carbon film when voltage is applied to a pair of electrodes of the light control device of the imaging device according to the ninth embodiment.

More specifically, the first conductivity type is n-type, and the second conductivity type is p-type as described above, in which condition voltage higher than voltage applied to the second electrode 212 facing the second nano-carbon film 215 via the second dielectric material layer 216B is applied to the first electrode 211 facing the first nano-carbon film 214 via the first dielectric material layer 216A (see FIG. 9B). The second nano-carbon film 215 and the second dielectric material layer 216B are electrically in a floating state. Accordingly, negative charges are induced in the first nano-carbon film 214, while positive charges are induced in the second nano-carbon film 215 (see FIG. 9B). The first nano-carbon film 214 is doped with n-type impurities, while the second nano-carbon film 215 is doped with p-type impurities herein. Accordingly, pn junction is generated in the interface between the first nano-carbon film 214 and the second nano-carbon film 215. In this case, a depletion layer is formed between the first nano-carbon film 214 and the second nano-carbon film 215 during application of inversely biased voltage to the pair of electrodes 211 and 212. Accordingly, charges are retained in each of the first nano-carbon film 214 and the second nano-carbon film 215. As a result, a light wavelength band allowing passage (transmission) of light through the light control layer 213 at high light transmittance is determined.

Figure 9C:
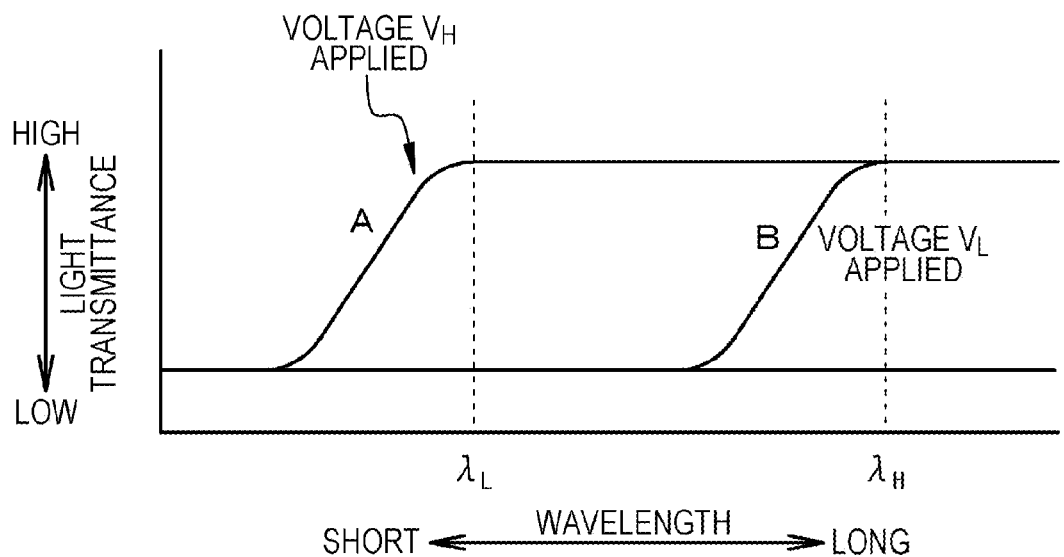
FIG. 9C is a conceptual view showing a relationship between light transmittance of a light control layer and a wavelength band of light having passed through the light control device when voltage is applied to the pair of electrodes of the light control device of the imaging device according to the ninth embodiment.

More specifically, when a high first voltage $V_H$ is applied between the pair of electrodes 211 and 212, a relationship between light transmittance of the light control layer 213 and the wavelength of light having passed through the light control device comes into a state "A" in a conceptual view in FIG. 9C. On the other hand, when a low second voltage $V_L$ ($V_L<V_H$) is applied between the pair of electrodes 211 and 212, the relationship between light transmittance of the light control layer 213 and the wavelength of light having passed through the light control device comes into a state "B" in the conceptual view in FIG. 9C. According to this configuration, light having a wavelength of $\lambda_L$ or higher is allowed to pass (achieve transmission) at higher transmittance than transmittance of light having a wavelength lower than the wavelength $\lambda_L$ when the first voltage $V_H$ is applied between the pair of electrodes 211 and 212 (see state "A" in conceptual view of FIG. 9C). On the other hand, light having a wavelength of $\lambda_H$ ($\lambda_H>\lambda_L$) or higher is allowed to pass (achieve transmission) at higher transmittance than transmittance of light having a wavelength lower than the wavelength $\lambda_H$ when the second voltage $V_L$ is applied between the pair of electrodes 211 and 212 (see state "B" in conceptual view of FIG. 9C). Accordingly, a relationship between a light control state of the light control device and a wavelength band of light is controllable in accordance with voltage applied to the pair of electrodes 211 and 212. Note that the foregoing description is applicable to the light control device according to the eighth embodiment when the first nano-carbon film 114 and the second nano-carbon film 115 are substituted for the pair of electrodes 211 and 212.

More specifically, for manufacturing the light control device according to the ninth embodiment, rolled copper foil having a thickness of 35 μm is heated to 1,000° C. in a hydrogen atmosphere (hydrogen flow rate: 20 sccm) within an electric furnace, for example. Methane gas is supplied at a flow rate of 30 sccm for 30 minutes to form the first nano-carbon film 214 constituted by graphene on the copper foil. Subsequently, a dopant layer is formed on the graphene. Thereafter, the first intermediate layer 217A of a base on which the first electrode 211, the first dielectric material layer 216A, and the first intermediate layer 217A are formed is affixed to the first nano-carbon film 214. The copper foil is removed by using an iron nitrate solution. On the other hand, similarly to above, rolled copper foil having a thickness of 35 μm is heated to 1,000° C. in a hydrogen atmosphere (hydrogen flow rate: 20 sccm) within an electric furnace, for example. Methane gas is supplied at a flow rate of 30 sccm for 30 minutes to form the second nano-carbon film 215 constituted by graphene on the copper foil. Subsequently, a dopant layer is formed on the graphene. The second intermediate layer 217B and the second dielectric material layer 216B are further formed. Thereafter, a polymethyl methacrylate (PMMA) acetone-diluted solution is applied to an upper part of the second intermediate layer 216B by spin coating. After spin coating, the solution is dried to form a PMMA film. Subsequently, the copper foil is removed by using an iron nitrate solution. The second nano-carbon film 215 affixed to the PMMA film is transferred to an upper part of the first nano-carbon film 214. Thereafter, the PMMA film is removed by using an acetone solvent. As a result, a laminated structure including the first dielectric material layer 216A, the first intermediate layer 217A, the first nano-carbon film 214 and the second nano-carbon film 215 made of graphene, the second intermediate layer 217B, and the second dielectric material layer 216B is produced. Note that imaging elements are provided on the base beforehand, for example. The respective film forming steps may be executed by using a method which successively forms films by a roll-to-roll system, or a method which successively forms graphene films by locally heating electrodes, for example.

According to the light control device (light control element) of the ninth embodiment, positive or negative charges are induced either in the first nano-carbon film or the second nano-carbon film in accordance with polarity of voltage applied to the pair of electrodes. In this case, negative or positive charges are induced in the opposite film. As a result, a light wavelength band for passing through the light control layer at high light transmittance is determined. More specifically, light transmittance of the light control layer in a desired wavelength band is controllable. Moreover, the first nano-carbon film is doped with first conductivity type impurities, while the second nano-carbon film is doped with second conductivity type impurities. In this case, pn junction is generated in the interface between the first nano-carbon film and the second nano-carbon film. Accordingly, charges are retained in each of the first nano-carbon film and the second nano-carbon film during application of inversely biased voltage to the pair of electrodes. In addition, no current flows between the pair of electrodes, wherefore reduction of power consumption is achievable.

Tenth Embodiment

A tenth embodiment is a modification of the ninth embodiment. As illustrated in a schematic partial cross-sectional view in FIG. 10, a light control device (light control element) 200' according to the tenth embodiment includes: N light control layers (N=5 in the example of the figure); and (N+1) electrodes. The N light control layers and the (N+1) electrodes are alternately laminated. The odd-numbered electrodes are connected to first wiring 218, while the even-numbered electrodes are connected to second wiring 219.

More specifically, there is provided a structure including the first electrode 211, the first dielectric material layer 216A, the first intermediate layer 217A, the first nano-carbon film 214, the second nano-carbon film 215, the second intermediate layer 217B, the second dielectric material layer 216B, the second electrode 212, the second dielectric material layer 216B, the second intermediate layer 217B, the second nano-carbon film 215, the first nano-carbon film 214, the first intermediate layer 217A, the first dielectric material layer 216A, the first electrode 211, the first dielectric material layer 216A, the first intermediate layer 217A, the first nano-carbon film 214, the second nano-carbon film 215, the second intermediate layer 217B, the second dielectric material layer 216B, the second electrode 212, and others. In this case, the lamination order of the first dielectric material layer, the first nano-carbon film, the first intermediate layer, the second nano-carbon film, the second intermediate layer, and the second dielectric material layer of the odd-numbered light control layers is the reversed order of the corresponding lamination order of the even-numbered light control layers. This configuration produces a laminated structure of the N light control layers 213 of the ninth embodiment as a whole, and expands the variable width of light transmittance.

Note that the N light control layers may be divided into groups each of which includes N' layers of light control devices. In this case, one of electrodes in each group of the light control devices is connected to the first wiring 218, while the other electrode is connected to the second wiring 219.

Eleventh Embodiment

An eleventh embodiment is a modification of the first through eighth embodiments, and relates to a light control device (light control element) of a third configuration. As illustrated in schematic partial cross-sectional views in FIGS. 11A and 11B, each of light control devices (light control elements) $300_1$ and $300_2$ according to the eleventh embodiment includes: a pair of electrodes 311 and 312, and a light control layer 313 sandwiched between the pair of electrodes. The light control layer 313 has a laminated structure including a first dielectric material layer 316A, a first intermediate layer 317A, a nano-carbon film 314 doped with impurities or not doped with impurities, a second intermediate layer 317B, and a second dielectric material layer 316B. Voltage different from voltage applied to the pair of electrodes 311 and 312 is applied to the nano-carbon film 314.

Figure 11A:
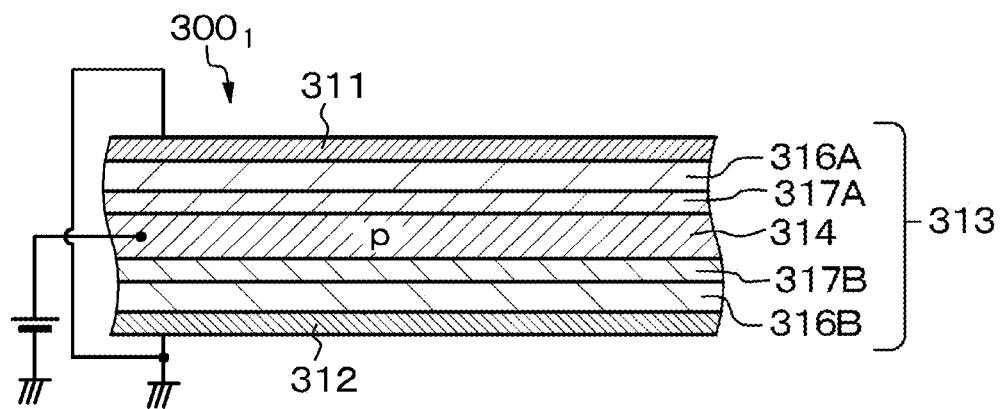
FIGS. 11A and 11B are schematic partial end views of a light control device of an imaging device according to an eleventh embodiment.
Figure 11B:
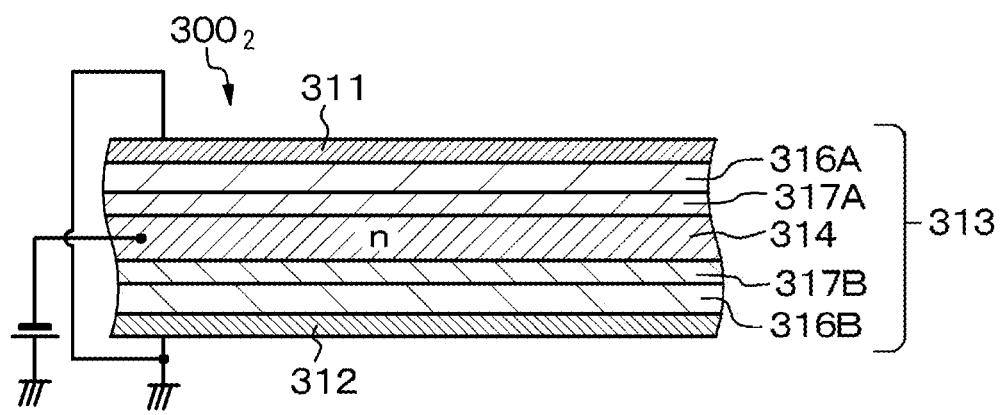

More specifically, as illustrated in FIG. 11A, the impurities are of p-type. Voltage higher than voltage applied to the pair of electrodes 311 and 312 is applied to the nano-carbon film 314. Alternatively, as illustrated in FIG. 11B, the impurities are of n-type. Voltage lower than voltage applied to the pair of electrodes 311 and 312 is applied to the nano-carbon film 314. Note that the nano-carbon film 314 is made of graphene, similarly to the eighth embodiment.

Except for the foregoing points, the light control device (light control element) of the eleventh embodiment is similar to the light control device (light control element) described in the ninth embodiment. Accordingly, detailed description is not repeated. According to the light control device (light control element) of the eleventh embodiment, the light control layer has a laminated structure including the first dielectric material layer, the nano-carbon film doped with impurities or not doped with impurities, and the second dielectric material layer. Voltage different from voltage applied to the pair of electrodes is applied to the nano-carbon film. Accordingly, light transmittance of the light control layer is controllable.

Twelfth Embodiment

Figure 12:
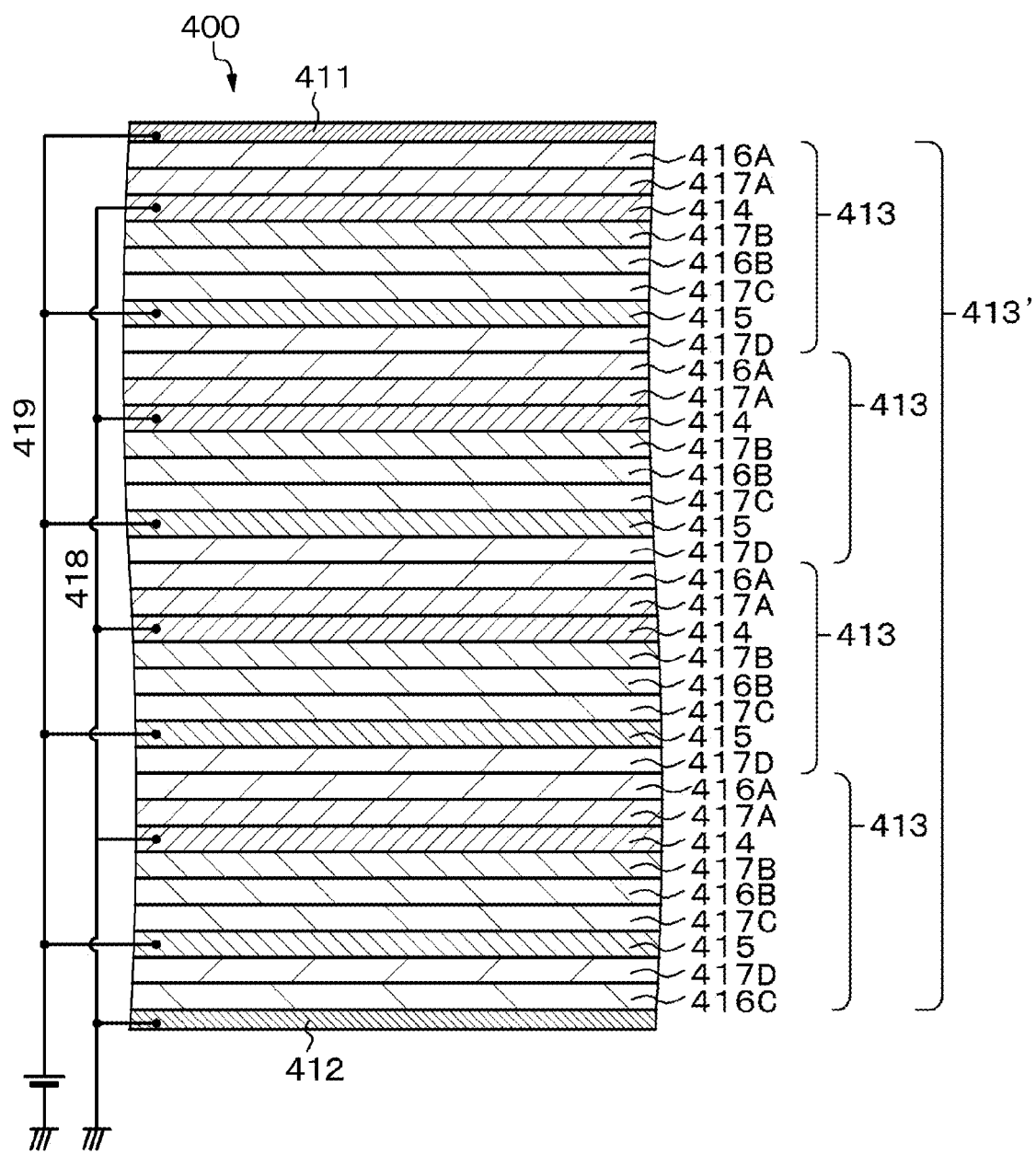
FIG. 12 is a schematic partial end view of a light control device of an imaging device according to a twelfth embodiment.

A twelfth embodiment is a modification of the first through eighth embodiments, and relates to a light control device (light control element) of a fourth configuration. As illustrated in a schematic partial cross-sectional view in FIG. 12, a light control device (light control element) 400 of the twelfth embodiment includes: a pair of electrodes 411 and 412; and a laminated structure 413' on which P light control layers 413 (P≥1) sandwiched between the pair of electrodes 411 and 412. The pth light control layer 413 (1≤p≤P) has a laminated structure including a first dielectric material layer 416A, a first intermediate layer 417A, a first nano-carbon film 414 doped with n-type impurities or not doped with impurities, a second intermediate layer 417B, a second dielectric material layer 416B, a third intermediate layer 417C, a second nano-carbon film 415 doped with p-type impurities or not doped with impurities, and a fourth intermediate layer 417D. The Pth light control layer 413 further includes a third dielectric material layer 416C on the fourth intermediate layer 417D. Voltage different from voltage applied to the first nano-carbon film 414 is applied to the second nano-carbon film 415. More specifically, voltage higher than voltage applied to the first nano-carbon film 414 is applied to eth second nano-carbon film 415.

Note that the first light control layer 413 is positioned on the upper side, and that the Pth light control layer 413 is positioned on the lower side in the example illustrated in the figure. Accordingly, the third dielectric material layer 416C is further formed below the fourth intermediate layer 417D in the Pth light control layer 413. In this case, whether the third dielectric material layer 416C is formed above or below the fourth intermediate layer 417D is relatively determined and dependent on a positional relationship between the first light control layer and the Pth light control layer. When the first light control layer is positioned above the Pth light control layer as described above, the third dielectric material layer 416C is formed "below" the fourth intermediate layer 417D. This configuration is also included in a concept that the third dielectric material layer 416C is formed "above" the fourth intermediate layer 417D in the Pth light control layer 413.

The electrode 412 and the first nano-carbon film 414 are connected to common first wiring 418, while the electrode 411 and the second nano-carbon film 415 are connected to common second wiring 419. Accordingly, the same voltage as the voltage applied to the second nano-carbon film 415 is applied to the electrode 411 via the common second wiring 419. On the other hand, the same voltage as the voltage applied to the first nano-carbon film 414 is applied to the electrode 412 via the common first wiring 418.

Except for the foregoing points, the light control device (light control element) of the twelfth embodiment is similar to the light control device (light control element) described in the ninth embodiment. Accordingly, detailed description is not repeated. The light control device (light control element) of the thirteen embodiment has a laminated structure including a lamination of the P light control layers (P≥1) each of which has a predetermined configuration. Voltage different from voltage applied to the first nano-carbon film is applied to the second nano-carbon film. Accordingly, light transmittance of the light control layer is controllable.

Thirteenth Embodiment

A thirteenth embodiment relates to an imaging device to which the eighth through twelfth embodiments have been applied according to the present disclosure. Each of imaging elements $R_1$, $G_1$, and $B_1$ according to the thirteenth embodiment includes a light receiving element (photo sensor, photodiode, photoelectric conversion element) 27, and any one of the light control devices of the first through fourth configurations 100, 200, 200', $300_1$, $300_2$, and 400 disposed on the light entrance side of the light receiving element described in the eighth through twelfth embodiments. Note that the light control devices 100, 200, 200', $300_1$, $300_2$, and 400 are also collectively referred to as "light control devices 21" in the following description.

According to the thirteenth embodiment or following fourteenth through seventeenth embodiments, entrance of light into the light receiving element 27 is controlled and limited by the light control device 21 under control by the pixel signal reading device 16, together with random operation of the AD converters 13, the reading amplifiers 15, or the switching elements 14 achieved by the pixel signal reading device 16. Accordingly, randomness of pixel signals increases, wherefore image resolution and spatial resolution improve.

Figure 13A:
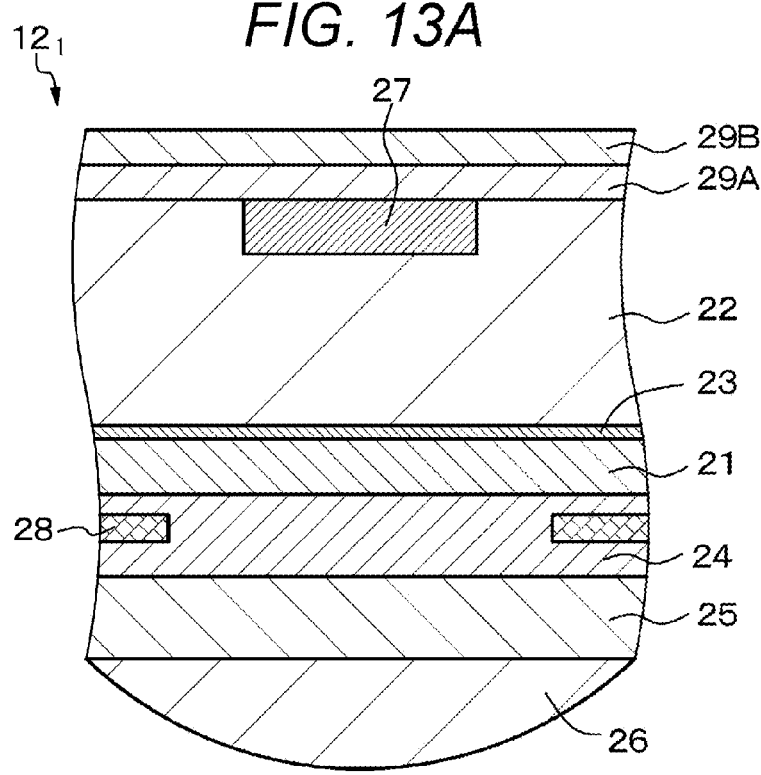
FIGS. 13A and 13B are schematic partial cross-sectional views of an imaging element according to a thirteenth embodiment.
Figure 13B:
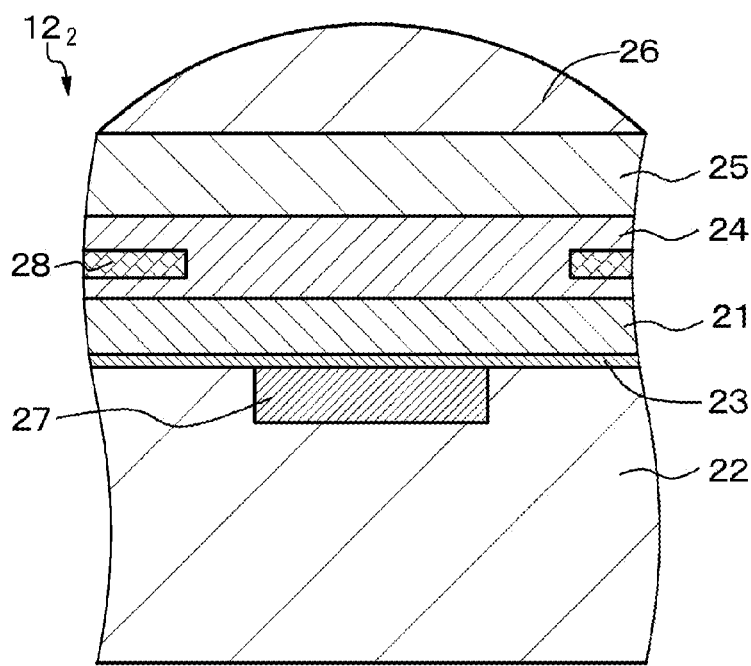

Each of FIGS. 13A and 13B is a schematic partial cross-sectional view of the imaging element according to the thirteenth embodiment. In addition, each of FIGS. 14A, 14B, and 15A schematically illustrates a layout of an imaging element group. An imaging element $12_1$ illustrated in FIG. 13A herein is a rear-side illumination type imaging element, while an imaging element $12_2$ illustrated in FIG. 13B is a front-side illumination type imaging element. The imaging elements $R_1$, $G_1$, and $B_1$ are arranged on the basis of a Bayer array, for example.

Each of the imaging elements $12_1$ and $20_2$ has a structure including a lamination of a silicon semiconductor substrate 22, an interlayer insulation film 23 made of $SiO_2$, the light control device 21 (100, 200, 200', $300_1$, $300_2$, or 400) described in the eighth through twelfth embodiments, a protection film 24, a color filter layer (or transparent film) 25, and a condensing lens (on-chip lens) 26. In this case, the color filter layer 25 is disposed on the light entrance side of the light receiving element. The light receiving element 27 is provided on a front surface portion of the silicon semiconductor substrate 22. Moreover, a light shielding film 28 is provided between respective imaging elements. Note that more specifically, the light shielding film 28 is provided in a certain type of grid shape at each portion between adjoining pixels, i.e., between respective pixels. In case of the rear-side illumination type imaging element $12_1$, a laminated structure including the light control device 21 and the like is provided on the rear surface side of the silicon semiconductor substrate 22. In case of the front-side illumination type imaging element $12_2$, a laminated structure including the light control device 21 and the like is provided on the front surface side of the silicon semiconductor substrate 22. In addition, in case of the rear-side illumination type imaging element $12_1$, an interlayer insulation layer 29A and a protection film 29B made of $SiO_2$ are provided on the front surface side of the silicon semiconductor substrate 22. Signal charges are generated from entering light through photoelectric conversion by the light receiving element 27, and stored. First wiring and second wiring included in the light control device 21 are not shown in the figure. Configuration and structure of each of the rear-side illumination type imaging element $12_1$ and the front-side illumination type imaging element $12_2$ may be known configuration and structure except for the light control device 21, and therefore are not detailed herein. In addition, the imaging device itself may have a configuration similar to a configuration of a known imaging device. In addition, a driving method of the imaging elements and a driving method of the imaging device may be known driving methods, and therefore are not detailed herein. The imaging elements according to the thirteenth embodiment achieves height reduction (thickness reduction). Accordingly, the imaging element and the imaging device provided herein are highly sensitive, and capable of decreasing color mixture between pixels and sensitivity shading.

In FIGS. 14A, 14B, and 15A, "$R_1$" is an imaging element including a red color filter layer to receive red light. This imaging element is referred to as a "red imaging element" for convenience. In addition, "$G_1$" is an imaging element including a green color filter layer to receive green light. This imaging element is referred to as a "green imaging element" for convenience. Furthermore, "$B_1$" is an imaging element including a blue color filter layer to receive blue light. This imaging element is referred to as a "blue imaging element" for convenience. According to the example illustrated in the figures, one unit imaging element group is constituted by one red imaging element, two green imaging elements, and one blue imaging element. FIGS. 14A, 14B, and 15A show 64 imaging elements.

Incidentally, the light control device 21 absorbs approximately 2.3% light per one nano-carbon film when no voltage is applied. Accordingly, on the assumption that the number of nano-carbon films is 60, light transmittance of the overall light control device 21 becomes approximately 25% when no voltage is applied. On the other hand, light transmittance of the overall light control device 21 comes to a value close to 100% when a predetermined voltage $V_0$ is applied.

A dynamic range is represented by a ratio of a saturated signal amount corresponding to a maximum signal amount to noise. Image output signals in a bright scene and image output signals in a dark scene are more securely generated as the dynamic range becomes larger. According to the imaging elements of the thirteenth embodiment, a period for reaching a saturated charge amount is controllable in each of the imaging elements by controlling light transmittance of each of the light control devices 21 (i.e., by controlling light transmittance on the basis of adjustment of the predetermined voltage $V_0$ applied to the light control device 21, or by decreasing light transmittance to a desired value). Furthermore, as a result, the dynamic range expands.

When the first electrode and the second electrode are made of graphene, light is also absorbed by the first electrode and the second electrode. However, the amount of absorption by these electrodes is only about 4% which is smaller than the corresponding amount of the first and second electrodes constituted by transparent conductive material layers made of indium tin oxide (ITO) or the like.

According to this embodiment, the light control device 21 is disposed in a region between the color filter layer 25 and the silicon semiconductor substrate 22. However, the light control device 21 may be disposed in a region between the color filter layer 25 and the condensing lens 26.

Moreover, the imaging device according to the thirteen embodiment performs random exposure. In this case, there is provided a random pulse voltage generation and transmission device which generates random pulse voltage, and transmits generated random pulse voltage to an imaging element including a light control device. More specifically, there is provided a random pulse voltage generation and transmission device (not shown) which generates random pulse voltage, and transmits generated random pulse voltage to an imaging element including a light control device. One or a plurality of the random pulse voltage generation and transmission devices are provided herein for the plurality of imaging elements each of which includes the light control device. Note that the light control devices are connected to the random pulse voltage generation and transmission device via connection wiring constituted by a nano-carbon film or a transparent conductive material layer. Operation of the random pulse voltage generation and transmission device is controlled by the pixel signal reading device 16. More specifically, when the pixel signal reading device 16 randomly operates the AD converters 13, the reading amplifiers 15, or the switching elements 14, the random pulse voltage generation and transmission device also transmits random pulse voltage to the imaging element connected to the operated AD converter 13 or the reading amplifier 15.

Figure 16:
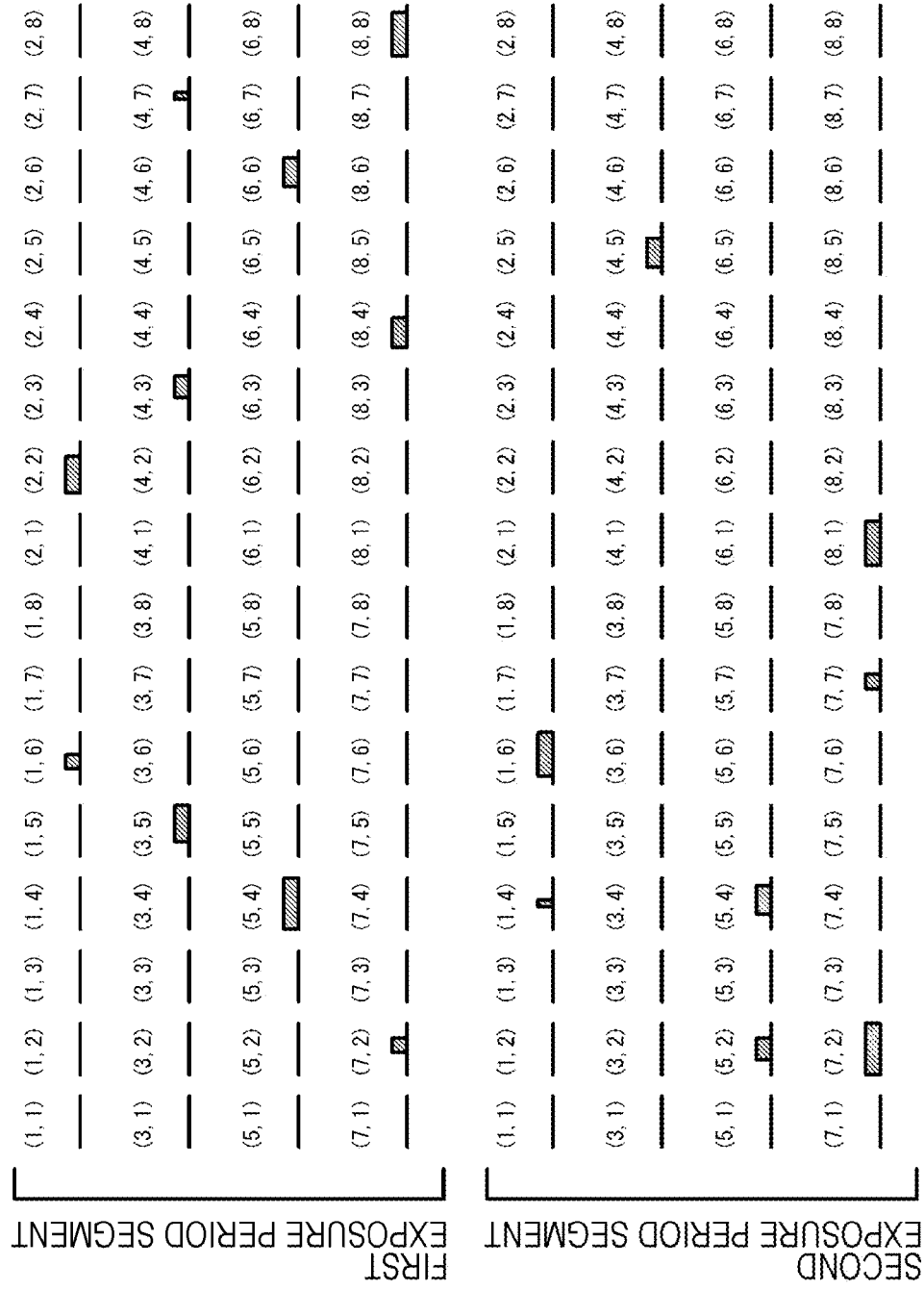
FIG. 16 is a view schematically illustrating a state of pixel signals output to the outside via analog-digital converters included in an imaging element unit according to the thirteenth embodiment.

FIG. 16 schematically illustrates a state of pixel signals temporarily stored in a memory of the imaging element unit $11_{i,j}$ after passing through the AD converter 13. It is assumed that operations of the respective imaging elements illustrated in FIG. 16 are similar to the corresponding operations according to the first embodiment described with reference to FIGS. 2A, 2B, and 3 for convenience. Unlike the first embodiment, each length of bold line segments indicated below the numbers of the respective imaging elements (state that a pixel signal is being read in a pixel signal reading state of the imaging element) is different at random.

In this case, the imaging elements are arranged in two-dimensional matrix in the first direction and the second direction. The first nano-carbon film extends in the first direction, and common to the imaging elements arranged in the first direction. The second nano-carbon film extends in the second direction, and common to the imaging elements arranged in the second direction. Positive-polarity random pulse voltage is applied to the first nano-carbon film, while negative-polarity random pulse voltage is applied to the second nano-carbon film.

Note that one of a pair of electrodes may be common to the respective imaging elements. More specifically, the respective light control devices of the adjoining imaging elements may have a common first electrode, or the respective light control devices of the adjoining imaging elements may have a common second electrode. These modes simplify the configuration and structure of the imaging elements. In more detail, the first electrode or the second electrode may be constituted by a so-called solid electrode between the imaging elements in these cases.

More specifically, according to the imaging device of the thirteen embodiment, the one random pulse voltage generation and transmission device is provided for the plurality of imaging elements occupying one column (arranged in column direction), for example. Note that each of a vertical scanning circuit (V scan circuit) 31 and a horizontal scanning circuit (H scan circuit) 32 described below with reference to FIG. 17 also functions as the random pulse voltage generation and transmission device. In this case, random pulse voltage is applied from the random pulse voltage generation and transmission device to the first nano-carbon film and the second nano-carbon film of the light control device constituting each of the imaging elements, or to the first electrode and the second electrode. As a result, light transmittance of the light control device of each of the imaging elements varies at random. More specifically, light transmittance of the light control device of each of the imaging elements varies from a low value to a high value at random. In this case, an integrated amount of random pulse voltages corresponds to a stored charge amount of the light receiving element. Accordingly, charges are stored in the light receiving element by continuous application of random pulse voltage for a predetermined time. Images are formed by performing light transmission modulation in accordance with random pulse voltage in each imaging element for 16 exposure period segments, for example, i.e., by varying light transmittance in each imaging element (each pixel) for each of 16 exposure period segments, for example. Thereafter, moving images are restored on the basis of the images thus formed. Note that the number of exposure period segments (16 in this example) is appropriately selected in accordance with a compression rate. In addition, as described above, a period from a light entrance start to a light entrance end corresponds to an effective exposure period segment. A time length of the effective exposure period segment is random. Furthermore, starting time of light entrance is also random. As described above, the time length of the effective exposure period segment, and the starting time of light entrance are both random, in addition to random operation of the AD converters 13 or the reading amplifiers 15 by the pixel signal reading device 16. In this case, spatial randomness in pixel signal reading from the imaging elements further improves. Furthermore, as a result, an obtained information volume of pixel signals increases, wherefore prevention of resolution deterioration, and further power consumption are both achievable. Note that the sum total of the time lengths of the effective exposure period segments in one imaging frame is kept uniform under control by the pixel signal reading device 16.

In addition, images continuously formed in a fixed period by utilizing sparsity of images are represented by a limited number of images, wherefore compression of image data is realizable. Furthermore, in a state that not all images are not necessarily sparse images, data conversion for producing sparsity may be performed beforehand to convert images into sparse images. As apparent from above, image data on moving images originally having a large volume becomes compressible, wherefore wireless communication of images is realizable. As a result, power consumption greatly decreases in comparison with a result of image processing performed by a main body of the imaging device.

According to a conventional imaging system, image output signals are obtained by exposure within a fixed period. On the other hand, the imaging device of the present disclosure represents image output signals equivalent to the image output signals of the conventional system based on integration of an exposure pattern which is random in space, and an exposure pattern which is random in time. In this case, continuous moving images are represented by limited image output signals, wherefore compression of image output signals from the imaging elements is achievable. More specifically, image output signals are compressed as a result of thinning of image output signals in view of space and time after output from the imaging elements including the light control devices.

Figure 17:
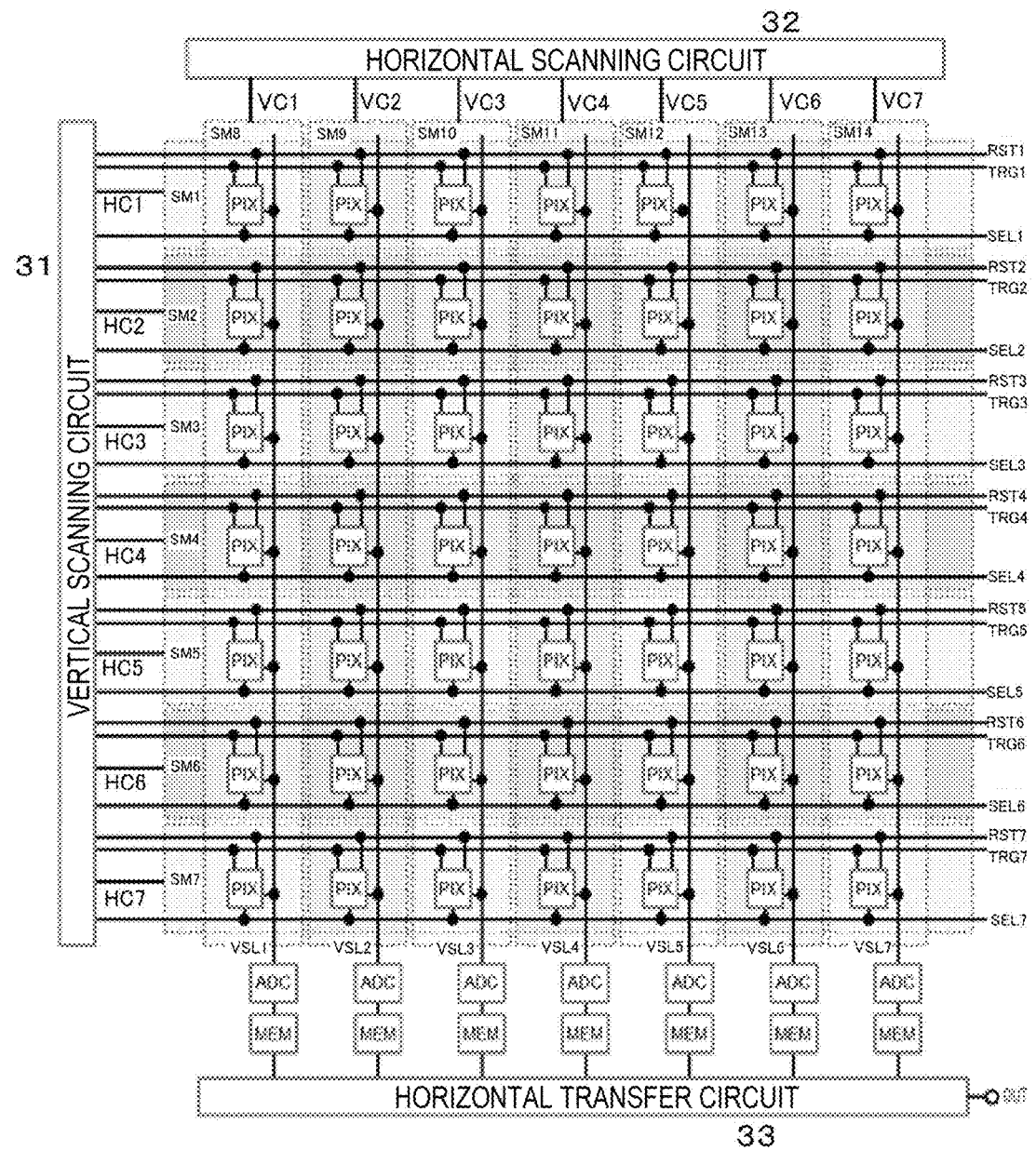
FIG. 17 is a view illustrating an example of a configuration of a pixel driving circuit of the imaging device according to the thirteenth embodiment.

FIG. 17 illustrates a configuration of a pixel driving circuit of the imaging device according to the thirteenth embodiment. FIG. 17 shows (seven imaging elements)× (seven imaging elements) for convenience.

Note that the pixel driving circuit according to the thirteenth embodiment includes the vertical scanning circuit (V scan circuit) 31 which generates pixel control signals in units of row, the horizontal scanning circuit (H scan circuit) 32 which generates pixel control signals in units of column. Imaging elements (pixels, PIXs) are arranged in two-dimensional matrix (grid shape). Pixel reset control signal lines (RST1 through RST7), pixel transfer control signal lines (TRG1 through TRG7), and pixel selection control signal lines (SEL1 through SEL7) extend from the vertical scanning circuit 31 for each row. The imaging elements (pixels) in an identical row are connected to the one pixel reset control signal line, the one pixel transfer control signal line, and the one pixel selection control signal line.

The pixel driving circuit according to the thirteen embodiment further includes a horizontal transfer circuit (H transfer circuit) 33 for outputting image output signals read from the imaging elements (pixels) to the outside. Vertical signal lines (VSL1 through VSL7) are wired for each column. The imaging elements (pixels) in an identical column are connected to one vertical signal line. All the vertical signal lines are connected to the horizontal transfer circuit 33 via corresponding AD converters (ADCs, AD converters 13) and memories (MEMs, 17).

The first nano-carbon film (or second nano-carbon film) of the light control device constituting each of the imaging elements arranged in the row direction is common to the imaging elements arranged in the row direction, and indicated as SM1 through SM7 in FIG. 17. On the other hand, the second nano-carbon film (or first nano-carbon film) of the light control device constituting each of the imaging elements arranged in the column direction is common to the imaging elements arranged in the column direction, and indicated as SM8 through SM14 in FIG. 17. Each of the nano-carbon films (SM1 through SM7) in units of row is connected to the vertical scanning circuit 31 via a nano-carbon film control first signal line (horizontal lamination film control signal line, HC1 through HC7) corresponding to connection wiring. On the other hand, each of the nano-carbon films (SM8 through SM14) in units of column is connected to the horizontal scanning circuit 32 via a nano-carbon film control second signal line (vertical lamination film control signal line, VC1 through VC7) corresponding to connection wiring. As described above, each of the vertical scanning circuit (V scan circuit) 31 and the horizontal scanning circuit (H scan circuit) 32 also functions as the random pulse voltage generation and transmission device, and applies voltage to the nano-carbon film via the nano-carbon film control first signal lines HC1 through HC7 and the nano-carbon film control second signal lines VC1 through VC7. This configuration simplifies a manufacturing process of imaging elements, and miniaturizes pixels. The connection wiring is constituted by a nano-carbon film or a transparent conductive material layer. Note that the first nano-carbon films SM1 through SM7 are replaced with the first electrode or the second electrode, and that the second nano-carbon films SM8 through SM14 are replaced with the second electrode or the first electrode for the light control device including the first electrode and the second electrode.

Figure 18A:
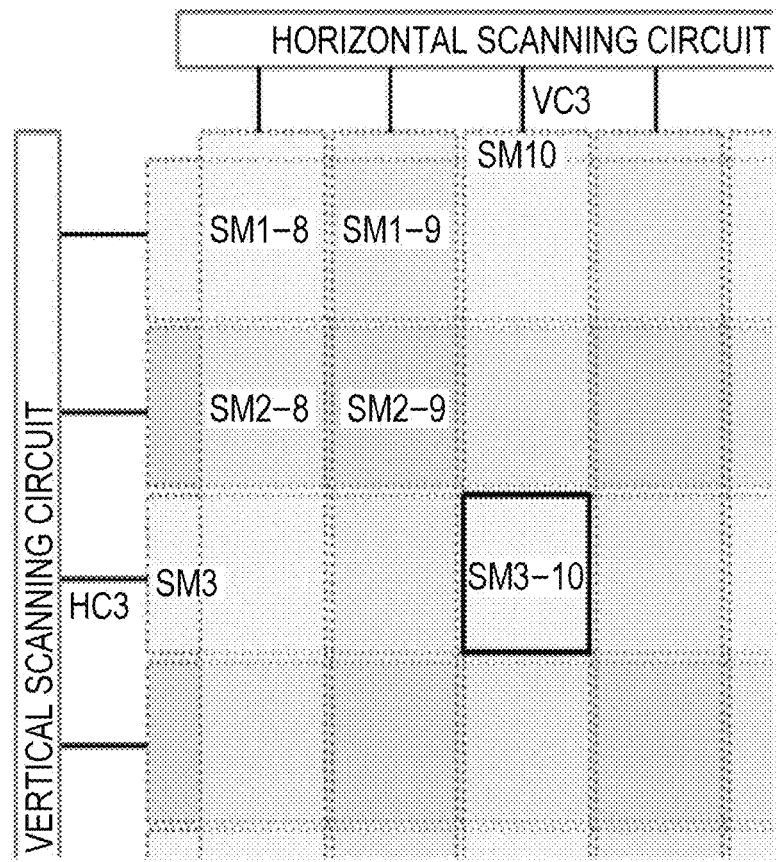

FIG. 18A is a view corresponding to FIG. 17 from which respective elements relating to pixel driving are removed for easy understanding. For controlling light transmittance of the light control device constituting the one imaging element (pixel) SM3-10, positive polarity random pulse voltage ($V_2>0$) is applied to the common nano-carbon film SM3 in the third row via the nano-carbon film control first signal line (HC3) extending from the vertical scanning circuit 31, while negative polarity random pulse voltage ($V_4<0$) is applied to the common nano-carbon film SM10 in the third column via the nano-carbon film control second signal line (VC3) extending from the horizontal scanning circuit 32. In addition, the AD converter ADC connected to the vertical signal line VSL3 is selected and operated by the pixel signal reading device 16.

Figure 18B:
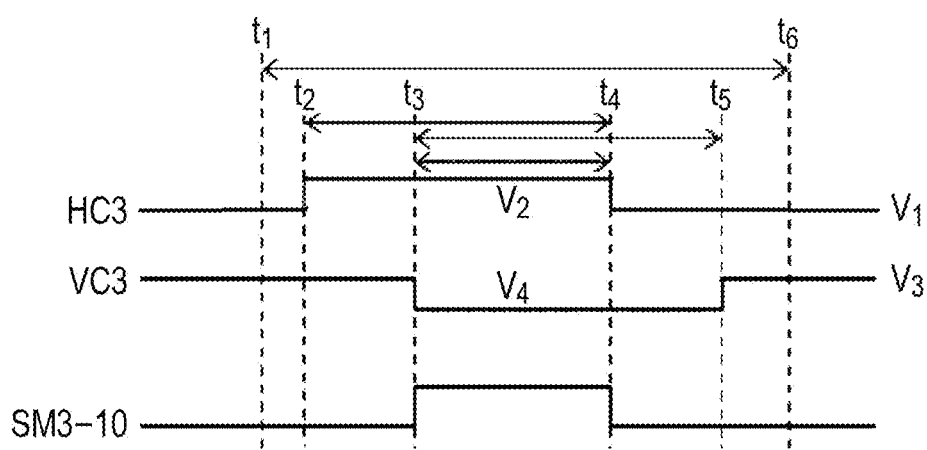
FIG. 18B is a view showing voltage applied to a nano-carbon film control first signal line, voltage applied to a nano-carbon film control second signal line, and changes of light transmittance of a light control device constituting the imaging element.

FIG. 18B illustrates voltage applied to the nano-carbon film control first signal line (HC3), voltage applied to the nano-carbon film control second signal line (VC3), and a change of light transmittance of the light control device constituting the imaging element SM3-10. A horizontal axis in FIG. 18B represents time. In this case, a period from time $t_1$ to time $t_6$ corresponds to a period of exposure of the imaging element in the 16 exposure period segments, for example. In a period other than the period from $t_1$ to $t_6$, voltage applied to the nano-carbon film control first signal line (HC3) is set to a relatively low voltage ($V_1$ V), while voltage applied to the nano-carbon film control second signal line (VC3) is set to a relatively high voltage ($V_3$ V). In this case, the light transmittance of the light control device is low (see light transmittance characteristics shown in FIG. 19A) to block visible light entering the light receiving element. On the other hand, in the period from $t_2$ to $t_4$, a first specific voltage (high voltage $V_2>V_1$) is applied to the nano-carbon film control first signal line (HC3). In the period from $t_3$ to $t_5$, a second specific voltage (low voltage $V_4<V_3$) is applied to the nano-carbon film control second signal line (VC3). As a result, the light transmittance of the light control device is low in the period until $t_2$ and after $t_5$ (see light transmittance characteristics shown in FIG. 19A) to block visible light entering the light receiving element. In addition, in the period from $t_2$ to $t_3$ and the period from $t_4$ to $t_5$, the light control device also exhibits light transmittance characteristics shown in FIG. 19B to similarly block visible light entering the light receiving element. On the other hand, in the period from $t_3$ to $t_4$, the light control device exhibits light transmittance characteristics shown in FIG. 19C, in which condition the light control device allows entrance of visible light into the light receiving element. As described above, according to the thirteenth embodiment, positive polarity random pulse voltage is applied to the nano-carbon film control first signal line, for example, while negative polarity random pulse is applied to the nano-carbon film control second signal line, for example, to constitute a type of "AND circuit" which controls light transmittance of the nano-carbon film. Note that respective voltages may be set as follows, for example: $V_1=-V_3$; $V_1$ and $V_3$=ground potential; $V_1$, $V_2$, $V_3$, and $V_4\approx-1$ V, 2 V, 1 V, and $-2$ V, respectively.

Figure 19A:
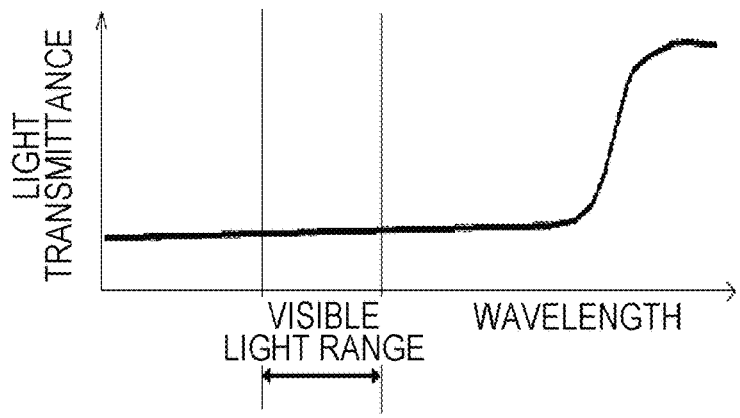
FIGS. 19A, 19B, and 19C are conceptual views showing light transmittance characteristics of the light control device of the imaging device according to the thirteenth embodiment.
Figure 19B:
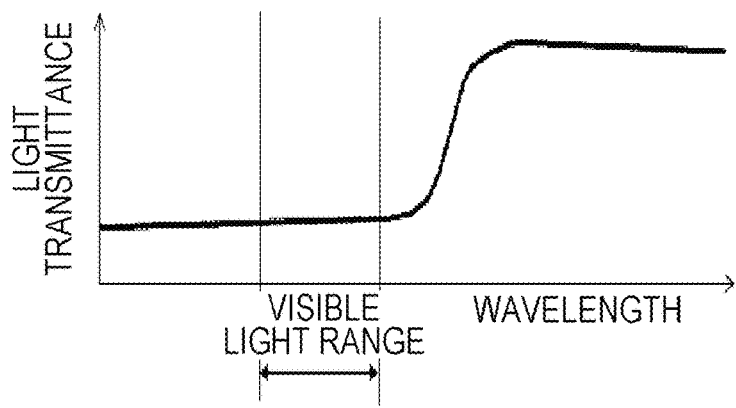
Figure 19C:
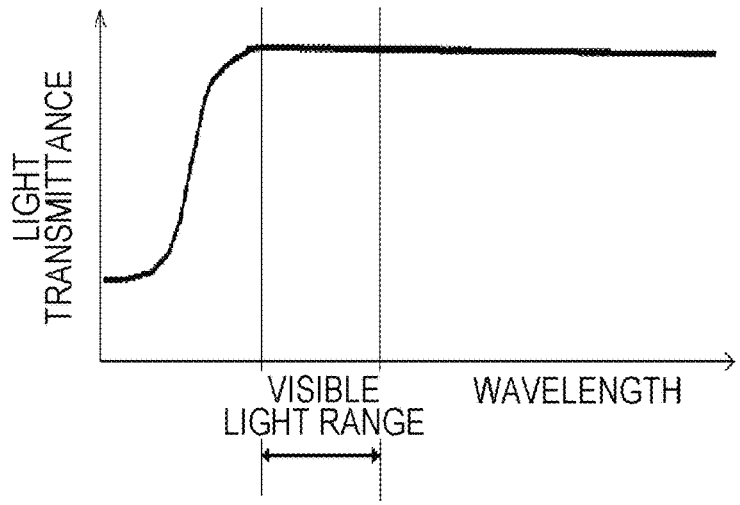

Note that, in the states illustrated in FIGS. 19A and 19B, modulation of light transmittance occurs in the infrared range. In this case, an infrared light cut filter is generally provided in a light entrance portion of an imaging device for visible light use. Accordingly, modulation of light transmittance illustrated in FIGS. 19A and 19B is not used. However, when modulation of light transmittance is necessary in the infrared range for monitoring use of the like, the infrared light cut filter is removed to use modulation of light transmittance illustrated in FIGS. 19A and 19B in an appropriate manner.

Figure 20A:
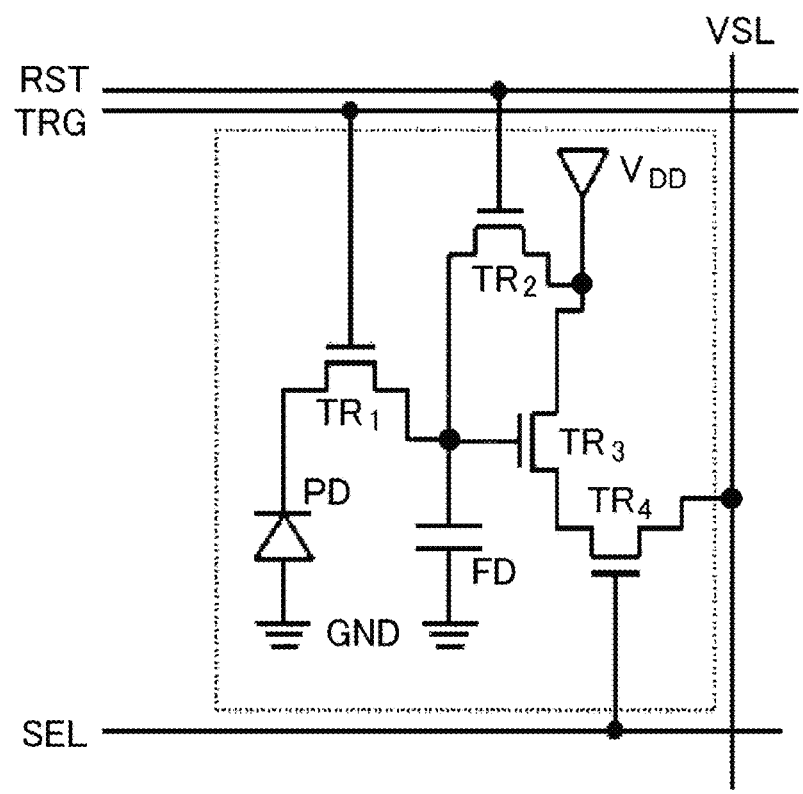
Figure 20B:
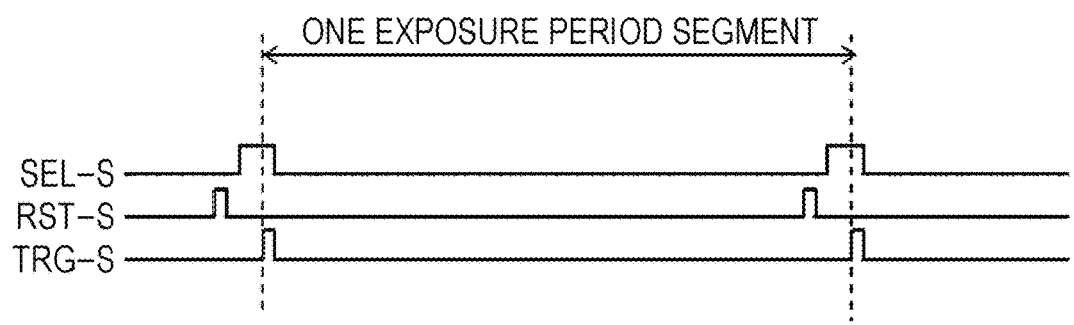
FIG. 20B is a view showing a control state for converting light entering the imaging element into an image output signal.

FIG. 20A illustrates a configuration of an internal circuit of the imaging element (pixel, PIX) constituting the imaging device according to the thirteenth embodiment, while FIG. 20B illustrates a control state for converting incident light of the imaging element into image output signals. More specifically, each of the imaging elements includes a light receiving element (photodiode) PD which receives incident light, performs photoelectric conversion of received light, and stores charges, a floating diffusion FD which temporarily stores charges generated by the light receiving element PD, a first transistor $TR_1$ which controls transfer of charges from the light receiving element PD to the floating diffusion FD, a second transistor $TR_2$ which resets charges in the floating diffusion FD, a third transistor $TR_3$ which extracts output signals (stored charge signals) in proportion to charges stored in the floating diffusion FD, and a fourth transistor $TR_4$ which controls reading of output signals (stored charge signals). As illustrated in FIG. 17, the pixel reset control signal line, the pixel transfer control signal line, and the pixel selection control signal line extend from the vertical scanning circuit 31 to each row. However, FIG. 20A illustrates the one pixel reset control signal line (RST), the one pixel transfer control signal line (TRG), and the one pixel selection control signal line (SEL). The first transistor $TR_1$ is connected to the pixel transfer control signal line (TRG), the second transistor $TR_2$ is connected to the pixel reset control signal line (RST), and the fourth transistor $TR_4$ is connected to the pixel selection control signal line (SEL). The fourth transistor $TR_4$ is further connected to the vertical signal line (VSL).

FIG. 20B illustrates timing for applying respective control signals. A horizontal axis represents time. The imaging element repeats operations for converting output signals (stored charge signals) into image output signals and outputting the image output signals at each end of the 16 exposure period segments (period $t_1$ to $t_6$), and also resetting the floating diffusion FD. At an end of the exposure period, a pixel reset control signal (RST-S) is initially applied to the second transistor $TR_2$ to reset a potential of the floating diffusion FD to a $V_{DD}$ level. Subsequently, a pixel selection control signal (SEL-S) is applied to read the reset potential of the floating diffusion FD into the vertical signal line (VSL) via the third transistor $TR_3$ and the fourth transistor $TR_4$. Thereafter, a pixel transfer control signal (TRG-S) is applied to the first transistor $TR_1$ in a state of continuous application of a pixel selection control signal (SEL-S) to transfer charges stored in the light receiving element PD in proportion to light having entered during the exposure period to the floating diffusion FD. A potential change of the floating diffusion FD thus produced is read into the vertical signal line (VSL) as image output signals via the third transistor $TR_3$ and the fourth transistor $TR_4$. Accordingly, differential signals discretized by the AD converter (ADC) and the memory (MEM) connected to the vertical signal line (VSL) are calculated from the continuously read image output signals, and output by the horizontal transfer circuit 33.

Figure 21:
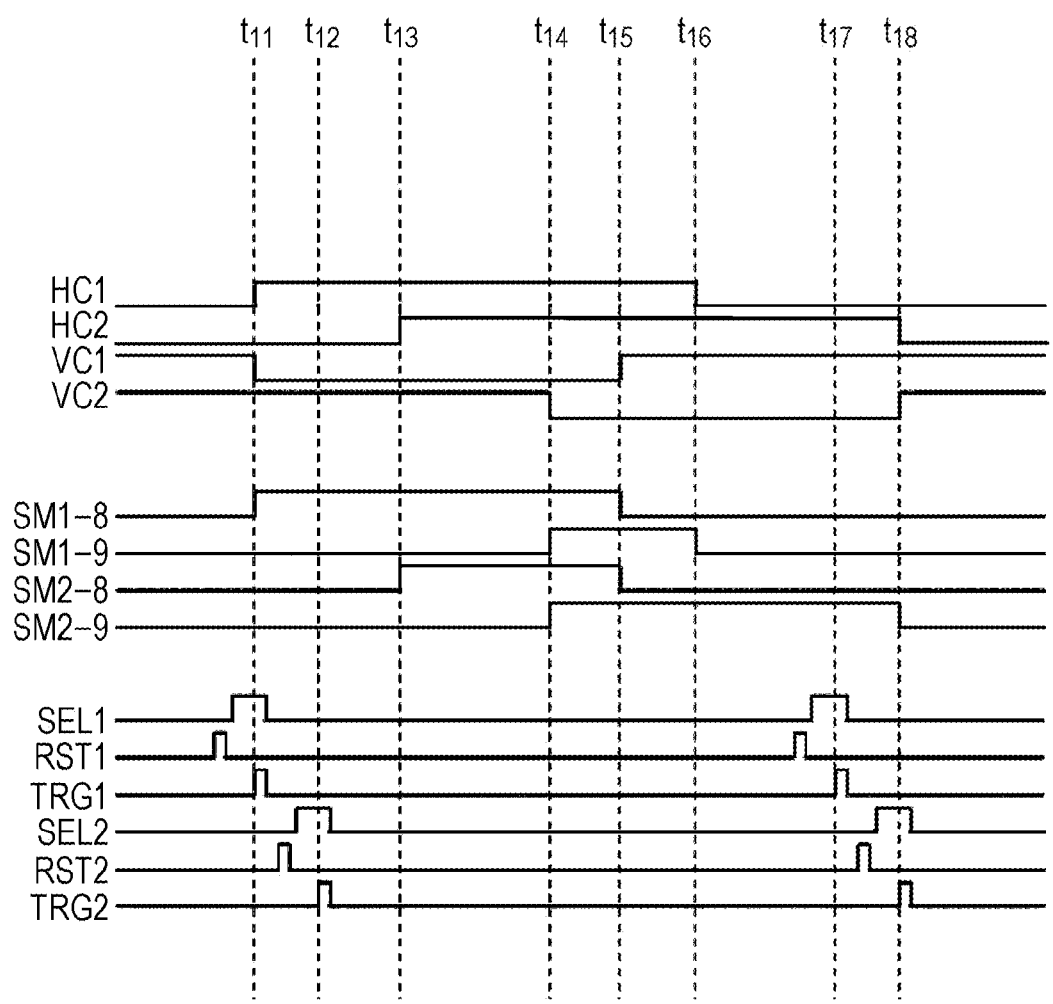
FIG. 21 is a view showing respective control signals of the pixel driving circuit for (two imaging elements)×(two imaging elements), and changes of light transmittance with time.

FIG. 21 illustrates respective control signals and changes of light transmittance of the respective imaging elements with time in the pixel driving circuit of (two imaging elements)×(two imaging elements). A horizontal axis in FIG. 21 represents time. In this case, HC1 and HC2 indicate voltages applied to the nano-carbon films (SM1, SM2) in the first row and the second row, respectively, while VC1 and VC2 indicate voltages applied to the nano-carbon films (SM8, SM9) in the first column and the second column, respectively These four voltages are applied in such a manner as to give the first specific voltage and the second specific voltage to the nano-carbon films in different timing. As described with reference to FIG. 18B, according to the light control devices constituting the respective imaging elements, light transmittance increases only when voltages applied to the nano-carbon film in the corresponding row and the nano-carbon film in the corresponding column simultaneously become the first specific voltage and the second specific voltage, respectively. For example, the voltage HC1 applied to the nano-carbon film in the first row (SM1) becomes the first specific voltage in the period from $t_{11}$ to $t_{16}$. In addition, the voltage HC2 applied to the nano-carbon film in the second row (SM2) becomes the first specific voltage in the period from $t_{13}$ to $t_{18}$. On the other hand, the voltage VC1 applied to the nano-carbon film in the first column (SM8) becomes the second specific voltage in the period from $t_{11}$ to $t_{15}$. In addition, the voltage VC2 applied to the nano-carbon film in the second column (SM9) becomes the second specific voltage in the period from $t_{14}$ to $t_{18}$. In this case, as a result, the imaging element SM1-8 including the light control device constituted by the nano-carbon film in the first row and the nano-carbon film in the first column exhibits high light transmittance of the light control device in the period from $t_{11}$ to $t_{15}$, and therefore receives light. Moreover, the imaging element SM1-9 including the light control device constituted by the nano-carbon film in the first row and the nano-carbon film in the second column exhibits high light transmittance of the light control device in the period from $t_{14}$ to $t_{16}$, and therefore receives light. Furthermore, the imaging element SM2-8 including the light control device constituted by the nano-carbon film in the second row and the nano-carbon film in the first column exhibits high light transmittance of the light control device in the period from $t_{13}$ to $t_{15}$, and therefore receives light. In addition, the imaging element SM2-9 including the light control device constituted by the nano-carbon film in the second row and the nano-carbon film in the second column exhibits high light transmittance of the light control device in the period from $t_{14}$ to $t_{18}$, and therefore receives light.

On the other hand, reset of the floating diffusion FD and charge transfer from the floating diffusion FD in the respective imaging elements are controlled by the three pixel control signals (RST1, TRG1, SEL1) in the first row, and the three pixel control signals (RST2, TRG2, SEL2) in the second row. The control timing is similar to the control timing described with reference to FIG. 20B. However, in a state that the first row and the second row use the same vertical signal lines (VSL1, VSL2), reading timing needs to be slightly shifted for each row. For example, the pixel transfer control signal (TRG1) in the first row is applied at $t_{11}$ and $t_{17}$, while the pixel transfer control signal (TRG2) in the second row is applied at $t_{12}$ and $t_{18}$. Transfer time of respective control signals for controlling operations of the imaging elements is shifted for each row. However, the length of the period from $t_{11}$ to $t_{17}$ and the length of the period from $t_{12}$ to $t_{18}$ are equalized with each other, and correspond to a frame period. In this case, the substantial exposure period of each imaging element corresponds to a period in which light transmittance of the corresponding light control device becomes large (high) in the frame period of the corresponding row.

As described above, reset and charge transfer of the internal circuit are performed in units of row under the same control. However, light transmittance of the light control devices corresponding to the respective imaging elements is varied for each imaging element. Accordingly, the substantial exposure periods of the respective imaging elements are different for each imaging element.

In addition, a light transmittance response speed is considered as one of characteristics of a nano-carbon film. A light transmittance response speed of graphene is in the order of giga-hertz. Accordingly, when pulse voltage is applied, modulation of light transmittance is achievable in accordance with pulse voltage. More specifically, charges in proportion to integration of pulse voltages are stored in a light receiving element.

According to the thirteenth embodiment, random pulse voltage is generated in each of the 16 exposure period segments to compress images, for example. FIG. 22 illustrates an example of random pulse voltage used in the thirteen embodiment. Different pulse voltage patterns are generated for each image element (pixel). FIG. 22 illustrates three pulse voltage patterns as examples of the different voltage patterns. Random pulse voltage is generated by the random pulse voltage generation and transmission device, and transmitted to each of the imaging elements. Thereafter, light transmittance modulation corresponding to the random pulse voltage is performed for each imaging element. As a result, images at various types of (for example, 16 types of) light transmittance are obtained within the 16 exposure period segments (indicated by dotted lines in FIG. 22). Signal processing is performed for these images to form compressed images. The compressed images are restored in a different device. Accordingly, reduction of signal processing by the imaging device, and reduction of output of obtained images are both achievable.

Figure 23A:
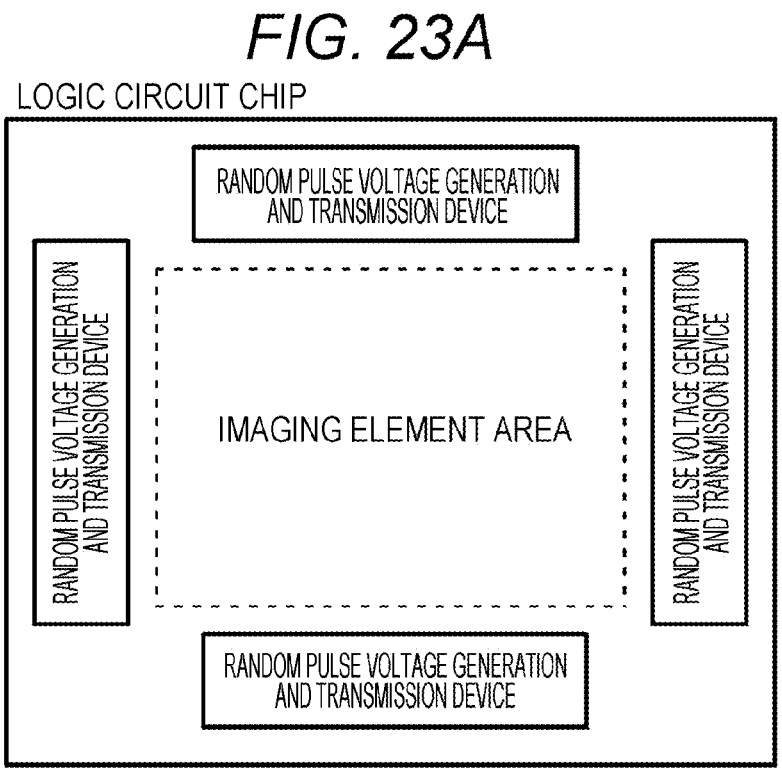
FIGS. 23A and 23B are views each of which illustrates a conceptual configuration of a logic circuit chip constituting the imaging device according to the thirteenth embodiment.
Figure 23B:
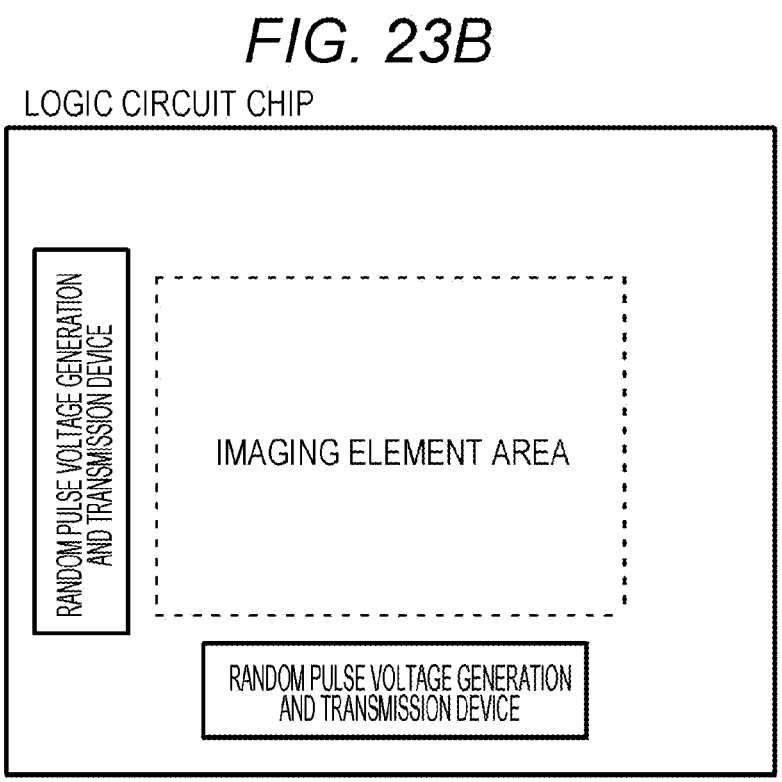
Figure 31A:
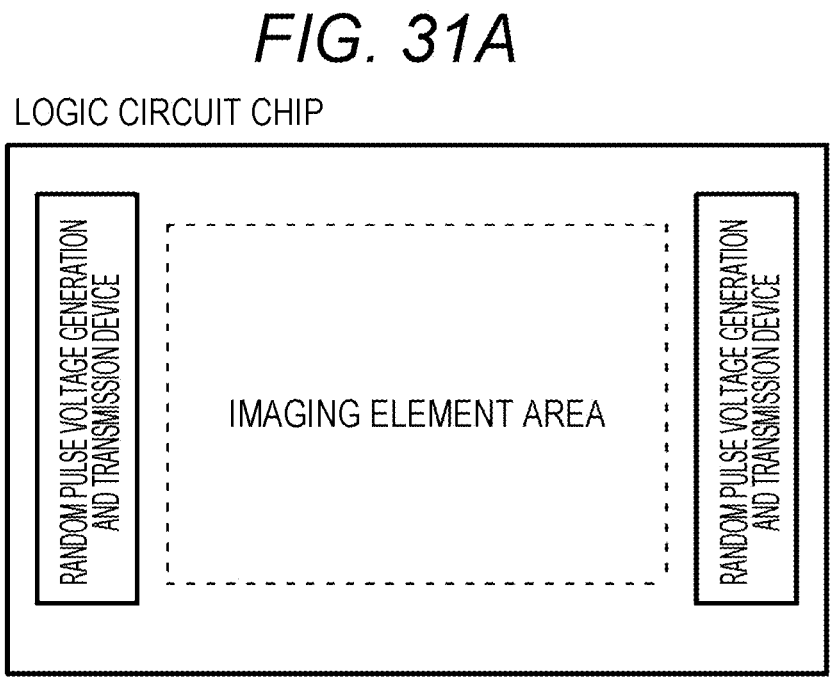
FIGS. 31A and 31B are views each of which illustrates a conceptual configuration of a logic circuit chip constituting an imaging device according to a fourteenth embodiment.
Figure 31B:
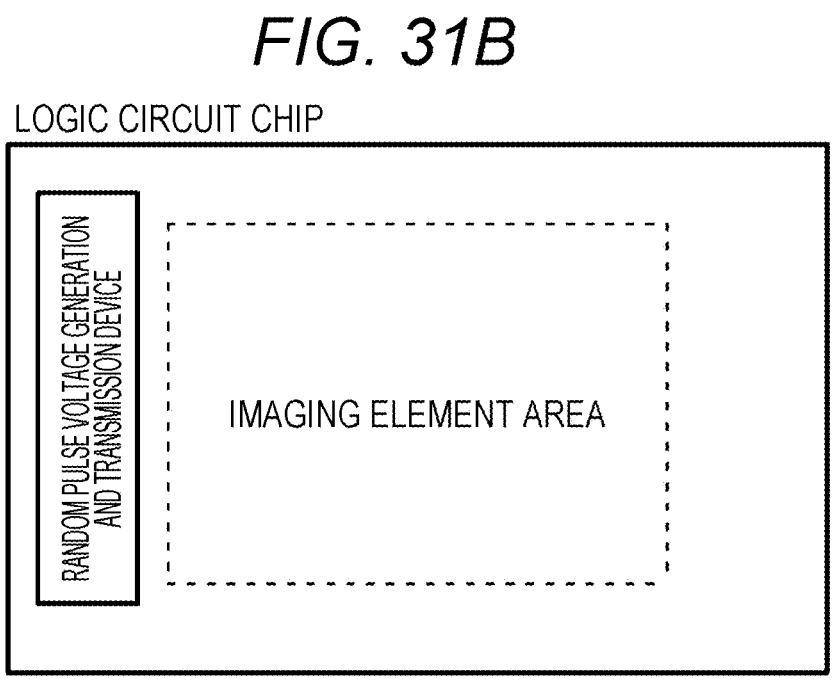

More specifically, the imaging device may be constituted by a laminated image sensor. In more detail, the imaging device may be produced by laminating (affixing) an image sensor chip (first semiconductor chip) corresponding to an assembly of rear-side illumination type imaging elements, and a logic circuit chip (second semiconductor chip) corresponding to an assembly of driving circuits. Each of FIGS. 23A and 23B illustrates a conceptual configuration of the logic circuit chip. A logic circuit region includes a driving circuit of the imaging elements including the pixel signal reading devices 16, and a signal processing circuit for image output signals read from the imaging elements, for example. The logic circuit chip includes the random pulse voltage generation and transmission devices for controlling light transmittance of the nano-carbon films. For example, the random pulse voltage generation and transmission devices are disposed in regions located in four directions and corresponding to parts of the logic circuit region not spatially overlapping with an imaging element region where the imaging elements are arranged (indicated as areas surrounded by dotted lines in FIGS. 23A and 23B and FIGS. 31A and 31B), for example (see FIG. 23A). Alternatively, the random pulse voltage generation and transmission devices are disposed in regions located outer areas in two directions when a propagation delay does not cause a problem (see FIG. 23B). In this configuration, random pulse voltage is generated for independent control of light transmittance for each image element. Each of the random pulse voltage generation and transmission devices includes an electrode for transmitting random pulse voltage. After laminated with the image sensor chip, this electrode is connected to connection wiring extending to the rear side of the image sensor chip, and further to the first wiring and the second wiring via a through-silicon via (TSV). When the random pulse voltage generation and transmission devices are disposed in the portion of the logic circuit region not spatially overlapping with the imaging element region (outer two sides or outer regions in four directions), a propagation delay caused by high contact resistance between the nano-carbon films and a TSV-embedded metal layer decreases. Note that according to the fourteenth embodiment described below, the random pulse voltage generation and transmission devices may be disposed in regions located on two outer sides and corresponding to a portion of the logic circuit region not spatially overlapping with the imaging element region where the imaging elements are arranged as illustrated in FIG. 31A, or may be disposed on a region located only on one outer side as illustrated in FIG. 31B when a propagation delay does not cause a problem, in addition to the positions illustrated in FIGS. 23A and 23B.

Figure 24:
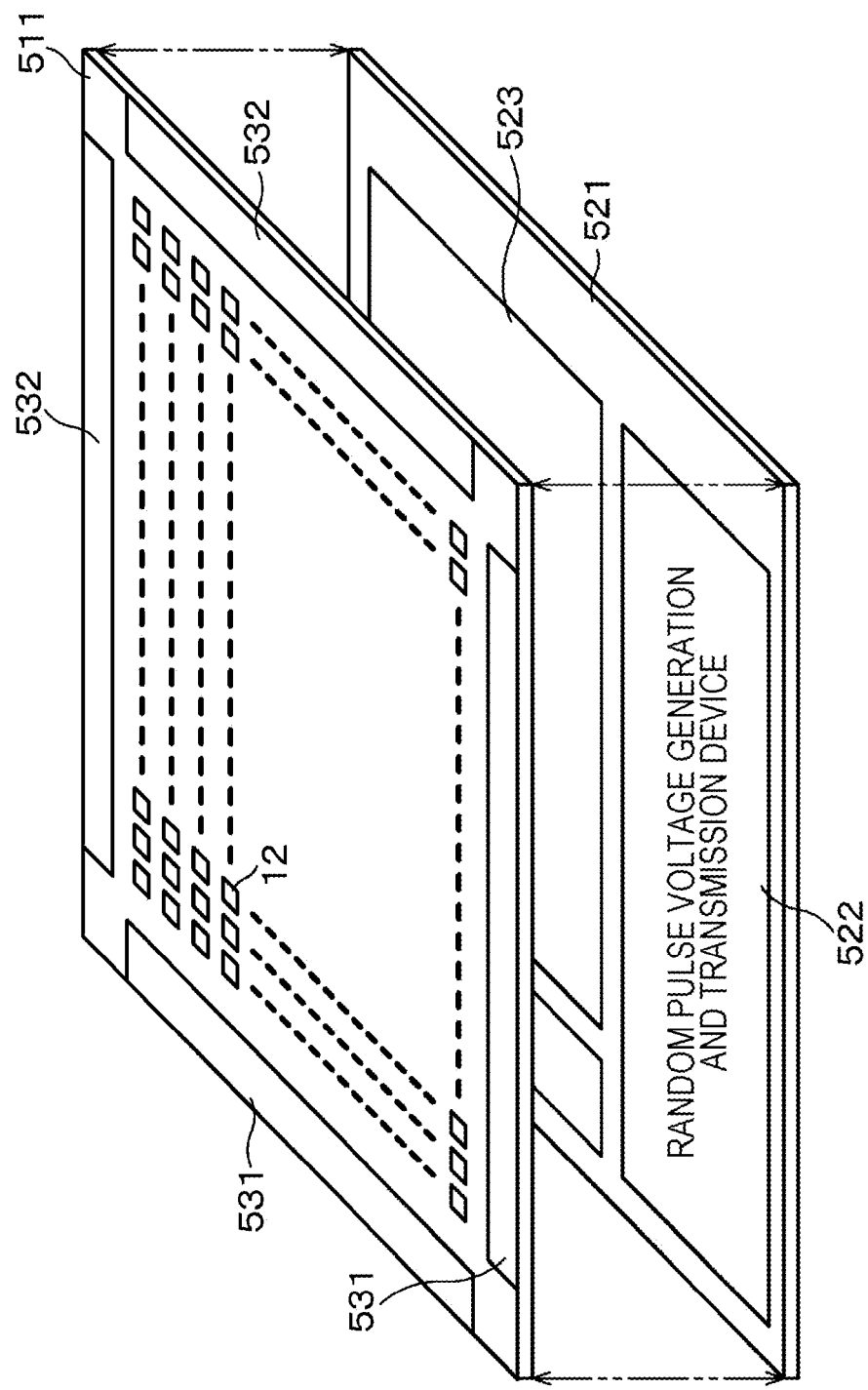
FIG. 24 is a conceptual view of an imaging device which has a structure including a lamination of a first semiconductor chip and a second semiconductor chip as the imaging device of the thirteenth embodiment.

FIG. 24 illustrates a conceptual view of an example of a laminated image sensor shown in FIG. 23B. The imaging elements 12 arranged in two-dimensional matrix in this example are provided on a first semiconductor chip (image sensor chip) 511, while random pulse voltage generation and transmission devices 522, each of which generates random pulse voltage and transmits generated random pulse voltage to the imaging elements including light control devices, are provided on a second semiconductor chip (logic circuit chip) 521. Note that FIG. 24 illustrates only the one random pulse voltage generation and transmission device 522. In this case, the first semiconductor chip 511 and the second semiconductor chip 521 are laminated on each other by a known method. Note that FIG. 24 illustrates a separated state of the first semiconductor chip 511 and the second semiconductor chip 521 for convenience of explanation. The light control devices and the random pulse voltage generation and transmission device 522 herein are connected to each other via through-silicon vias (TSV) 531. Alternatively, these components may be connected via a bump (mode based on chip-on-chip system). Note that the imaging elements may be either of a rear-side illumination type or a front-side illumination type. Various circuits 523 including a clock circuit for driving and controlling the imaging elements are further provided on the second semiconductor chip 521.

In addition, the AD converters 13 constituted by single slope type AD converters are provided on the second semiconductor chip (logic circuit chip) 521. The AD converters 13 and the imaging elements 12 are also connected to each other via the through-silicon vias (TSV) 531.

Figure 25:
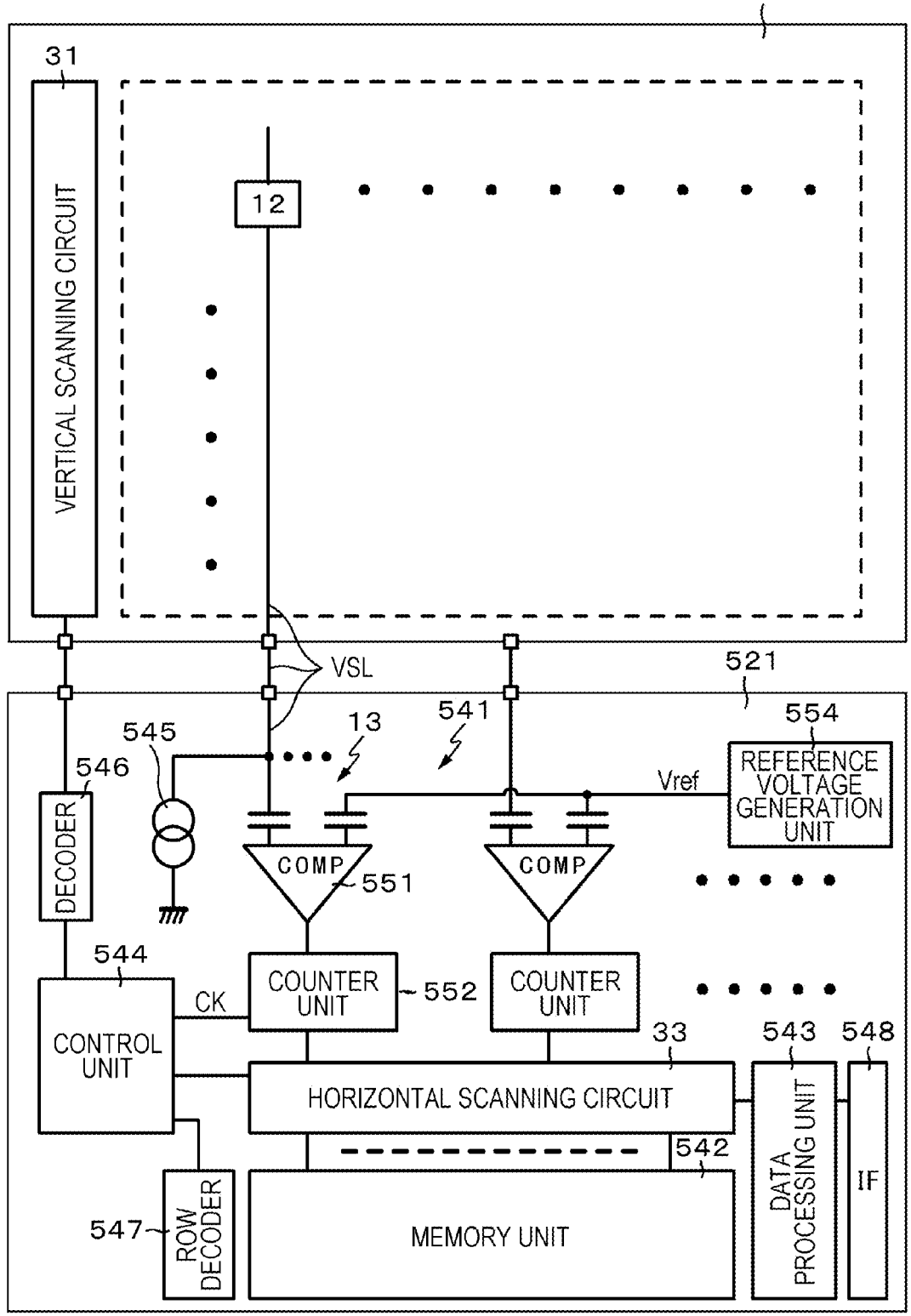
FIG. 25 is a circuit diagram illustrating a specific configuration of a first semiconductor chip side circuit and a second semiconductor chip side circuit of the imaging device according to the thirteenth embodiment.

As illustrated in a conceptual view in FIG. 25, the first semiconductor chip 511 includes the imaging elements 12 and the vertical scanning circuit 31. On the other hand, the second semiconductor chip 521 includes a single processing unit 541. The signal processing unit 541 is constituted by the AD converters 13 each of which includes a comparator 551 and a counter unit 552, a ramp voltage generator (hereinafter also referred to as "reference voltage generation unit") 554, the horizontal transfer circuit 33 including a data latch unit and a parallel-serial conversion unit, a memory unit 542 (memory 17), a data processing unit 543, a control unit 544 (including clock supply unit connected to AD converters 13), a current source 545, a decoder 546, a row decoder 547, and an interface (IF) unit 548.

Each of the AD converters 13 constituted by single slope type AD converters includes: the ramp voltage generator (reference voltage generation unit) 554; the comparator 551 to which analog signals obtained by the imaging elements 12 and ramp voltage received from the ramp voltage generator (reference voltage generation unit) 554 are input; and the counter unit 552 which receives a clock CK from a clock supply unit (not shown) included in the control unit 544 and operates on the basis of output signals received from the comparator 551. The clock supply unit is constituted by a phase locked loop (PLL) circuit.

As described above, the second semiconductor chip 521 includes the memory unit 542, the data processing unit 543, the control unit 544, the current source 545, the decoder 546, the row decoder 547, the interface (IF) unit 548 and others, and further includes an imaging element driving unit (not shown) for driving the imaging elements 12. The signal processing unit 541 performs predetermined signal processing including digitization (AD conversion) in units of column and in parallel (column parallel) for analog signals read from the imaging elements 12. In this case, the signal processing unit 541 includes the AD converters 13 for digitizing the analog signals received from the imaging elements 12, and transmits image data (digital data) after AD conversion to the memory unit 542. The memory unit 542 stores image data subjected to predetermined signal processing by the signal processing unit 541. The memory unit 542 may be constituted by either a non-volatile memory, or a volatile memory. The data processing unit 543 reads image data stored in the memory unit 542 in a predetermined order, performs various processes, and outputs the processed data to the outside of the chip. The control unit 544 controls respective operations of the signal processing unit 541 such as the imaging element driving unit, the memory unit 542, the data processing unit 543 and others on the basis of reference signals such as horizontal synchronous signals, vertical synchronous signals, and master clocks given from the outside of the chip, for example. In this case, the control unit 544 performs control in synchronization with circuits on the first semiconductor chip 511 side (vertical scanning circuit 31 and imaging elements 12), and the signal processing unit 541 on the semiconductor chip 521 side (such as memory unit 542 and data processing unit 543).

The current source 545 connects to each of the vertical signal lines VSL through which analog signals are read from the corresponding imaging element 12 for each column. For example, the current source 545 has a so-called load metal-oxide-semiconductor (MOS) circuit configuration constituted by MOS transistors each of which has a gate potential biased to a fixed potential so as to supply certain constant current to the vertical signal line VSL. The current source 545 constituted by the load MOS circuit supplies constant current to the fourth transistor $TR_4$ of the imaging element 12 included in the selected row to operate the fourth transistor $TR_4$ as a source follower. At the time of selection of the imaging elements 12 in units of row, the decoder 546 gives an address signal for designating the selected row to the vertical scanning circuit 31 under control by the control unit 544. Under control by the control unit 544, the row decoder 547 writes image data to the memory unit 542, or designates a row address used for reading image data from the memory unit 542.

As described above, the signal processing unit 541 includes the AD converters 13 which digitizes (performs AD conversion) analog signals read from the imaging elements 12 through the vertical signal lines VSL to perform signal processing for analog signals in units of column in parallel (column parallel AD). The signal processing unit 541 further includes the ramp voltage generator (reference voltage generation unit) 554 which generates a reference voltage $V_{ref}$ used for AD conversion by the AD converters 13. The reference voltage generation unit 554 generates the reference voltage $V_{ref}$ having a so-called ramp waveform (inclined waveform) whose voltage value changes stepwise with an elapse of time. The reference voltage generation unit 554 may be constituted by a DA converter (digital-analog converter), but is not limited to this example.

Each of the AD converters 13 generates a pulse signal having a size (pulse width) in a time-axis direction corresponding to a level of an analog signal, and measures a length of a pulse width period of a generated pulse signal to perform AD conversion processing. More specifically, each of the AD converters 13 includes at least the comparator (COMP) 551 and the counter unit 552. The comparator 551 compares comparison input constituted by an analog signal (signal level and reset level) read from the imaging element 12 via the vertical signal VSL with reference input constituted by a reference voltage having a ramp waveform and supplied from the reference voltage generation unit 554. The ramp waveform is a waveform of voltage which changes with inclination (stepwise) with an elapse of time. In this case, output of the comparator 551 comes to a first state (such as high level) when the reference voltage is larger than the analog signal. On the other hand, the output comes to a second state (such as low level) when the reference voltage is the analog signal or lower. The output signal of the comparator 551 becomes a pulse signal having a pulse width corresponding to a level of an analog signal.

For example, the counter 552 is constituted by an up/down counter. The clock CK is given to the counter unit 552 at the same timing as supply start timing of reference voltage to the comparator 551. The counter unit 552 constituted by an up/down counter executes down count or up count in synchronization with the clock CK to measure a pulse width period of an output pulse of the comparator 551, i.e., a comparison period from a start of a comparison operation to an end of the comparison operation. Concerning a reset level and a signal level sequentially read from the imaging element 12, the counter unit 552 executes down count for the reset level, and up count for the signal level in the measurement operation. In this case, a difference between the signal level and the reset level is calculated on the basis of these down count and up count operations. After calculation of the difference, the AD converter 13 performs a correlated double sampling (CDS) process in addition to the AD conversion process. The "CDS process" herein refers to a process for calculating a difference between a signal level and a reset level to remove fixed pattern noise peculiar to the imaging elements 12, such as reset noise of each imaging element and variations of a threshold of the fourth transistor $TR_4$. In this case, a count result (count value) of the counter unit 552 becomes a digital value (final mode of pixel signal) corresponding to a digitized analog signal.

Figure 26:
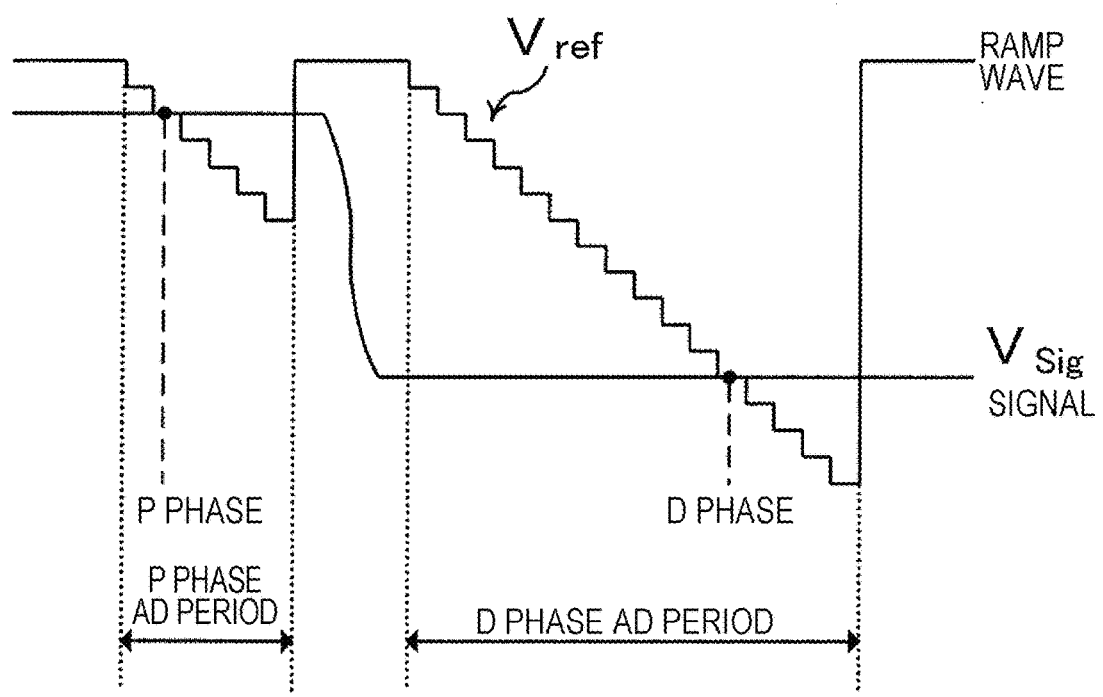
FIG. 26 is a timing chart explaining operation of a single slope type analog-digital converter included in the imaging device according to the thirteenth embodiment.

Alternatively, FIG. 26 shows a different example of a timing chart of the single slope type analog-digital converter. Each of the comparators 551 disposed for corresponding column compares an analog signal (signal level) received from the imaging element 12 with the reference signal $V_{ref}$ which changes stepwise. At this time, the counter unit 552 counts by using the reference clock CK until levels of the analog signal (signal level $V_{Sig}$) and the reference signal $V_{ref}$ cross each other to reverse output of the comparator 551. As a result, the analog signal is converted into a digital signal (i.e., subjected to AD conversion). The counter unit 552 is constituted by a down counter. AD conversion is performed twice for each reading of analog signals. More specifically, the first AD conversion is performed at a reset level (P phase) of the imaging elements 12. The reset level P phase contains variations of each imaging element. The second AD conversion is performed when analog signals obtained from the respective imaging elements 12 are read into the vertical signal lines VSL (D phase). The D phase also contains variations for each imaging element. Accordingly, (D phase level-P phase level) is executed to realize a correlated double sampling (CDS) process.

FIG. 27 is a block diagram illustrating a specific configuration example of the signal processing unit 541. The horizontal scanning circuit 33 includes a data latch unit 555 and a parallel-serial conversion unit 556, and constitutes a pipeline configuration which achieves pipeline transfer of image data digitized by the AD converters 13 to the memory unit 542. Furthermore, in this case, the AD converters 13 perform a digitizing process in one horizontal period (one imaging frame), whereafter the digitized image data is transferred to the data latch unit 555 in subsequent one horizontal period. The data latch unit 555 herein latches image data digitized by the AD converters 13. In addition, the parallel-serial conversion unit 556 converts image data output from the data latch unit 555 into serial data. On the other hand, the memory unit 542 includes a column decoder and sense amplifier 549 as a peripheral circuit of the memory unit 542. While the row decoder 547 (see FIG. 25) designates a row address for the memory unit 542, the column decoder designates a column address for the memory unit 542. Moreover, the sense amplifier amplifies low voltage read from the memory unit 542 via a bit line to a level sufficient for handling the voltage as a digital level. The image data thus read through the column decoder and sense amplifier 549 is output to the outside of the second semiconductor chip 521 via the data processing unit 543 and the interface unit 548. Note that the "parallel-serial conversion unit" is expressed as "para-seri conversion unit" in the figure. In addition, FIG. 25 does not show the parallel-serial conversion unit 556 and the column decoder and sense amplifier 549.

A pad unit 532 for electric connection with the outside, and a TSV 531 for electric connection with the second semiconductor chip 521 are provided on a peripheral portion of the first semiconductor chip 511. Moreover, a bonding pad portion and an opening may be formed in the second semiconductor chip 521 on the lower side and the first semiconductor chip 511, respectively, to provide wire bonding in the bonding pad portion of the second semiconductor chip 521 via the opening of the first semiconductor chip 511. Furthermore, a substrate may be mounted from the second semiconductor chip 521 by using a TSV structure. Alternatively, electric connection between the imaging elements 12 of the first semiconductor chip 511 and various circuits of the second semiconductor chip 521 may be made via a bump on the basis of a chip-on-chip system.

According to the thirteen embodiment as described above, images formed by using the imaging elements are compressed to reduce the size of output images. As a result, power consumption of the imaging device decreases to approximately one fifth of power consumption of a conventional imaging device.

Figure 28A:
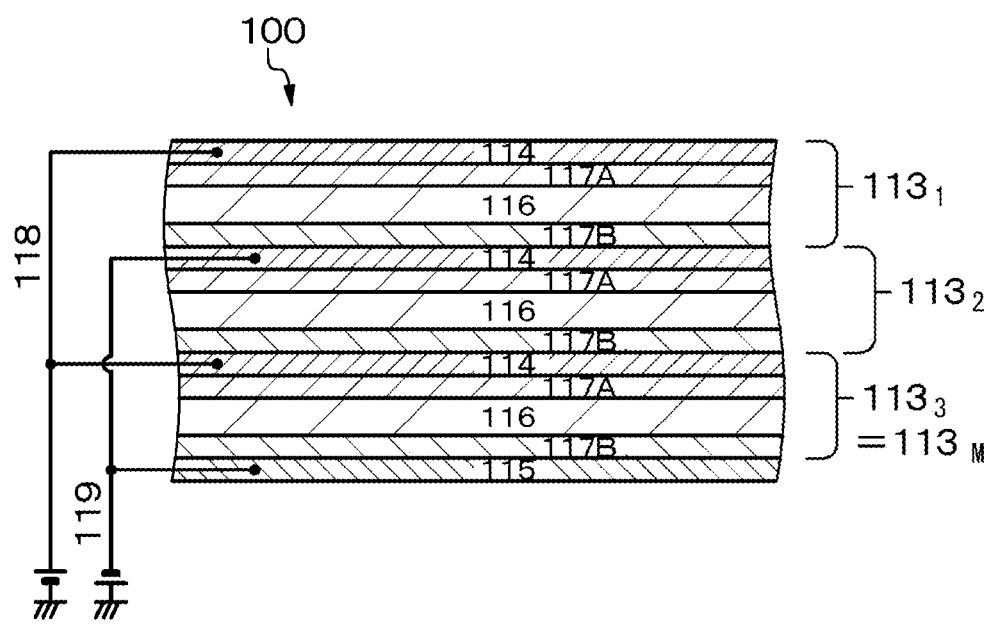
FIGS. 28A and 28B are schematic cross-sectional views of a light control device of an imaging element constituting an imaging device according to a modified example of the thirteenth embodiment.
Figure 28B:
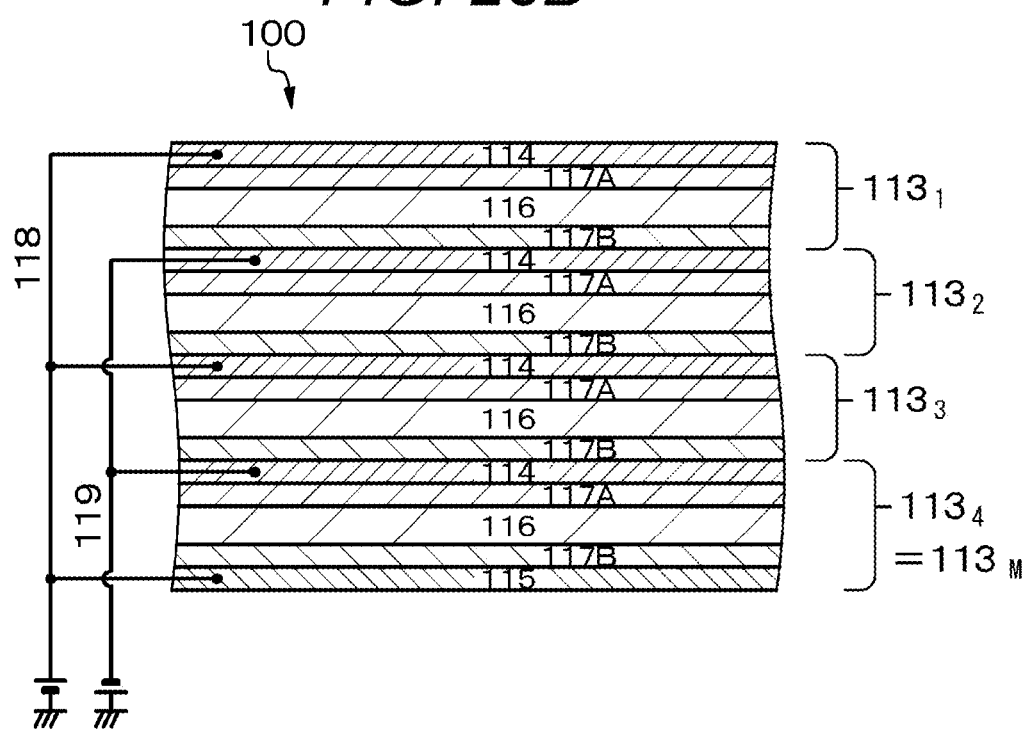

Each of FIGS. 28A and 28B is a schematic cross-sectional view of a modified example of the light control device of the imaging element constituting the imaging device according to the thirteenth embodiment. Note that a light control device illustrated in FIG. 28A is a modified example of the light control device (light control element) illustrated in FIG. 8A, while a light control device (light control element) illustrated in FIG. 28B is a modified example of the light control device (light control device) illustrated in FIG. 8B. According to these modified examples, random pulse voltage includes random pulse voltage having positive polarity, and random pulse voltage having negative polarity. In this case, when random pulse voltage having positive polarity is applied to a first nano-carbon film, random pulse voltage having negative polarity is applied to a second nano-carbon film. Alternatively, random pulse voltage having positive polarity may be applied to the second nano-carbon film, while random pulse voltage having negative polarity may be applied to the first nano-carbon film.

Figure 29:
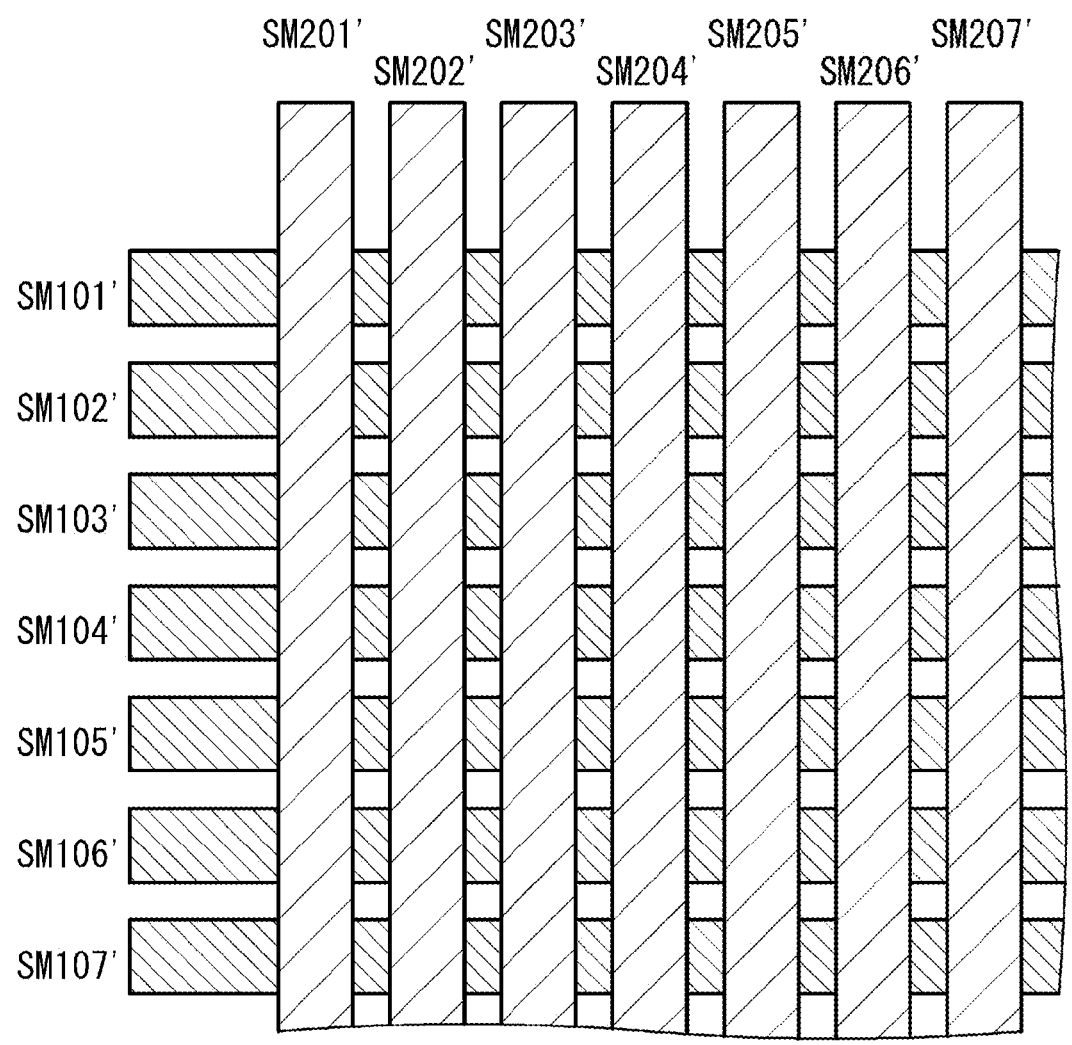
FIG. 29 is a view schematically illustrating arrangement of a part of imaging elements constituting the imaging device according to the modified example of the thirteenth embodiment.

As illustrated in FIG. 29 herein which shows positioning of a part of the imaging elements arranged in two-dimensional matrix, each of a plurality of first nano-carbon films (or a plurality of second nano-carbon films) SM101' through SM107' and others of the light control device constituting respective imaging elements arranged in the row direction is common to the imaging elements arranged in the row direction (i.e., occupying one row). On the other hand, each of a plurality of second nano-carbon films (or a plurality of first nano-carbon films) SM201' through SM207' and others of the light control device constituting respective imaging elements arranged in the column direction is common to the imaging elements arranged in the column direction (i.e., occupying one column). The nano-carbon films SM101' through 107' and the nano-carbon film 201' are alternately laminated. Similarly, the nano-carbon films SM101' through 107' and each of the nano-carbon films SM202', SM203', SM204', SM205', SM206', and SM207' are alternately laminated. Note that, in FIG. 29 and FIG. 30 referred to below, diagonal lines are drawn on the first nano-carbon films and the second nano-carbon films for clarifying these films. In this case, random pulse voltages having positive and negative polarities are applied to the first nano-carbon films and the second nano-carbon films, i.e., random pulse voltages are applied in units of row and in units of column to control light transmittance of the light control device constituting each of the imaging elements by using an AND circuit logic. This configuration therefore eliminates the necessity of providing wiring for applying random pulse voltage in the vicinity of the imaging elements, and achieves simplification of wiring. Note that each of the nano-carbon films is patterned in a band shape. Problems such as stray light and color mixture securely decrease by increasing each width of the band-shaped nano-carbon films to a size sufficiently larger than the size of the light receiving elements.

Figure 30:
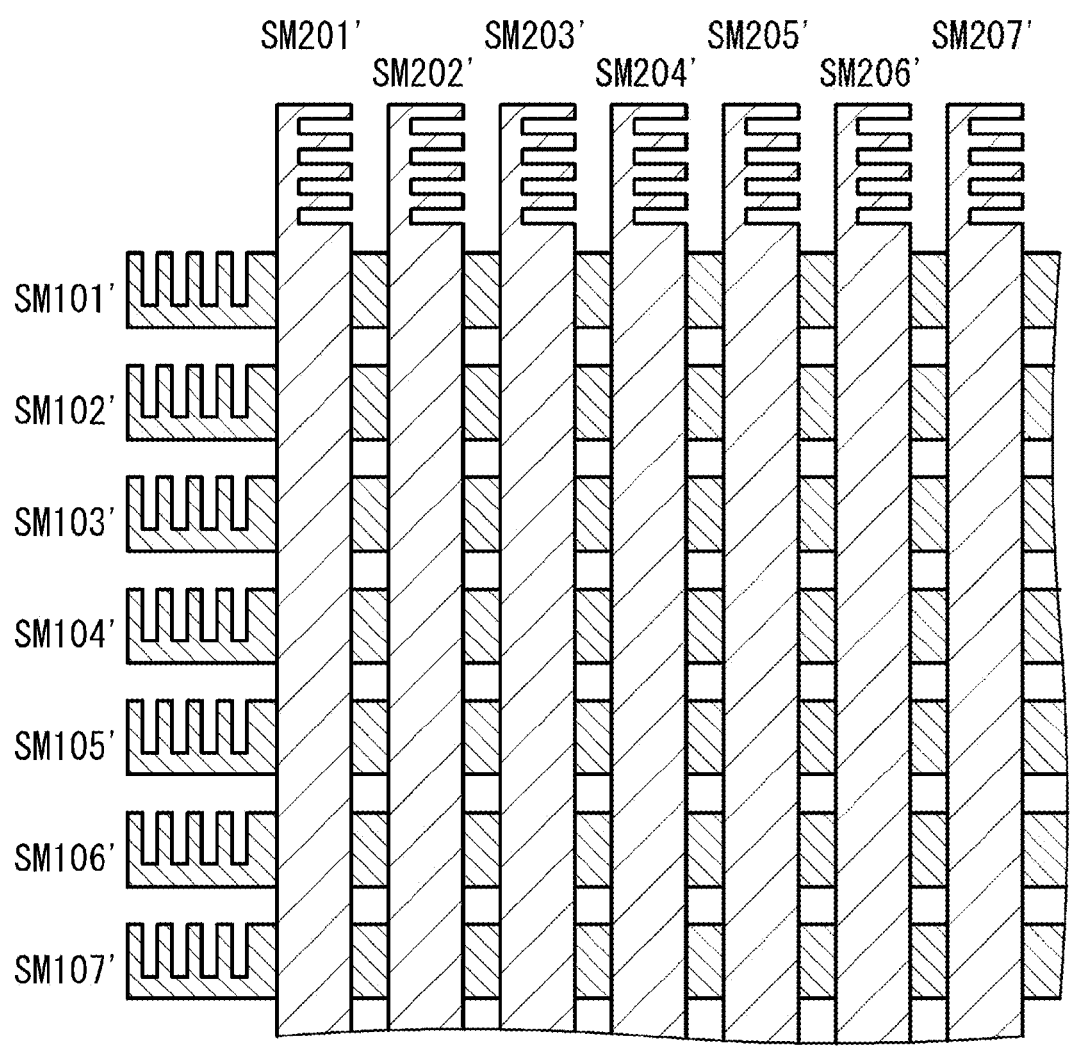
FIG. 30 is a view schematically illustrating arrangement of a part of imaging elements constituting an imaging device according to another modified example of the thirteenth embodiment.

In addition, FIG. 30 schematically illustrates positioning of a part of the imaging elements arranged in two-dimensional matrix in the modified example. Incidentally, integration of contact resistance values between the nano-carbon films and the connection wiring may affect high-speed light transmittance modulation of the nano-carbon films as a result of high-speed light transmittance modulation of the nano-carbon films, increase in the number of the imaging elements, and lamination of the nano-carbon films. For overcoming this problem, there may be adopted such a configuration which patterns an end of each of the first nano-carbon films extending in the first direction into a shape of a comb-shaped electrode, and patterns an end of each of the second nano-carbon films extending in the second direction into a shape of a comb-shaped electrode. More specifically, according to the example illustrated in FIG. 30, each end of the first nano-carbon films (or second nano-carbon films) SM101' through SM107' and others of the light control device constituting each of the imaging elements arranged in the row direction, and each end of the second nano-carbon films (or first nano-carbon films) SM201' through SM207' and others of the light control device constituting each of the imaging elements arranged in the column direction are patterned into a shape of a so-called comb-shaped electrode. For example, it is assumed that a circumference of each end is set to a length approximately 20 times larger. This configuration decreases contact resistance between the nano-carbon film and the contact wiring to approximately 1/20. Note that a practical imaging device requires a certain dead space between an effective pixel region and a chip end for prevention of shading. Accordingly, when the end of the nano-carbon film is drawn out by utilizing this space, the end of the nano-carbon film is drawn by approximately 0.1 mm at the maximum. Generally, a contact portion between a nano-carbon film and metal has high contact resistance, and delays electric signals. A nano-carbon film has low resistance, but exhibits high contact resistance with respect to metal due to low electronic density around a Fermi level. When the end of the nano-carbon film has a comb-shaped electrode shape as in this example, however, the contact area between this end and the connection wiring increases. As a result, contact resistance with the connection wiring decreases.

For example, when a pixel size is 1 μm square, connection resistance between graphene and connection wiring becomes $10 \times^{-5} \times 10^7 \times 10^4 = 10^6$ ohm. Charges in each imaging element range from $40 \times 10^{-6} \times 10^{--8}$ to 0.4 pC. In this case, a (virtual) capacity becomes approximately $(0.4)/4=0.1$ pF. Accordingly, time constant RC of a type of capacitor constituted by graphene is estimated as $RC=(10^3+10^6) \times 0.1 \approx 100$ nanoseconds. For example, when an imaging device containing 1,000,000 pixels (1,000 pixels×1,000 pixels) is used, 1,000 columns of capacities for one row are added. In this case, a switching speed on the positive and negative polarity sides becomes approximately 200 microseconds. In case of driving at an imaging frame rate of 100 fps for a still image, one imaging frame becomes 10 milliseconds. Assuming that pulse voltage rises at approximately 1/10 of this speed, a rising time of pulse voltage needs 1 millisecond, for example. The speed of 200 microseconds is shorter than the required switching speed of 1 millisecond. However, considering that (A) increase in capacities with arise of the pixel number, (B) extremely higher actual contact resistance between graphene and connection wiring than the above contact resistance, and (C) possible fluctuations in capacities as a result of process fluctuations and other effects, low contact resistance is more preferable.

Fourteenth Embodiment

The fourteen embodiment is a modification of the thirteenth embodiment. According to the thirteenth embodiment, the nano-carbon film control first signal line and the nano-carbon film control second signal line constitute a type of "AND circuit" to control light transmittance of the nano-carbon films. According to the fourteenth embodiment, however, random pulse voltage is applied to each of imaging elements. This configuration then produces arbitrary patterns as application patterns of random pulse voltage to the imaging elements. Note that it is preferable herein that C mode of the present disclosure is adopted in the fourteenth embodiment.

More specifically, random pulse voltage is applied from a random pulse voltage generation and transmission device to a first electrode or a second electrode of a light control device constituting each of the imaging elements. As a result, light transmittance of the light control device of each of the imaging elements varies at random. More specifically, light transmittance of the light control device of each of the imaging elements varies at random from a low value to a high value. In this case, an integrated amount of random pulse voltages corresponds to a stored charge amount of the light receiving element. Accordingly, charges are stored in the light receiving element by continuous application of random pulse voltage for a predetermined time. As described above, light transmittance modulation in accordance with random pulse voltage is randomly performed for each imaging element in each of 16 exposure period segments, for example, i.e., light transmittance is varied for each imaging element (each pixel) in each of 16 exposure period segments, for example, to form images. Thereafter, moving images are restored on the basis of the images thus formed. Note that the number of exposure period segments (16 in this example) is appropriately selected in accordance with a compression rate.

Note that, according to this embodiment, the first electrode, the first nano-carbon film, the second electrode, and the second nano-carbon film are formed in each of the imaging elements. However, the first electrode, the first nano-carbon film, and the second nano-carbon film may be independently formed for each of the imaging elements, while the second electrode may be an electrode common to all the imaging elements. Alternatively, the first nano-carbon film, the second nano-carbon film, and the second electrode may be independently formed for each of the imaging elements, while the first electrode may be an electrode common to all the imaging elements. The positional relationship between the first electrode or the second electrode and the first nano-carbon film or the second nano-carbon film herein is a relative relationship. Accordingly, the first nano-carbon film may be disposed adjacent to the first electrode, or the second nano-carbon film may be disposed adjacent to the first electrode. Assuming herein that the uppermost electrode and the uppermost nano-carbon film are the first film and the second film, respectively, and that the lowermost nano-carbon film and the lowermost electrode are the (U-1) th (U: 4 or larger natural number) and the Uth film, respectively, the odd-numbered films are electrically connected to each other via a first contact hole (not shown), while the even-numbered films are electrically connected via a second contact hole (not shown). When the second electrode is provided as a film common to all the imaging elements, the first electrode is connected to one of lines connected to the random pulse voltage generation and transmission device so that random pulse is applied to the first electrode. The second electrode is grounded. On the other hand, when the first electrode is provided as a film common to all the imaging elements, the second electrode is connected to one of lines connected to the random pulse voltage generation and transmission device so that random pulse is applied to the second electrode. The first electrode is grounded. For example, a bilayer wiring process using a transparent conductive film or a nano-carbon film may be adopted for connection wiring between the random pulse voltage generation and transmission device and the first electrode or the second electrode so as not to block incident light.

According to the fourteenth embodiment, image compression is similarly performed by generating random pulse voltage in the 16 exposure period segments, for example. The random pulse voltage generation and transmission device generates 16 types of random pulse voltage, for example, for each (seven imaging elements)×(seven imaging elements), i.e., 49 pixels, and transmits random pulse voltage to each of the imaging elements. Thereafter, light transmittance modulation corresponding to random pulse voltage is performed in each of the imaging elements. As a result, images at various types of (such as 16 types of) light transmittance are formed in the 16 exposure period segments, and subjected to signal processing to produce compressed images. The compressed images are restored in a different device. Accordingly, reduction of signal processing by the imaging device, and reduction of output of obtained images are both achievable.

Fifteenth Embodiment

A fifteenth embodiment is a modification of the thirteenth and fourteenth embodiments. According to the thirteenth and fourteenth embodiments, the random pulse voltage generation and transmission device is used to generate random pulse voltage. According to the fifteenth embodiment, however, pulse voltage calculated on the basis of an output signal (stored charge signal) obtained by an imaging element including a light control device is applied to a nano-carbon film as random pulse voltage. Note that an image output signal received from the imaging element including the light control device is compressed by thinning of the image output signal in space and time according to the fifteenth embodiment. More specifically, information on the inside of the imaging element is utilized for generation of random pulse voltage. In more detail, at the time of random exposure realized by the light control device, random pulse voltage is generated on the basis of random information originally contained in the imaging element.

In further detail, in the fifteenth embodiment, attention is paid to variations included in the light receiving element (photo sensor, photodiode, photoelectric conversion element) 27 constituting the imaging element. In this case, a signal (output signal, stored charge signal) received from the light receiving element 27 is converted into a constant by a lock circuit, and standardized at a pulse potential to generate random pulse voltage. More specifically, (photo diode signal/voltage applied to transistor+reference potential) is calculated for each imaging element by using the logic circuit. The calculated value is amplified, and transmitted to the light control device to realize random exposure.

Figure 32A:
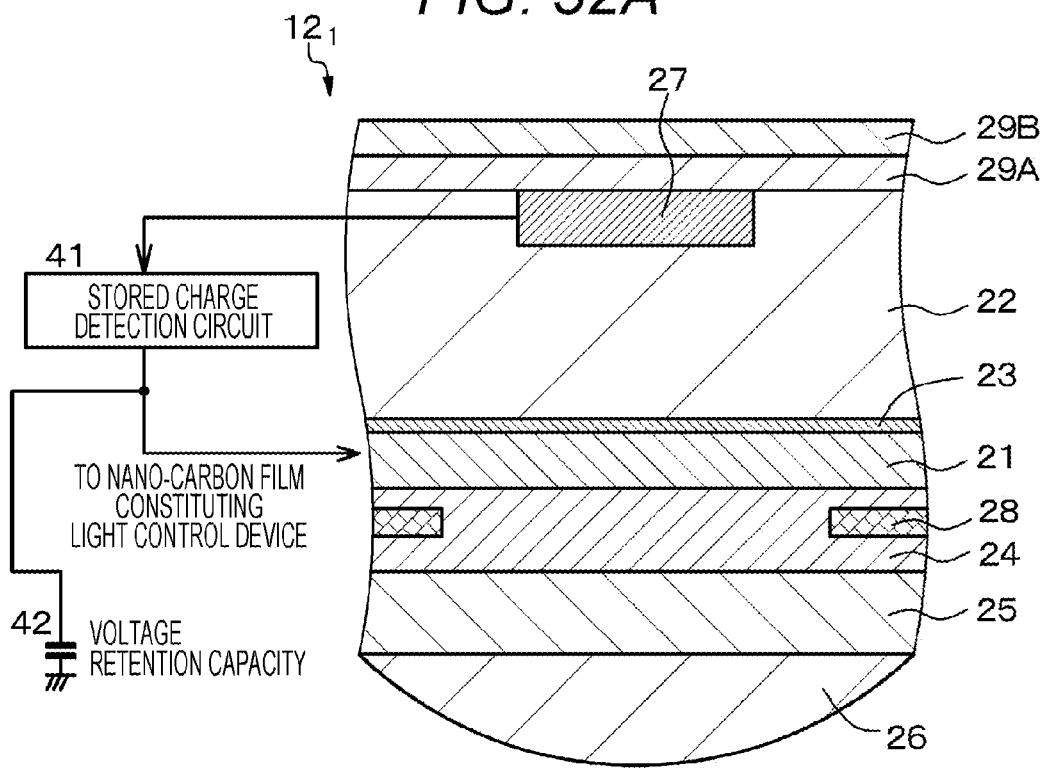
FIGS. 32A and 32B are conceptual views of an imaging element according to a fifteenth embodiment.
Figure 32B:
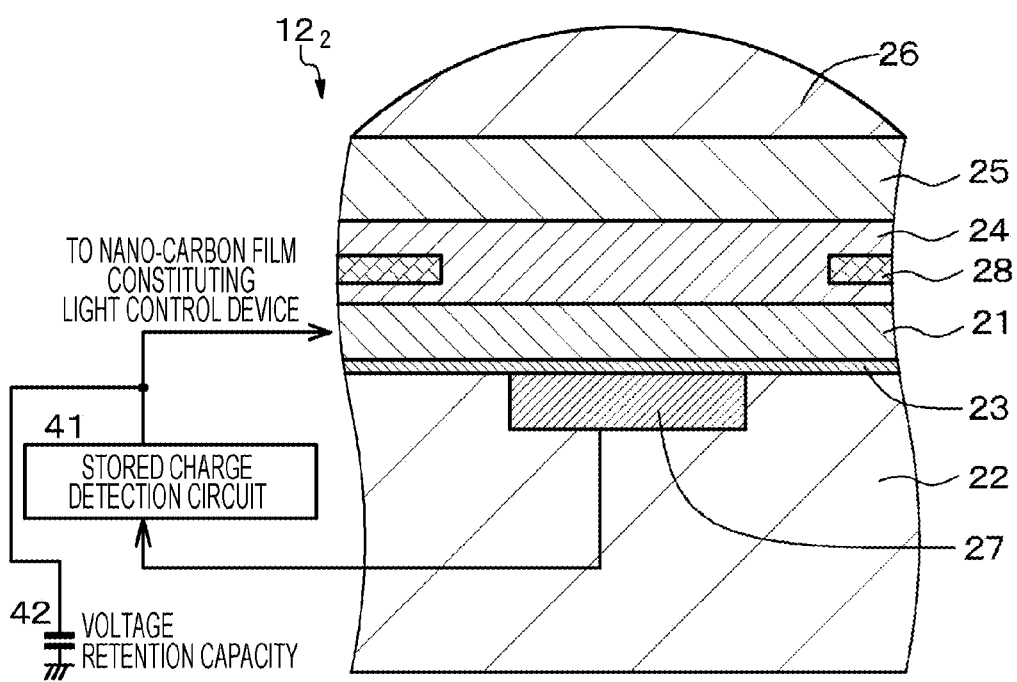

Each of FIGS. 32A and 32B is a conceptual view of the imaging element according to the fifteenth embodiment. The imaging element illustrated in FIG. 32A is an imaging element based on the imaging element according to the eighth embodiment illustrated in FIG. 13A, while the imaging element illustrated in FIG. 32B is an imaging element based on the imaging element according to the thirteenth embodiment illustrated in FIG. 7B. Random pulse voltage amplified after generated by a logic circuit (not shown) provided in a stored charge detection circuit 41 is applied to the nano-carbon film constituting the light control device 21 of the imaging element. Note that a voltage retention capacity 42 is provided between the stored charge detection circuit 41 and the light control device 21. The stored charge detection circuit 41 which monitors output signals (stored charge signals) received from the light receiving element 27 constituting the imaging element may be provided for each image element. This configuration eliminates the necessity of the random pulse voltage generation and transmission device. Note that when it is difficult to provide the stored charge detection circuit 41 for each imaging element, the stored charge detection circuit 41 may be provided for each row or each column of the imaging elements so that random pulse voltage so calculated as to produce randomness for each imaging element is applied to the nano-carbon film constituting the light control device 21 of each imaging element after calculation by the peripheral circuit.

Incidentally, image output signals received from the imaging elements are transmitted to the AD converters 13, and output from the AD converters 13. In this case, pulse voltage calculated on the basis of noise generated at the AD converters 13 may be applied to the nano-carbon film as random pulse voltage. More specifically, attention is paid to noise variations of electric signals of the AD converters 13. Noise variations from the AD converters 13 are converted into constants by using a logic circuit, and standardized at a pulse potential to generate random pulse voltage. The generated random pulse voltage is transmitted to the light control device to realize random exposure.

Sixteenth Embodiment

A sixteenth embodiment is a modification of the thirteenth through fifteenth embodiments. According to the sixteenth embodiment, there are provided a red imaging element $R_1$, a green imaging element $G_1$, blue imaging element $B_1$, and an imaging element $IR_1$ for receiving infrared light (hereinafter referred to as "infrared imaging element $IR_1$" for convenience), as illustrated in FIG. 15B schematically showing a layout of an imaging element group. The infrared imaging element $IR_1$ also includes the light control device 21. The imaging elements $R_1$, $G_1$, $B_1$, and $IR_1$ constitute a unit imaging element group. FIG. 15B shows four unit imaging element groups. Note that the infrared imaging element $IR_1$ does not include a color filter layer, but includes a transparent film through which light in all wavelength ranges is allowed to pass. This transparent film is a film which fills a step in an element surface produced as a result of the absence of the color filter, and is provided as necessary. The infrared imaging element $IR_1$ appropriately selects a predetermined voltage $V_0$ applied to the light control device 21 to produce a light control device capable of transmitting light in the infrared band.

According to the imaging element and the imaging device of the sixteenth embodiment, the light transmissible wavelength range of light is variable in accordance with voltage applied to the light control device 21. Moreover, according to the sixteenth embodiment, the dynamic range of the infrared imaging element $IR_1$ is expandable.

The light control device may function as a color filter instead of providing a color filter layer depending on situations. More specifically, material of the dielectric material layer included in the light control device 21 of each of the red imaging element, green imaging element, and blue imaging element is switched to other material. In other words, for example, the dielectric material layer of the infrared imaging element $IR_1$ is made of $SiO_2$, the dielectric material layer of the red imaging element $R_1$ is made of $HfO_2$, the dielectric material layer of the green imaging element $G_1$ is made of $ZrO_2$, and the dielectric material layer of the blue imaging element $B_1$ is made of PLZT. When a dielectric constant of a material constituting a dielectric material layer is different, a charge amount induced in a nano-carbon film becomes different. Accordingly, in case of a light control device which allows passage (transmittance) of light having a wavelength $\lambda_0$ or higher at light transmittance higher than light transmittance of light having a wavelength lower than $\lambda_0$, this value $\lambda_0$ is switchable to a different value. The red imaging element $R_1$ herein generates signal components corresponding to light in an infrared range and a red range, and a noise component $\Delta E$. Similarly, the green imaging element $G_1$ generates signal components corresponding to light in a range from the infrared range to a green range, and the noise component $\Delta E$. In addition, the blue imaging element $B_1$ generates signal components corresponding to light in a range from the infrared range to a blue range, and the noise component $\Delta E$. Accordingly, the signal component in the red range generated by the red imaging element $R_1$ is obtained by subtracting the entire signal components generated by the infrared imaging element $IR_1$ from the entire signal components generated by the red imaging element $R_1$. Moreover, the signal component in the green range generated by the green imaging element $G_1$ is obtained by subtracting the entire signal components generated by the red imaging element $R_1$ from the entire signal components generated by the green imaging element $G_1$. Furthermore, the signal component in the blue range generated by the green imaging element $B_1$ is obtained by subtracting the entire signal components generated by the green imaging element $G_1$ from the entire signal components generated by the blue imaging element $B_1$. In addition, the signal component in the infrared range is obtained by subtracting the noise components AE of the imaging elements $R_1$, $G_1$, and $B_1$ in a state of non-application of voltage from the entire signal components of the infrared imaging element $IR_1$. Note that this modification example is also applicable to the imaging elements described in the thirteenth through fifteenth embodiments.

Seventeenth Embodiment

A seventeenth embodiment is a modification of the thirteenth through sixteenth embodiment, and more specifically relates to a light transmittance control method of an imaging element. More specifically, the light transmittance control method for a light control device (light control element) according to the seventeenth embodiment is: (a) a light transmittance control method of a light control device (light control element), which method applies a predetermined voltage $V_0$ between a pair of nano-carbon films (between first nano-carbon film 114 and second nano-carbon film 115) to transmit light having a wavelength $\lambda_0$ or higher at light transmittance higher than light transmittance of light having a wavelength lower than $\lambda_0$; (b) a light transmittance control method of a light control device (light control element), which method applies the predetermined voltage $V_0$ between a pair of the electrodes 211 and 212 to transmit light having a wavelength $\lambda_0$ or higher at light transmittance higher than light transmittance of light having a wavelength lower than $\lambda_0$; (c) a light transmittance control method of a light control device (light control element), which method applies the predetermined voltage $V_0$ between the pair of electrodes 311 and 312 and the nano-carbon film 314 to transmit light having a wavelength $\lambda_0$ or higher at light transmittance higher than light transmittance of light having a wavelength lower than $\lambda_0$; or (d) a light transmittance control method of a light control device (light control element), which applies the predetermined voltage $V_0$ between the first nano-carbon film 414 (and electrode 412) and the second nano-carbon film 415 (and electrode 411) to transmit light having a wavelength $\lambda_0$ or higher at light transmittance higher than light transmittance of light having a wavelength lower than $\lambda_0$.

According to these light transmittance control methods of a light control device (light control element), a duty ratio of the pulsed predetermined voltage $V_0$ is varied to control effective light transmittance of a light control layer to light having the wavelength $\lambda_0$ or higher. Note that the pulsed voltage is not random pulse voltage according to the seventeen embodiment. Note that the state that "applies a predetermined voltage $V_0$" in the foregoing (a) through (d) is expressed as a state that "applies a predetermined voltage $V_0$ to the first nano-carbon film 114 or the like for convenience.

Figure 33A:
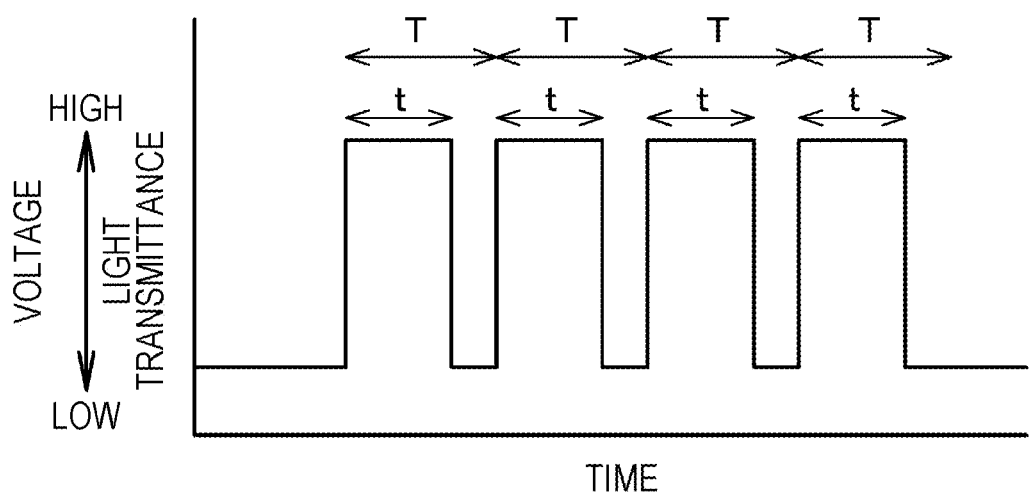
Figure 33B:
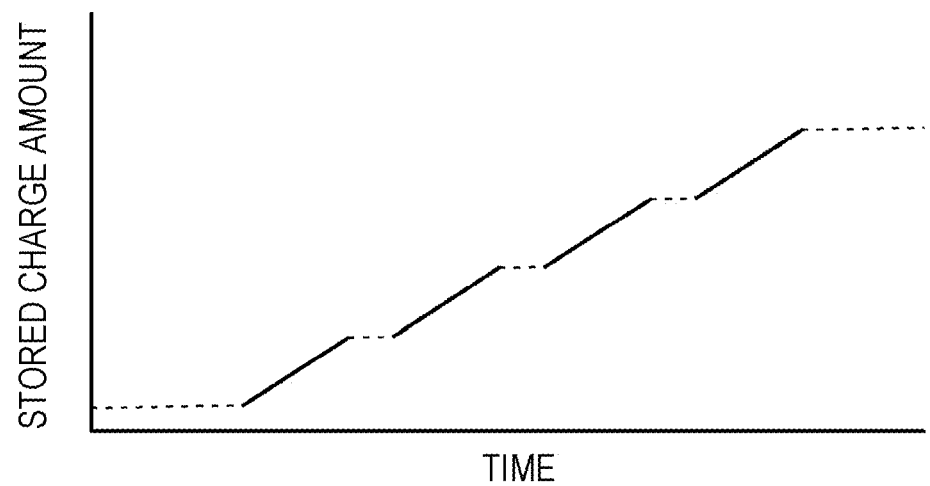
FIG. 33B is a view schematically showing a stored charge amount stored in one frame period when the pulsed predetermined voltage $V_0$ is applied to the light control device.
Figure 34A:
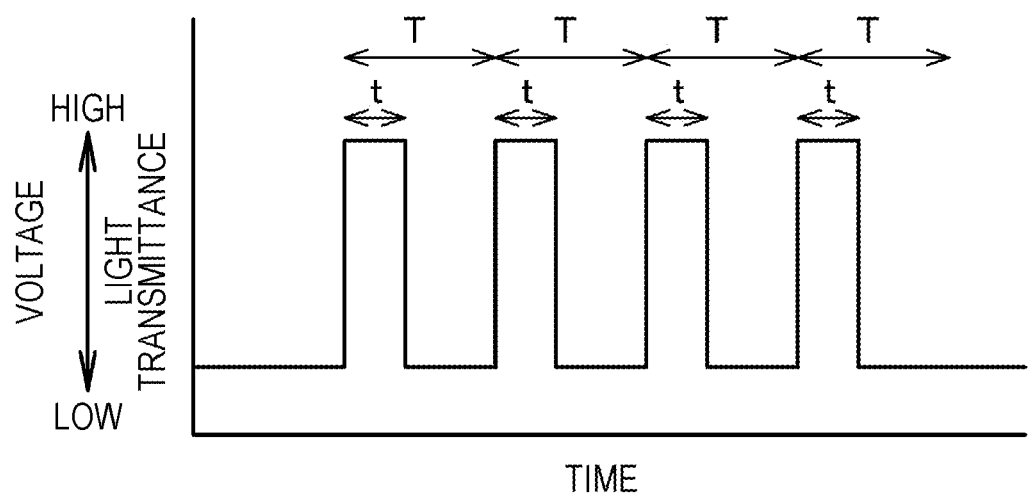
Figure 34B:
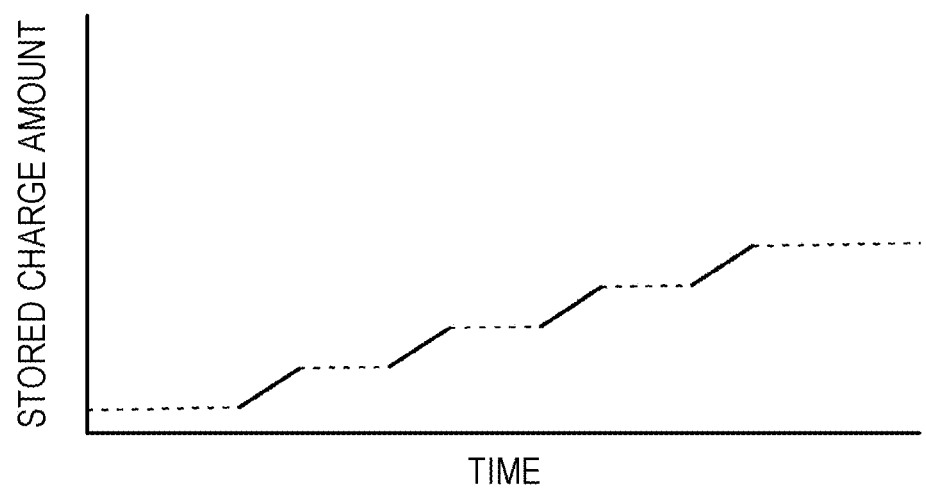
FIG. 34B is a view schematically showing a stored charge amount stored in one frame period when the pulsed predetermined voltage $V_0$ is applied to the light control device.

More specifically, each of FIGS. 33A and 34A shows a voltage change (or light transmittance) produced when the predetermined voltage $V_0$ having a pulse cycle T, a duty ratio D=t/T is applied to the first nano-carbon film 114 or the like. Each of FIGS. 33B and 34B shows a stored charge amount stored in a light receiving element on the basis of light having passed through the light control device in a certain period (such as one frame period). As shown in graphs of FIGS. 33A and 34A, light transmittance of the light control device is higher in a period t than in a period (T−t). In this case, a large charge amount is produced. Accordingly, as shown in FIGS. 33B and 34B, the stored charge amount increases in the period t than in the period (T−t). Note that the duty ratio D in the example of FIG. 33A is higher than the duty ratio D in the example of FIG. 34A. In addition, in FIGS. 33B and 34B, each of solid lines indicates a stored charge amount in the period t, while each of dotted lines indicates a stored charge amount in the period (T−t). When the pulsed predetermined voltage $V_0$ is applied, the stored charge amount in one frame period is calculated by integration of the stored charge amount in the period t and the stored charge amount in the period (T−t). Accordingly, the stored charge amount obtained in one frame period is variable by changing the duty ratio D of the pulsed predetermined voltage $V_0$ (see FIGS. 33B and 34B). In other words, effective light transmittance of the light control layer 113 or the like, i.e., average light transmittance of the light control layer 113 or the like is controllable in a certain period. More specifically, in a state of a light amount $Q_0$ of light having passed through the light control layer 113 or the like at the maximum light transmittance of the light control layer 113 or the like, and a light amount $Q_1$ of light having passed through the light control layer 113 or the like at the time of application of the predetermined voltage $V_0$ at the duty ratio D=t/T in a certain period, the effective light transmittance of the light control layer 113 or the like is expressed as ($Q_1/Q_0$). As a result, the dynamic ranges of the imaging element and the imaging device are expandable, wherefore sufficient information on both a bright portion and a dark portion is obtainable during imaging.

Note that a frequency corresponding to a change of light transmittance of the nano-carbon film of the light control layer is higher than a frequency of pulsed voltage in the light transmittance control method according to the seventeenth embodiment. It is preferable that the frequency of the pulsed voltage is $1\times10^2$ Hz or higher and $1\times10^5$ Hz or lower. More specifically, the frequency corresponding to a change of light transmittance of the nano-carbon film of the light control layer is $2.4\times10^3$ Hz (2.4 kHz), while the frequency of the predetermined pulsed voltage $V_0$ is not specifically limited, such as 240 Hz. Accordingly, T=$4.2\times10^3$ seconds, for example.

As described above, the dynamic range is represented by a ratio of a saturated signal amount corresponding to a maximum signal amount to noise. Image output signals in a bright scene and image output signals in a dark scene are more securely generated as the dynamic range becomes larger. For example, in case of the imaging element according to the thirteenth embodiment described above, the time required for reaching the saturated charge amount is controllable for the imaging elements $R_1$, $G_1$, and $B_1$ each of which includes the light control device 21, by controlling light transmittance on the basis of adjustment of the predetermined voltage $V_0$ applied to the light control device 21 and the duty ratio D, or on the basis of omission of application of voltage to the light control device 21, or by decreasing light transmittance to a desired value. As a result, the dynamic range is expandable. On the other hand, imaging in an optimal imaging mode is achievable for the imaging elements $R_1$, $G_1$, and $B_1$ each of which includes the light control device 21, by switching between an imaging mode for expanding the dynamic range on the basis of control of the predetermined voltage $V_0$ applied to the light control device 21 and the duty ratio D for achieving maximum light transmittance, and an imaging mode for emphasizing resolution, in accordance with switching operation by the user or automatic switching of the imaging device, for example.

In addition, according to the imaging element and the imaging device of the sixteenth embodiment described above, light transmittance of the light control device 21 is variable on the basis of voltage applied to the light control device 21. Moreover, the light transmittable wavelength range is also variable. Moreover, according to the sixteenth embodiment, the dynamic range of the infrared imaging element $IR_1$ is expandable.

According to the light transmittance control method of the light control device (light control element) of the seventeenth embodiment, effective light transmittance of the light control layer for light having the wavelength $\lambda_0$ or higher is controlled by varying the duty ratio of the predetermined pulsed voltage $V_0$. In this case, desired light transmittance is accurately and easily obtained and set by setting such that light transmittance to light having the wavelength of $\lambda_0$ or higher (such as light in wavelength band of visible light or higher) produced by applying the predetermined voltage $V_0$ becomes approximately 100% in a state of the wavelength $\lambda_0$ set to blue (such as 380 nm), for example. In addition, light transmittance of the nano-carbon film is not dependent on a wavelength, wherefore time required for a change of light transmittance is short.

The present disclosure was described above on the basis of the preferred embodiments. However, the present disclosure is not limited to the embodiments. The imaging elements, the imaging devices, the configurations and structures of the analog-digital converters, and the configurations of the pixel signal reading method are presented only by way of example, and therefore may be changed in appropriate manners. The light control device included in each of the imaging elements may function as a mechanical shutter at the time of formation of a still image. Accordingly, a mechanical shutter may be eliminated.

Figure 35A:
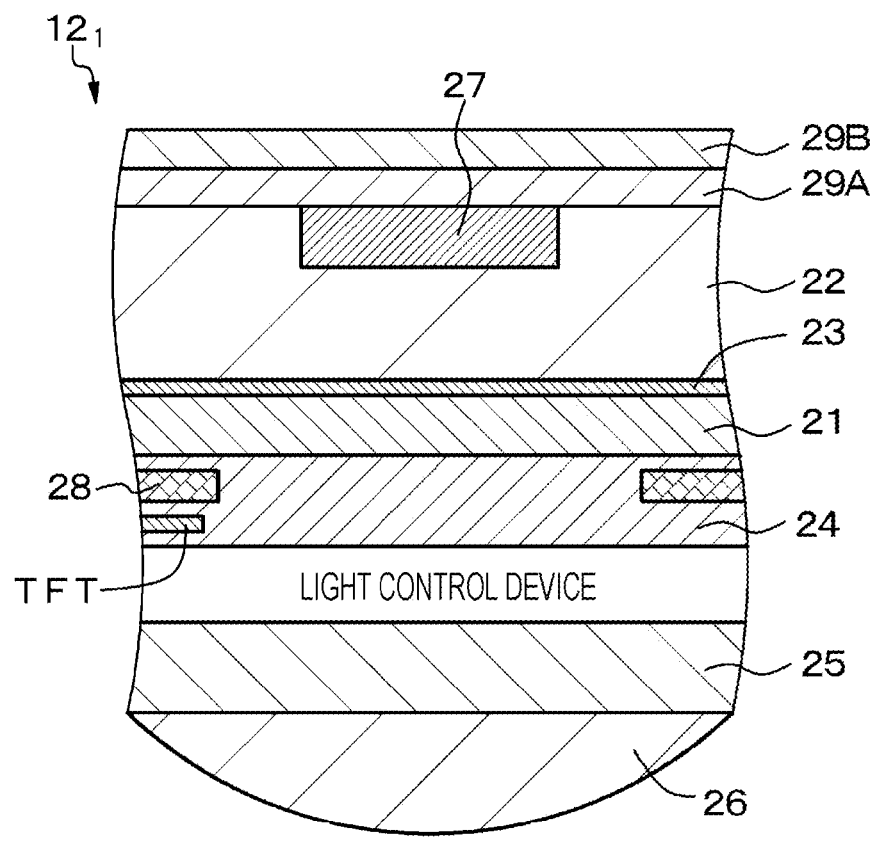
FIGS. 35A and 35B are a schematic partial cross-sectional view and an equivalent circuit diagram, respectively, of an imaging element where a light control device of the imaging element is controlled by a thin transistor (TFT) included in the imaging element.
Figure 35B:
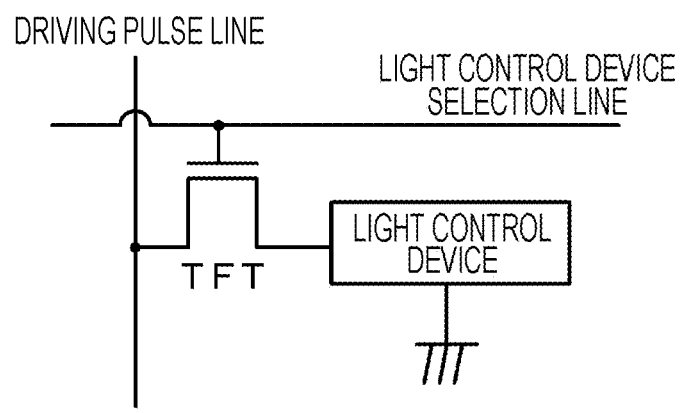
Figure 36A:
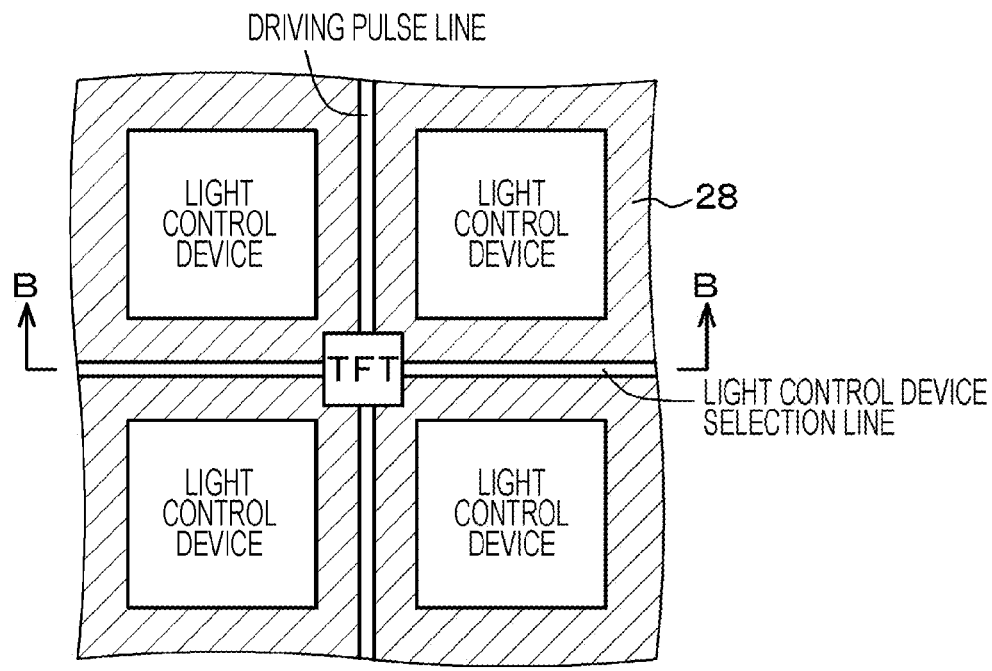
Figure 36B:
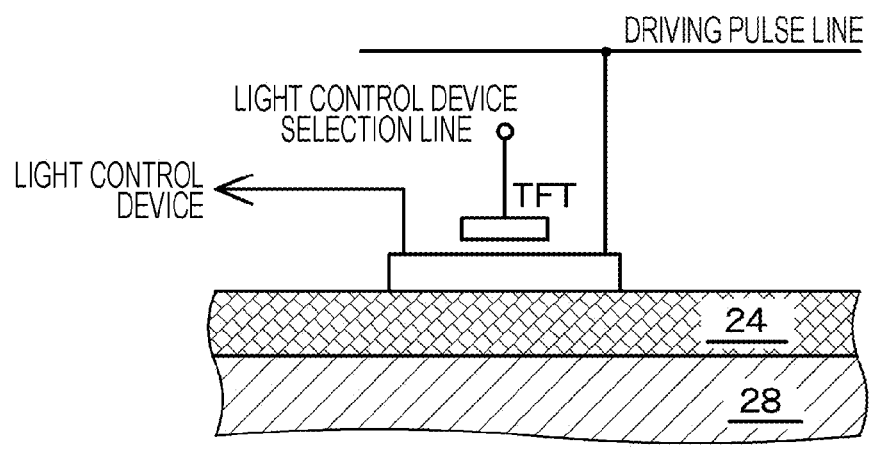
FIG. 36B is a conceptual view illustrating a schematic cross section of the thin film transistor and others.

The operation of the light control device included in each of the imaging elements may be controlled by a thin film transistor (TFT). FIG. 35A is a partial cross-sectional view schematically illustrating a modified example of the imaging element illustrated in FIG. 13A and FIG. 32A. In addition, FIG. 35B illustrates an equivalent circuit diagram. FIG. 36A schematically illustrates arrangement of light control devices constituting four imaging elements, and a thin film transistor (TFT) for controlling one of the light control devices. FIG. 36B is a conceptual view illustrating a schematic cross section of the TFT and the like taken along an arrow B-B in FIG. 36A. One of source/drain regions of the thin film transistor (TFT) is connected to a driving pulse line, while the other of the source/drain regions is connected to the light control device. A gate portion of the thin film transistor (TFT) is connected to a light control device selection line. When voltage is applied from the light control device selection line to the gate portion of the thin film transistor (TFT), the thin film transistor (TFT) comes into an on-state. Subsequently, pulse voltage for driving the light control device is applied from a driving pulse line to the one source/drain region of the thin film transistor (TFT). As a result, the light control device is driven. Note that the light control device driving pulse voltage is retained in the light control device even while the thin film transistor (TFT) is in an off-state. In other words, this light control device also functions as a pulse voltage retention capacity. For example, the thin film transistor (TFT) may be provided on the light shielding film 28 between the imaging elements for manufacture in a relatively easy process without sacrificing an opening rate of a pixel. Note that the imaging element $12_1$ illustrated in FIG. 35A is a rear-side illumination type imaging element. Needless to say, this imaging element may be a front-side illumination type imaging element illustrated in FIGS. 13B and 32B.

The light receiving element may be constituted by an organic photoelectric conversion layer. Examples of the organic photoelectric conversion layer may include organic materials such as rhodamine pigment, merocyanine pigment, and quinacridone when the organic photoelectric conversion layer is made of material capable of performing photoelectric conversion in response to green light, for example. Alternatively, examples of material constituting the organic photoelectric conversion layer include pentacene and pentacene derivative, (TIPS-pentacene etc.), naphthacene and naphthacene derivative (rubrene, hexapropyl naphthacene), thiophene and thiophene derivative (P3HT etc.), fullerene and fullerene derivative (PCBM etc.), TCNQ, perylene and perylene derivative, porphyrin and porphyrin derivative, acridine and acridine derivative, coumarin and coumarin derivative, quinacridone and quinacridone derivative, cyanine and cyanine derivative, square lyrium and square lyrium derivative, oxazine and oxazine derivative, xanthene triphenylamine and xanthene triphenylamine derivative, benzidine and benzidine derivative, pyrazoline and pyrazoline derivative, stilamine and stilamine derivative, hydrazone and hydrazone derivative, triphenylmethane and triphenylmethane derivative, carbazole and carbazole derivative, polysilane and polysilane derivative, thiophene and thiophene derivative, polyamine and polyamine derivative, oxadiazole and oxadiazole derivative, triazole and triazole derivative, triazine and triazine derivative, quinoxaline and quinoxaline derivative, phenanthroline and phenanthroline derivative, aluminum quinoline and aluminum quinoline derivative, polyparaphenylenevinylene, and polyparaphenylenevinylene derivative, polyfluorene and polyfluorene derivative, polyvinyl carbazole and polyvinyl carbazole derivative, polythiol and polythiol derivative, polypyrrole and polypyrrole derivative, and polythiophene and polythiophene derivative. Note that the organic materials shown above as typical examples may be used either independently, or mixed or laminated in a combination of two or more types. Then, a light receiving element constituting the red imaging element, the green imaging element, or the blue imaging element is formed by selecting material having peak sensitivity in a corresponding wavelength band of red, green, and blue from the organic materials shown above as typical examples.

Note that the present disclosure may have following configurations.

[A01] <Imaging device>

An imaging device including:
  imaging elements arranged in two-dimensional matrix in a first direction and a second direction;
  an analog-digital converter; and
  a pixel signal reading device, wherein
  the pixel signal reading device selects spatially at random the imaging element that outputs a pixel signal to the analog-digital converter, and randomly outputs the pixel signal of the imaging element from the analog-digital converter.

[A02] The imaging device according to [A01], wherein
  the analog-digital converter to which a pixel signal is input from the imaging element is in an operating state, and the analog-digital converter to which a pixel signal is not input from the imaging element is in a non-operating state.

[A03] The imaging device according to [A01] or [A02], further including a pixel signal addition circuit, wherein a pixel signal of the imaging element output from the analog-digital converter is sequentially input to the pixel signal addition circuit to add a plurality of arbitrary pixel signals at the pixel signal addition circuit.

[A04] The imaging device according to any one of [A01] through [A03], wherein the K imaging elements arranged in the first direction, and the L imaging elements arranged in the second direction constitute the K×L imaging elements in total, the K×L imaging elements constitute an imaging element unit, the I imaging element units being provided in the first direction, and the J imaging element units being provided in the second direction, the (i, j)th (i=1, 2, and up to I, j=1, 2, and up to J) imaging element unit is constituted by the $K_i$ imaging elements in the first direction and the $L_j$ imaging elements in the second direction, the $K_i$ analog-digital converters are provided in the (i, j)th imaging element unit, and the analog-digital converters are randomly operated by the pixel signal reading device in the (i, j)th imaging element unit to randomly select the fewer imaging element than the ($K_i \times L_j$) imaging elements, and read a pixel signal from the selected imaging element.

[A05] The imaging device according to any one of [A01] through [A03], wherein the K imaging elements arranged in the first direction, and the L imaging elements arranged in the second direction constitute the K×L imaging elements in total, the one analog-digital converter is provided for a group of the imaging elements constituted by the L imaging elements arranged in the second direction, and the analog-digital converter is randomly operated by the pixel signal reading device to randomly select the fewer imaging element than the K imaging elements from the K imaging elements arranged in the first direction, and read a pixel signal from the selected imaging element.

[A06] The imaging device according to any one of [A01] through [A03], wherein the K imaging elements arranged in the first direction, and the L imaging elements arranged in the second direction constitute the K×L imaging elements in total, the one analog-digital converter is provided for the one imaging element, and the analog-digital converter is randomly operated by the pixel signal reading device to randomly select the fewer imaging element than the K×L imaging elements from the K×L imaging elements, and read a pixel signal from the selected imaging element.

[A07] The imaging device according to any one of [A02] through [A06], wherein each of the imaging elements includes a light receiving element, and a light control device disposed on a light entrance side of the light receiving element, the light control device includes a lamination of M (M≤1) light control layer or layers each of which includes a lamination of a first nano-carbon film, a first intermediate layer, a dielectric material layer, and a second intermediate layer, the light control device further including a second nano-carbon film on the second intermediate layer constituting the Mth light control layer, and voltage is applied to the first nano-carbon film and the second nano-carbon film under control by the pixel signal reading device to control entrance of light into the imaging element.

[A08] The imaging device according to [A07], wherein each of the imaging elements includes a thin film transistor that controls an operation of the light control device included in the corresponding imaging element.

[A09] The imaging device according to [A07] or [A08], wherein pixel signal reading from the selected imaging element, and light entrance start and light entrance end into the imaging element at random in time are performed under control by the pixel signal reading device.

[A10] The imaging device according to any one of [A07] through [A09], wherein pulsed voltage is randomly applied to the first nano-carbon film and the second nano-carbon film.

[A11] The imaging device according to [A10], wherein an integrated value of application time of pulsed voltage to the first nano-carbon film and the second nano-carbon film is uniform.

[A12] The imaging device according to any one of [A01] through [A11], further including a movement detection circuit that detects movement of a subject, wherein a state that the analog-digital converter is randomly operated by the pixel signal reading device is changed in accordance with a presence or an absence of movement detection of the subject detected by the movement detection circuit.

[B01] The imaging device according to [A01], further including a reading amplifier, wherein the pixel signal reading device randomly operates the reading amplifier to select spatially at random the imaging element that outputs a pixel signal to the analog-digital converter, and randomly output the pixel signal of the imaging element from the analog-digital converter.

[B02] The imaging device according to [B01], wherein the reading amplifier that controls operation of the analog-digital converter to which a pixel signal is input from the imaging element is in an operating state, and the reading amplifier that controls operation of the analog-digital converter to which a pixel signal is not input from the imaging element is in a non-operating state.

[B03] The imaging device according to [B01] or [B02], further including a pixel signal addition circuit, wherein a pixel signal of the imaging element output from the analog-digital converter is sequentially input to the pixel signal addition circuit to add a plurality of arbitrary pixel signals at the pixel signal addition circuit.

[B04] The imaging device according to any one of [B01] through [B03], wherein the K imaging elements arranged in the first direction, and the L imaging elements arranged in the second direction constitute the K×L imaging elements in total, the K×L imaging elements constitute an imaging element unit, the I imaging element units being provided in the first direction, and the J imaging element units being provided in the second direction, the (i, j)th (i=1, 2, and up to I, j=1, 2, and up to J) imaging element unit is constituted by the $K_i$ imaging elements in the first direction and the $L_j$ imaging elements in the second direction, the $K_i$ reading amplifiers are provided in the (i, j)th imaging element unit, and the reading amplifiers are randomly operated by the pixel signal reading device in the (i, j)th imaging element unit to randomly select the fewer imaging element than the ($K_i \times L_j$) imaging elements, and read a pixel signal from the selected imaging element.

[B05] The imaging device according to any one of [B01] through [B03], wherein
the K imaging elements arranged in the first direction, and the L imaging elements arranged in the second direction constitute the K×L imaging elements in total,
the one reading amplifier is provided for a group of the imaging elements constituted by the L imaging elements arranged in the second direction, and
the reading amplifier is randomly operated by the pixel signal reading device to randomly select the fewer imaging element than the K imaging elements from the K imaging elements arranged in the first direction, and read a pixel signal from the selected imaging element.

[B06] The imaging device according to any one of [B01] through [B03], wherein
the K imaging elements arranged in the first direction, and the L imaging elements arranged in the second direction constitute the K×L imaging elements in total,
the one reading amplifier is provided for the one imaging element, and
the reading amplifier is randomly operated by the pixel signal reading device to randomly select the fewer imaging element than the K×L imaging elements from the K×L imaging elements, and read a pixel signal from the selected imaging element.

[B07] The imaging device according to any one of [B02] through [B06], wherein
each of the imaging elements includes a light receiving element, and a light control device disposed on a light entrance side of the light receiving element,
the light control device includes a lamination of M (M≥1) light control layer or layers each of which includes a lamination of a first nano-carbon film, a first intermediate layer, a dielectric material layer, and a second intermediate layer, the light control device further including a second nano-carbon film on the second intermediate layer constituting the Mth light control layer, and
voltage is applied to the first nano-carbon film and the second nano-carbon film under control by the pixel signal reading device to control entrance of light into the imaging element.

[B08] The imaging device according to [B07], wherein each of the imaging elements includes a thin film transistor that controls an operation of the light control device included in the corresponding imaging element.

[B09] The imaging device according to [B07] or [B08], wherein pixel signal reading from the selected imaging element, and light entrance start and light entrance end into the imaging element at random in time are performed under control by the pixel signal reading device.

[B10] The imaging device according to any one of [B07] through [B09], wherein pulsed voltage is randomly applied to the first nano-carbon film and the second nano-carbon film.

[B11] The imaging device according to [B10], wherein an integrated value of application time of pulsed voltage to the first nano-carbon film and the second nano-carbon film is uniform.

[B12] The imaging device according to any one of [B01] through [B11], further including a movement detection circuit that detects movement of a subject, wherein a state that the reading amplifier is randomly operated by the pixel signal reading device is changed in accordance with a presence or an absence of movement detection of the subject detected by the movement detection circuit.

[C01] The imaging device according to any one of [A07] through [A12] or [B07] through [B12], wherein light transmittance of the light control layer is controlled by voltage applied to the first nano-carbon film and the second nano-carbon film.

[C02] The imaging device according to [C01], wherein
in a state that K is an odd number, the odd-numbered first nano-carbon film is connected to first wiring, and the even-numbered first nano-carbon film and second nano-carbon film are connected to second wiring, and
in a state that K is an even number, the odd-numbered first nano-carbon film and second nano-carbon film are connected to the first wiring, and the even-numbered first nano-carbon is connected to the second wiring.

[C03] The imaging device according to [C01] or [C02], wherein
the first nano-carbon film is made of graphene, carbon nanotube, or fullerene, and
the second nano-carbon film is made of graphene, carbon nanotube, or fullerene.

[C04] The imaging device according to any one of [C01] through [C03], wherein material constituting the first intermediate layer and the second intermediate layer is at least one type of material selected from a group of titanium dioxide, titanium nitride, chromium oxide, amorphous silicon, magnesium fluoride, silicon nitride, and silicon oxide.

[D01] <Light control device of second configuration>
The imaging device according to any one of [A04] through [A06] or [B04] through [B06], wherein
each of the imaging elements includes a light receiving element, and a light control device disposed on a light entrance side of the light receiving element,
the light control device includes a pair of electrodes, and a light control layer sandwiched between the pair of electrodes,
the light control layer includes a laminated structure constituted by a first dielectric material layer, a first intermediate layer, a first nano-carbon film doped with first conductivity type impurities or not doped with impurities, a second nano-carbon film doped with second conductivity type impurities different from the first conductivity type, or not doped with impurities, a second intermediate layer, and a second dielectric material layer, and
voltage is applied to the pair of electrodes under control by the pixel signal reading device to control entrance of light into the imaging elements.

[D02] The imaging device according to [D01], wherein each of the imaging elements includes a thin film transistor that controls an operation of the light control device included in the corresponding imaging element.

[D03] The imaging device according to [D01] or [D02], wherein pixel signal reading from the selected imaging element, and light entrance start and light entrance end into the imaging element at random in time are performed under control by the pixel signal reading device.

[D04] The imaging device according to any one of [D01] through [D03], wherein pulsed voltage is randomly applied to the pair of electrodes.

[D05] The imaging device according to any one of [D01] through [D04], wherein light transmittance of the light control layer is controlled by control of a charge amount generated in the first nano-carbon film and/or the second nano-carbon film, the charge amount control achieved by applying voltage to the pair of electrodes.

[D06] The imaging device according to any one of [D01] through [D05], including N light control layers, and (N+1) electrodes, wherein
the N light control layers and the (N+1) electrodes are alternately laminated,
the odd-numbered electrodes are connected to first wiring, and
the even-numbered electrodes are connected to second wiring.

[D07] The imaging device according to any one of [D01] through [D06], wherein
the first conductivity type is n type,
the second conductivity type is p type, and
voltage higher than voltage applied to the second electrode facing the second nano-carbon film via the second dielectric material layer is applied to the first electrode facing the first nano-carbon film via the first dielectric material layer.

[D08] The imaging device according to any one of [D01] through [D07], wherein
the first nano-carbon film is made of graphene, carbon nanotube, or fullerene, and
the second nano-carbon film is made of graphene, carbon nanotube, or fullerene.

[D09] The imaging device according to any one of [D01] through [D08], wherein material constituting the first intermediate layer and the second intermediate layer is at least one type of material selected from a group of titanium dioxide, titanium nitride, chromium oxide, amorphous silicon, magnesium fluoride, silicon nitride, and silicon oxide.

[E01] <Light control device of third configuration>
The imaging device according to any one of [A04] through [A06], or [B04] through [B06], wherein
each of the imaging elements includes a light receiving element, and a light control device disposed on a light entrance side of the light receiving element,
the light control device includes a pair of electrodes, and a light control layer sandwiched between the pair of electrodes,
the light control layer includes a laminated structure constituted by a first dielectric material layer, a first intermediate layer, a nano-carbon film doped with impurities or not doped with impurities, a second intermediate layer, and a second dielectric material layer, and
voltage different from voltage applied to the pair of electrodes is applied to the nano-carbon film.

[E02] The imaging device according to [E01], wherein each of the imaging elements includes a thin film transistor that controls an operation of the light control device included in the corresponding imaging element.

[E03] The imaging device according to [E01] or [E02], wherein pixel signal reading from the selected imaging element, and light entrance start and light entrance end into the imaging element at random in time are performed under control by the pixel signal reading device.

[E04] The imaging device according to any one of [E01] through [E03], wherein pulsed voltage is randomly applied to the pair of electrodes.

[E05] The imaging device according to any one of [E01] through [E04], wherein
the impurities are of p type, and
voltage higher than voltage applied to the pair of electrodes is applied to the nano-carbon film.

[E06] The imaging device according to any one of [E01] through [E04], wherein
the impurities are of n type, and
voltage lower than voltage applied to the pair of electrodes is applied to the nano-carbon film.

[E07] The imaging device according to any one of [E01] through [E06], wherein the nano-carbon film is made of graphene, carbon nanotube, or fullerene.

[E08] The imaging device according to any one of [E01] through [E07], wherein material constituting the first intermediate layer and the second intermediate layer is at least one type of material selected from a group of titanium dioxide, titanium nitride, chromium oxide, amorphous silicon, magnesium fluoride, silicon nitride, and silicon oxide.

[F01] <Light control device of fourth configuration>
The imaging device according to any one of [A04] through [A06], or [B04] through [B06], wherein
each of the imaging elements includes a light receiving element, and a light control device disposed on a light entrance side of the light receiving element,
the light control device includes a pair of electrodes, and a laminated structure on which P light control layers ($P \geq 1$) sandwiched between the pair of electrodes,
the pth light control layer ($1 \leq p \leq P$) has a laminated structure including a first dielectric material layer, a first intermediate layer, a first nano-carbon film doped with n-type impurities or not doped with impurities, a second intermediate layer, a second dielectric material layer, a third intermediate layer, a second nano-carbon film doped with p-type impurities or not doped with impurities, and a fourth intermediate layer,
the Pth light control layer further includes a third dielectric material layer on the fourth intermediate layer, and
voltage different from voltage applied to the first nano-carbon film is applied to the second nano-carbon film.

[F02] The imaging device according to [F01], wherein each of the imaging elements includes a thin film transistor that controls an operation of the light control device included in the corresponding imaging element.

[F03] The imaging device according to [F01] or [F02], wherein pixel signal reading from the selected imaging element, and light entrance start and light entrance end into the imaging element at random in time are performed under control by the pixel signal reading device.

[F04] The imaging device according to any one of [F01] through [F03], wherein pulsed voltage is randomly applied to the pair of electrodes.

[F05] The imaging device according to any one of [F01] through [F04], wherein voltage equal to or lower than voltage applied to the second nano-carbon film, and equal to or higher than voltage applied to the first nano-carbon film is applied to the pair of electrodes.

[F06] The imaging device according to any one of [F01] through [F05], wherein
the first nano-carbon film is connected to first wiring, and
the second nano-carbon film is connected to second wiring.

[F07] The imaging device according to any one of [F01] through [F06], wherein
the first nano-carbon film is made of graphene, carbon nanotube, or fullerene, and
the second nano-carbon film is made of graphene, carbon nanotube, or fullerene.

[F08] The imaging device according to any one of [F01] through [F07], wherein material constituting the first intermediate layer, the second intermediate layer, the third intermediate layer, and the fourth intermediate layer is at least one type of material selected from a group of titanium dioxide, titanium nitride, chromium oxide, amorphous silicon, magnesium fluoride, silicon nitride, and silicon oxide.

[G01] The imaging device according to any one of [C01] through [F07], further including a random pulse voltage generation and transmission device that generates random pulse voltage, and transmits the generated random pulse voltage to the imaging elements each of which includes the light control device.

[G02] The imaging device according to [G01], wherein the one random pulse voltage generation and transmission device is provided for the plurality of imaging elements each of which includes the light control device.

[G03] The imaging device according to [G01] or [G02], wherein the random pulse voltage includes random pulse voltage having positive polarity and random pulse voltage having negative polarity.

[H01] The imaging device according to any one of [C01] through [G03], wherein applied is pulse voltage calculated on the basis of output signals obtained by the imaging elements each of which includes the light control device.

[H02] The imaging device according to any one of [C01] through [G01], wherein image output signals generated from the imaging elements each of which includes the light control device are compressed by thinning in space and time.

[H03] The imaging device according to any one of [C01] through [H02], wherein
the imaging elements arranged in two-dimensional matrix are provided on a first semiconductor chip,
a random pulse voltage generation and transmission device that generates random pulse voltage and transmits the generated random pulse voltage to the imaging element each of which includes the light control device is provided on a second semiconductor chip,
the first semiconductor chip and the second semiconductor chip are laminated on each other, and
the light control devices and the random pulse voltage generation and transmission device are connected via a through-silicon via, or a bump.

[H04] The imaging device according to [H03], wherein the imaging elements are of a rear-side illumination type.

[H05] The imaging device according to any one of [C01] through [H04], wherein
a random pulse voltage generation and transmission device that generates random pulse voltage and transmits the generated random pulse voltage to the imaging element each of which includes the light control device is provided, and
the light control devices and the random pulse voltage generation and transmission device are connected by connection wiring constituted by a nano-carbon film or a transparent conductive material layer.

[H06] The imaging device according to any one of [C01] through [H05] (excluding [A08], [B08], [D02], [E02], and [F02]), wherein
the imaging elements are arranged in two-dimensional matrix in the first direction and the second direction,
the first nano-carbon film extends in the first direction, and common to the imaging elements arranged in the first direction,
the second nano-carbon film extends in the second direction, and common to the imaging elements arranged in the second direction,
random pulse voltage having positive polarity is applied to the first nano-carbon film, and
random pulse voltage having negative polarity is applied to the second nano-carbon film.

[H07] The imaging device according to [H06], wherein
an end of the first nano-carbon film extending in the first direction is patterned into a comb-electrode shape, and
an end of the second nano-carbon film extending in the second direction is patterned into a comb-electrode shape.

[J01] <Pixel signal reading method>
A pixel signal reading method for an imaging device that includes
imaging elements arranged in two-dimensional matrix in a first direction and a second direction,
an analog-digital converter, and
a pixel signal reading device,
the method including the steps of, by the pixel signal reading device, selecting spatially at random the imaging element that outputs a pixel signal to the analog-digital converter, and randomly outputting the pixel signal of the imaging element from the analog-digital converter.

REFERENCE SIGNS LIST

11 Imaging element unit 11
12, $12_1$, $12_2$ Imaging element
$13_1$, $13_2$, $13_3$, $13_4$, $13_5$, $13_6$, $13_7$, $13_8$ Analog-digital converter (AD converter)
$14_1$, $14_2$, $14_3$, $14_4$, $14_5$, $14_6$, $14_7$, $14_8$ Switching element
$15_1$, $15_2$, $15_3$, $15_4$, $15_5$, $15_6$, $15_7$, $15_8$ Reading amplifier
16 Pixel signal reading device (pixel signal reading circuit)
$17_1$, $17_2$, $17_3$, $17_4$, $17_5$, $17_6$, $17_7$, $17_8$ Memory
18 Pixel signal addition circuit
19 Frame memory
100, 200, 200', $300_1$, $300_2$, 400 Light control device
211, 212, 311, 312, 411, 412 Electrode
113, $113_M$, 213, 313, 413 Light control layer
413' Laminated structure of light control layer
114, 214, 314, 414 First nano-carbon film
115, 215, 415 Second nano-carbon film
116 Dielectric material layer
216A, 316A, 416A First dielectric material layer
216B, 316B, 416B Second dielectric material layer
416C Third dielectric material layer
117A, 217A, 317A, 417A First intermediate layer
117B, 217B, 317B, 417B Second intermediate layer
417C Third intermediate layer
417D Fourth intermediate layer
118, 218, 418 First wiring
119, 219, 419 Second wiring
21 Light control device
22 Silicon semiconductor substrate
23 Interlayer insulation film
24 Protection film
25 Color filter layer (or flattening film)
26 Condensing lens (on-chip lens)
27 Light receiving element (photo sensor, photodiode, photoelectric conversion element)
28 Light shielding film
29A Interlayer insulation layer
29B Protection film
31 Vertical scanning circuit
32 Horizontal scanning circuit
33 Horizontal transfer circuit
41 Stored charge detection circuit
42 Voltage retention capacity
511 First semiconductor chip
521 Second semiconductor chip 522 Random pulse voltage generation and transmission device
523 Various circuits
531 Through-silicon via (TSV)
532 Pad unit
541 Signal processing unit
542 Memory unit
543 Data processing unit
544 Control unit
545 Current source
546 Decoder
547 Row decoder
548 Interface (IF) unit
549 Column decoder and sense amplifier
551 Comparator
552 Counter unit
554 Ramp voltage generator (reference voltage generation unit)
555 Data latch unit
556 Parallel-serial conversion unit (para-seri conversion unit)
$R_1$, $G_1$, $B_1$, $IR_1$ Imaging element

The invention claimed is:

1. An imaging device comprising:
a plurality of imaging elements arranged in a two-dimensional matrix in a first direction and a second direction;
a plurality of analog-digital converters, each analog-digital converter being coupled to a distinct subset of the plurality of imaging elements such that a first analog-digital converter of the plurality of analog-digital converters is coupled to a first subset of the plurality of imaging elements, a second analog-digital converter of the plurality of analog-digital converters is coupled to a second subset of the plurality of imaging elements, and no imaging elements present in the first subset of the plurality of imaging elements are present in the second subset of the plurality of imaging elements; and
a pixel signal reading device configured to:
randomly select one or more analog-digital converters from amongst the plurality of analog-digital converters to receive a respective input pixel signal from an associated subset of imaging elements coupled thereto; and
cause each of the one or more randomly selected analog-digital converters to output a respective output pixel signal.

2. The imaging device according to claim 1, wherein
when an analog-digital converter is randomly selected to receive the respective input pixel signal by the pixel signal reading device, the analog-digital converter is in an operating state, and
when an analog-digital converter is not randomly selected to receive the respective input pixel signal by the pixel signal reading device, the analog-digital converter is in a non-operating state.

3. The imaging device according to claim 2, wherein
each of the imaging elements includes a light receiving element, and a light control device disposed on a light entrance side of the light receiving element,
the light control device includes a lamination of M (M≥1) light control layer or layers each of which includes a lamination of a first nano-carbon film, a first intermediate layer, a dielectric material layer, and a second intermediate layer, the light control device further including a second nano-carbon film on the second intermediate layer constituting the Mth light control layer, and
voltage is applied to the first nano-carbon film and the second nano-carbon film under control by the pixel signal reading device to control entrance of light into the imaging element.

4. The imaging device according to claim 3, wherein each of the imaging elements includes a thin film transistor that controls an operation of the light control device included in the corresponding imaging element.

5. The imaging device according to claim 3, wherein pixel signal reading from the selected imaging element, and light entrance start and light entrance end into the imaging element at random in time are performed under control by the pixel signal reading device.

6. The imaging device according to claim 3, wherein pulsed voltage is randomly applied to the first nano-carbon film and the second nano-carbon film.

7. The imaging device according to claim 6, wherein an integrated value of application time of pulsed voltage to the first nano-carbon film and the second nano-carbon film is uniform.

8. The imaging device according to claim 1, further comprising a pixel signal addition circuit, wherein output pixel signals output from the analog-digital converters are sequentially input to the pixel signal addition circuit to add a plurality of arbitrary pixel signals at the pixel signal addition circuit.

9. The imaging device according to claim 1, wherein
the plurality of imaging elements comprise K imaging elements arranged in the first direction, and L imaging elements arranged in the second direction, thereby comprising K×L imaging elements, wherein the K×L imaging elements form an imaging element unit,
the plurality of imaging elements comprises I imaging element units provided in the first direction, and J imaging element units provided in the second direction, wherein the (i, j)th (i=1, 2, and up to I, j=1, 2, and up to J) imaging element unit comprises the $K_i$ imaging elements in the first direction and the $L_j$ imaging elements in the second direction,
the plurality of analog-digital converters are $K_i$ analog-digital converters coupled to each of the (i, j)th imaging element units, and
the plurality of analog-digital converters are randomly operated by the pixel signal reading device in the (i, j)th imaging element unit to randomly select a subset of the ($K_i \times L_j$) imaging elements, and to cause output of pixel signals from the selected subset of the ($K_i \times L_j$) imaging elements.

10. The imaging device according to claim 1, wherein
the plurality of imaging elements comprise K imaging elements arranged in the first direction, and L imaging elements arranged in the second direction, thereby comprising K×L imaging elements,
each of the analog-digital converters is coupled to a distinct group of the imaging elements comprising the L imaging elements arranged in the second direction, and
the plurality of analog-digital converters are randomly operated by the pixel signal reading device to randomly select a subset of the K imaging elements arranged in the first direction, and to cause output of pixel signals from the selected subset of K imaging elements.

11. The imaging device according to claim 1, further comprising a movement detection circuit that detects movement of a subject, wherein whether respective ones of the analog-digital converters are randomly selected by the pixel signal reading device is determined in part based on a presence or an absence of movement detection of the subject detected by the movement detection circuit.

12. A pixel signal reading method for an imaging device that includes
 a plurality of imaging elements arranged in a two-dimensional matrix in a first direction and a second direction,
 a plurality of analog-digital converters, each analog-digital converter being coupled to a distinct subset of the plurality of imaging elements such that a first analog-digital converter of the plurality of analog-digital converters is coupled to a first subset of the plurality of imaging elements, a second analog-digital converter of the plurality of analog-digital converters is coupled to a second subset of the plurality of imaging elements, and no imaging elements present in the first subset of the plurality of imaging elements are present in the second subset of the plurality of imaging elements, and
 a pixel signal reading device,
 the method comprising the steps of, by the pixel signal reading device:
  randomly selecting one or more analog-digital converters from amongst the plurality of analog-digital converters to receive a respective input pixel signal from an associated subset of imaging elements coupled thereto; and
  causing each of the one or more randomly selected analog-digital converters to output a respective output pixel signal.

* * * * *